(12) United States Patent
Lee et al.

(10) Patent No.: US 9,728,465 B2
(45) Date of Patent: Aug. 8, 2017

(54) SEMICONDUCTOR DEVICES WITH IMPROVED SOURCE/DRAIN CONTACT RESISTANCE AND METHODS OF MANUFACTURING THE SAME

(71) Applicant: Samsung Electronics Co., Ltd., Suwon-si (KR)

(72) Inventors: Joon-Gon Lee, Seoul (KR); Ryuji Tomita, Yongin-si (KR); Sang-Jin Hyun, Suwon-si (KR); Kuo Tai Huang, Seongnam-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/873,456

(22) Filed: Oct. 2, 2015

(65) Prior Publication Data
US 2016/0133525 A1 May 12, 2016

(30) Foreign Application Priority Data
Nov. 11, 2014 (KR) ........................ 10-2014-0156096

(51) Int. Cl.
*H01L 21/8238* (2006.01)
*H01L 29/66* (2006.01)
*H01L 29/78* (2006.01)

(52) U.S. Cl.
CPC .... *H01L 21/823814* (2013.01); *H01L 29/665* (2013.01); *H01L 29/66636* (2013.01);
(Continued)

(58) Field of Classification Search
CPC ....... H01L 21/823828; H01L 29/66636; H01L 29/665; H01L 29/7833; H01L 29/66545; H01L 21/823814; H01L 21/823821
See application file for complete search history.

(56) References Cited

U.S. PATENT DOCUMENTS 6,974,737 B2 12/2005 Snyder et al.
7,052,945 B2 5/2006 Snyder
(Continued)

*Primary Examiner* — Michael Jung
*Assistant Examiner* — Charles R Peters
(74) *Attorney, Agent, or Firm* — Muir Patent Law PLLC

(57) ABSTRACT

In a method of manufacturing a semiconductor device, a first gate structure and a second gate structure are formed on a substrate in a first region and a second region, respectively. A first semiconductor pattern including germanium is formed in the first region on the substrate. A first metal layer is formed on the substrate to cover the first semiconductor pattern. A first heat treatment process is performed such that the first semiconductor pattern and the first metal layer react with each other to form a first metal-semiconductor composite pattern in the first region and a semiconductor material of the substrate and the first metal layer react with each other to form a second metal-semiconductor composite pattern in the second region. The first metal-semiconductor composite pattern is removed from the substrate. A second metal layer is formed on the substrate to cover the second metal-semiconductor composite pattern. The second metal layer includes a material different from the first metal layer. A second heat treatment process is performed such that the substrate and the second metal layer react with each other to form a third metal-semiconductor composite pattern.

21 Claims, 57 Drawing Sheets

(52) U.S. Cl.
CPC  *H01L 21/823821* (2013.01); *H01L 29/66545* (2013.01); *H01L 29/7833* (2013.01)

(56) References Cited

U.S. PATENT DOCUMENTS

| | | |
|---|---|---|
| 7,112,483 B2 | 9/2006 | Lin et al. |
| 7,629,655 B2 | 12/2009 | Yu et al. |
| 7,754,554 B2 | 7/2010 | Peidous et al. |
| 7,838,359 B2 | 11/2010 | Schwan et al. |
| 8,154,025 B2 | 4/2012 | Snyder et al. |
| 2006/0163670 A1 | 7/2006 | Ellis-Monaghan et al. |
| 2011/0147855 A1 | 6/2011 | Joshi et al. |
| 2015/0028399 A1* | 1/2015 | Xiong ............... H01L 29/41725 257/288 |
| 2015/0214058 A1* | 7/2015 | Basker ................. H01L 21/283 257/769 |

* cited by examiner

SEMICONDUCTOR DEVICES WITH IMPROVED SOURCE/DRAIN CONTACT RESISTANCE AND METHODS OF MANUFACTURING THE SAME

CROSS-REFERENCE TO RELATED APPLICATION

This application claims priority under 35 USC §119 to Korean Patent Application No. 10-2014-0156096, filed on Nov. 11, 2014 in the Korean Intellectual Property Office (KIPO), the contents of which are herein incorporated by reference in their entirety.

BACKGROUND

1. Field

Example embodiments relate to semiconductor devices and methods of manufacturing the same. More particularly, example embodiments relate to semiconductor devices including a complementary metal-oxide-semiconductor (CMOS) transistor and methods of manufacturing the same.

2. Description of the Related Art

As semiconductor devices are highly integrated, the line width of a gate electrode of a transistor may be decreased and thus the electrical resistance of the gate electrode may be increased. Further, as a source/drain junction becomes shallower, the contact resistance in a source/drain region may be increased. In order to improve the operation speed of a semiconductor device, it may be helpful to reduce the electrical resistance in the source/drain region. For example, in order to reduce the electrical resistance in the source/drain region, a silicide layer of a heat resistant metal may be formed in an upper portion of the source/drain region. Particularly, a heat resistant metal may be deposited on the gate electrode and the source/drain region, and then, the silicide may be formed on the upper portion of the source/drain region.

SUMMARY

Example embodiments provide a semiconductor device having good contact resistance characteristics.

Example embodiments provide a method of manufacturing the semiconductor device.

According to example embodiments, in a method of manufacturing a semiconductor device, a first gate structure on a substrate is formed in a first region of a substrate and a second gate structure is formed in a second region of the substrate. A first semiconductor pattern including germanium is formed in the first region of the substrate. A first metal layer is formed in the first and second regions of the substrate to cover the first semiconductor pattern. A first heat treatment process may be performed such that the first semiconductor pattern and the first metal layer react with each other to form a first metal-semiconductor composite pattern in the first region and a semiconductor material of the substrate and the first metal layer react with each other to form a second metal-semiconductor composite pattern in the second region. The first metal-semiconductor composite pattern is removed from the substrate. A second metal layer is formed on the substrate to cover the second metal-semiconductor composite pattern. The second metal layer includes a material different from the first metal layer. A second heat treatment process is performed such that the substrate and the second metal layer react with each other to form a third metal-semiconductor composite pattern in the first region.

In an example embodiment, prior to forming the first semiconductor pattern, the upper portion of the substrate adjacent to the second gate structure is partially removed to form a trench. The trench is filled up with a semiconductor material to form a second semiconductor pattern, the semiconductor material being different from a material of the substrate.

In an example embodiment, the second semiconductor pattern may include silicon-germanium (Si—Ge).

In an example embodiment, prior to forming the first semiconductor pattern, a third semiconductor pattern is formed in the second region on the substrate, the third semiconductor pattern including a semiconductor material different from the first semiconductor pattern. The second metal-semiconductor composite pattern may be formed by reacting the first metal layer with the third semiconductor pattern.

In an example embodiment, the third semiconductor pattern may be formed by a selective epitaxial growth process using a silicon source gas.

In an example embodiment, prior to forming the first metal layer, an insulation interlayer is formed to cover the first semiconductor pattern, the third semiconductor pattern, the first gate structure and the second gate structure. The insulation interlayer is partially removed to form contact holes which expose the first semiconductor pattern and the third semiconductor pattern respectively. The first metal layer may cover the insulation interlayer, the first semiconductor pattern and the third semiconductor pattern.

In example embodiment, prior to forming the second metal layer, an insulation interlayer is formed to cover the second metal-semiconductor composite pattern, the first gate structure and the second gate structure. The insulation interlayer is partially removed to form contact holes which expose the second metal-semiconductor composite pattern and the surface of the substrate in the first region respectively. The second metal layer may cover the insulation interlayer, the exposed second metal-semiconductor composite pattern and the exposed surface of the substrate in the first region.

In an example embodiment, the first metal layer and the second metal layer may include titanium, cobalt, nickel, platinum or an alloy thereof.

In an example embodiment, the first metal layer may be formed of nickel and the second metal layer may be formed of titanium.

In an example embodiment, the first semiconductor pattern may be formed by a selective epitaxial growth process using a germanium source gas.

In an example embodiment, a thickness of the first metal layer may be less than 50% of a thickness of the first semiconductor pattern.

In an example embodiment, after forming the first metal layer, a protection layer may be formed on the first metal layer, the protection layer including a metal nitride.

In an example embodiment, after forming the second metal layer, a barrier layer may be formed on the second metal layer, the barrier layer including a metal nitride.

In an example embodiment, contact patterns may be formed on the second metal-semiconductor composite pattern and the third metal-semiconductor composite pattern, respectively. The contact patterns may include a conductive material.

In an example embodiment, a first ion implantation process may be performed using the first gate structure as an ion implantation mask to form a first impurity region in an upper portion of the substrate in the first region. A second ion implantation process may be performed using the second gate structure as an ion implantation mask to form a second impurity region in the upper portion of the substrate in the second region.

In an example embodiment, the first gate structure may constitute a negative-channel metal oxide semiconductor (NMOS) transistor, and the second gate structure may constitute a positive-channel metal oxide semiconductor (PMOS) transistor.

In an example embodiment, the removing the first metal-semiconductor composite pattern may include performing a wet etch process using an etching solution having a low etching rate with respect to the second metal-semiconductor composite pattern.

In an example embodiment, the etching solution may include sulfuric acid peroxide mixture (SPM).

According to example embodiments, in a method of manufacturing a semiconductor device, a substrate having a first region and a second region is provided. The substrate includes a plurality of active fins extending in a first direction. A first gate structure is formed on at least one of the plurality of the active fins in the first region and a second gate structure is formed on at least one of the plurality of the active fins in the second region, the first gate structure and the second gate structure extending in a second direction substantially perpendicular to the first direction. A first semiconductor pattern including germanium is formed in the first region of the substrate. A first metal layer is formed on the substrate to cover the first semiconductor pattern. A first heat treatment process is performed such that the first semiconductor pattern and the first metal layer react with each other to form a first metal-semiconductor composite pattern in the first region and a semiconductor material of the substrate and the first metal layer react with each other to form a second metal-semiconductor composite pattern in the second region. The first metal-semiconductor composite pattern is removed from the substrate. A second metal layer is formed on the substrate to cover the second metal-semiconductor composite pattern, the second metal layer including a material different from the first metal layer. A second heat treatment process is performed such that the substrate and the second metal layer react with each other to form a third metal-semiconductor composite pattern in the first region.

In example embodiments, the upper portion of at least one of the active fins in the second region may be partially removed to form a recess in the at least one of the active fins. The recess may be filled up with a semiconductor material to form a second semiconductor pattern, the semiconductor material being different from the material of the material of the substrate.

In example embodiments, forming the first gate structure and the second gate structure may include forming a first dummy gate structure on the at least one of the active fins in the first region and a second dummy gate structure on the at least one of the active fins in the second region, forming an insulation interlayer to cover the first dummy gate structure and the second dummy gate structure, removing an upper portion of the insulation interlayer to expose the first and second dummy gate structures, removing the first dummy gate structure and the second dummy gate structure to form openings in the insulation interlayer, and forming gate electrodes in the openings.

In example embodiments, the first metal layer may be formed of nickel and the second metal layer may be formed of titanium.

According to example embodiments, a semiconductor device includes a substrate including a first region and a second region, a first gate structure in the first region of the substrate, a second gate structure in the second region of the substrate, a first impurity region in an upper portion of the substrate adjacent to the first gate structure and including n-type impurities, a second impurity region in an upper portion of the substrate adjacent to the second gate structure and including p-type impurities, a first metal-semiconductor composite pattern adjacent to the first gate structure and having a bottom surface lower than a bottom surface of the gate structure, a second metal-semiconductor composite pattern adjacent to the second gate structure, having a bottom surface substantially coplanar with or higher than the bottom surface of the first metal-semiconductor composite pattern, and including a metal different from a metal of the first metal-semiconductor composite pattern, and a contact pattern electrically connected to the first metal-semiconductor composite pattern or the second metal-semiconductor composite pattern.

In an example embodiment, the first metal-semiconductor composite pattern comprises titanium-silicon composite (TiSi), and the second metal-semiconductor composite pattern comprises nickel-silicon composite (NiSi).

In example embodiments, the substrate may include a plurality of active fins extending in a first direction. The first gate structure may be arranged on at least one of the plurality of active fins in the first region and may extend in a second direction substantially perpendicular to the first direction. The second gate structure may be arranged on at least one of the plurality of active fins in the second region and may extend in the second region.

According to one embodiment, a method includes steps of providing a substrate having a first region and a second region, providing a first gate structure in the first region of the substrate, providing a second gate structure in the second region of the substrate, providing an n-type impurity region in an upper portion of the substrate adjacent to the first gate structure, providing a p-type impurity region in an upper portion of the substrate adjacent to the second gate structure, providing a first metal-semiconductor composite pattern on the n-type impurity region adjacent to the first gate structure, and providing a second metal-semiconductor composite pattern on the p-type impurity region adjacent to the second gate structure, wherein the second metal-semiconductor composite pattern comprises a first metal combined with a first semiconductor material, wherein the first metal-semiconductor composite pattern comprises a second metal combined with a second semiconductor material, wherein the second metal is different from the first metal, wherein the bottom surface of the second metal-semiconductor composite pattern is positioned at a level higher than the bottom surface of the first metal-semiconductor composite pattern.

The method may further includes steps of providing a first barrier pattern on the first metal-semiconductor composite pattern, providing a metal pattern and a second barrier pattern on the second metal-semiconductor composite pattern, providing a first contact pattern on the barrier pattern, and providing a second contact pattern on the second barrier pattern. The first and second barrier patterns may be made of metal nitride. The first metal-semiconductor composite pattern may include a titanium-silicon composite pattern and the second metal-semiconductor composite pattern may include a nickel-silicon composite pattern.

The method may further includes steps of forming a third metal-semiconductor composite pattern in the first region, and removing the third metal-semiconductor composite pattern by an etching process before providing the first metal-semiconductor composite pattern. The third metal-semiconductor composite pattern may include a nickel-germanium composite pattern.

According to example embodiments, metal-semiconductor composite patterns including metal-semiconductor composite patterns in PMOS region and NMOS region may have different work functions, and thus, a contact resistance of a source/drain region may be reduced. Further, different semiconductor materials may be used for forming the metal-semiconductor composite patterns, thereby simplifying processes.

BRIEF DESCRIPTION OF THE DRAWINGS

Example embodiments will be more clearly understood from the following detailed description taken in conjunction with the accompanying drawings.

FIG. 1 is a cross-sectional view illustrating a semiconductor device in accordance with example embodiments.

FIG. 66 is a block diagram illustrating an information processing system including a semiconductor device in accordance with example embodiments.

DETAILED DESCRIPTION

Figure 1:
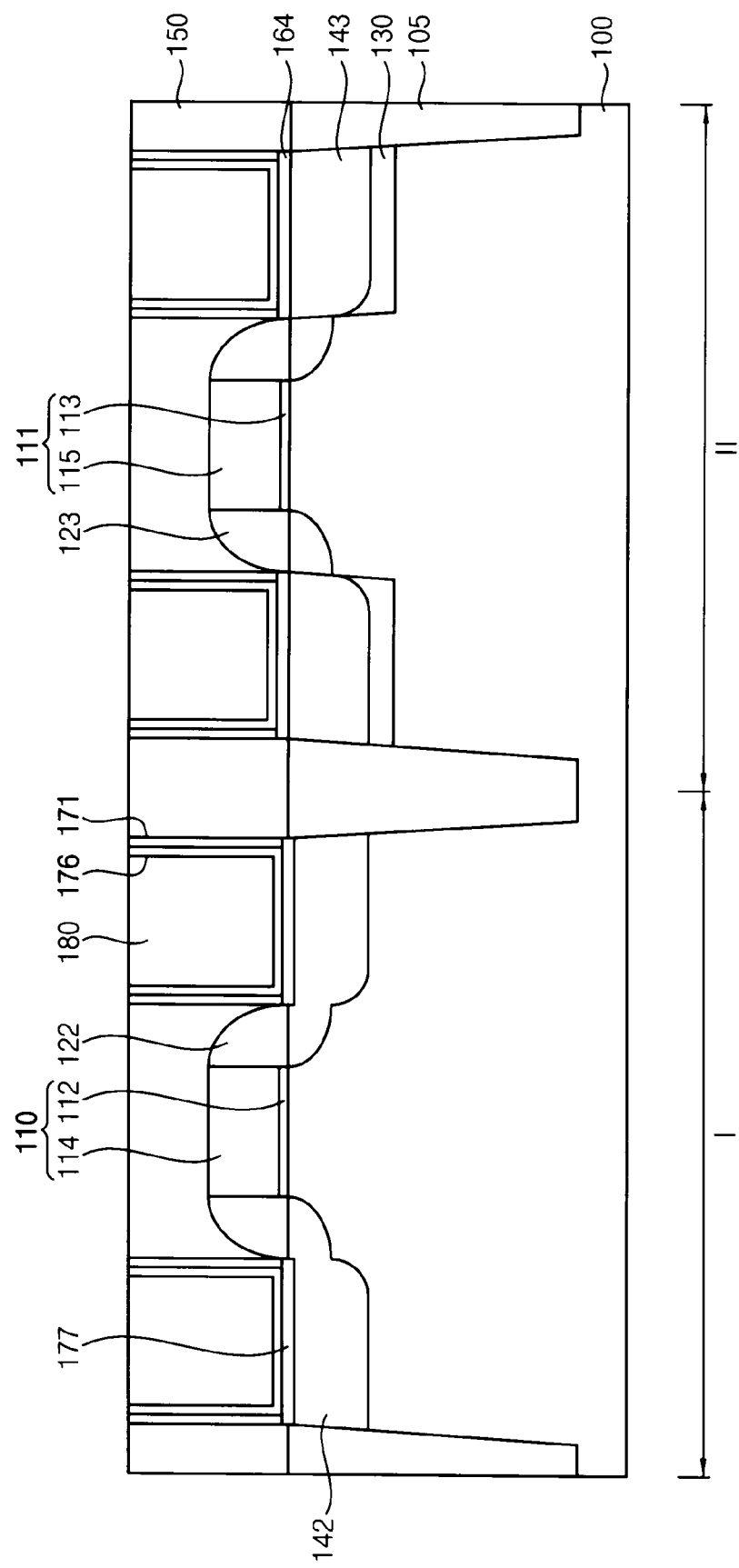
FIGS. 1 to 66 represent non-limiting, example embodiments as described herein.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both orientations of above and below. The device may be otherwise oriented (rotated 90 degrees or at other orientations) and the spatially relative descriptors used herein interpreted accordingly.

The terminology used herein is for the purpose of describing particular example embodiments and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 65:
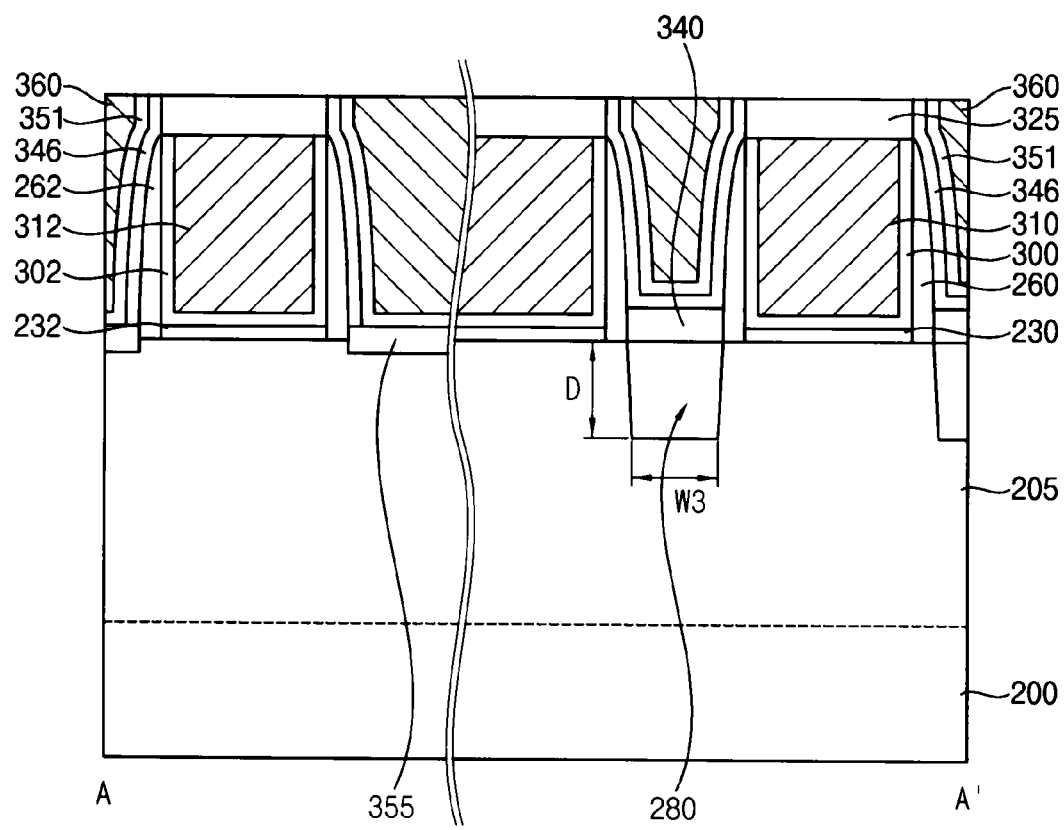

As used herein, a semiconductor device may refer to any of the various devices such as shown in FIGS. 1-65, and may also refer, for example, to two transistors or a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. Connection to packages and/or chips may be using ball grid arrays, wire bonding, through substrate vias, or other electrical connection elements. The semiconductor devices may include memory devices such as volatile or non-volatile memory devices.

An electronic device, as used herein, may refer to these semiconductor devices, but may additionally include products that include these devices, such as a memory module, memory card, hard drive including additional components, or a mobile phone, laptop, tablet, desktop, camera, or other consumer electronic device, etc.

FIG. 1 is a cross-sectional view illustrating a semiconductor device in accordance with example embodiments.

Referring to FIG. 1, a semiconductor device may include gate structures 110 and 111 on a substrate 100, impurity regions 142 and 143 adjacent to the gate structures 110 and 111 in the substrate 100, metal-semiconductor composite patterns 164 and 177 on the impurity regions 142 and 143, and contacts 180 electrically connected to the metal-semiconductor composite patterns 164 and 177.

The substrate 100 may be a silicon substrate, a germanium substrate, a silicon-germanium substrate, a silicon-on-insulator (SOI) substrate, a germanium-on-insulator (GOI) substrate, etc.

The substrate 100 may be divided into a first region (I) and a second region (II). In example embodiments, the first region (I) may be NMOS region where MOSFET having N type channel is arranged, and the second region (II) may be PMOS region where MOSFET having P type channel is arranged. Although it is not illustrated in the figures, the first region (I) and the second region (II) may include different impurities. For example, a P-well may be arranged in the first region (I), and an N-well may be arranged in the second region (II).

An isolation layer 105 may be disposed in in an upper surface of a substrate 100. For example, the isolation layer 105 may be formed to include an oxide, e.g., silicon oxide. By forming the isolation layer 105, the substrate 100 may be divided into a field region and an active region. The isolation layer 105 may be arranged in the field region.

The first gate structure 110 may be arranged in the first region (I) and the second gate structure 111 may be arranged in the second region (II).

In example embodiments, the first gate structure 110 may include a first gate insulation layer pattern 112 and a first gate electrode 114, and the second gate structure 111 may include a second gate insulation layer pattern 113 and a second gate electrode 115. In other example embodiments, a gate mask may be additionally arranged on the gate electrodes 114 and 115.

Spacers 122 and 123 may be arranged on sidewalls of the gate structures 110 and 111 respectively. For example, the first spacer 122 may be disposed on the sidewall of the first gate structure 110, and the second spacer 123 may be disposed on the sidewall of the second gate structure 111.

The impurity regions 142 and 143 may be disposed adjacent to the gate structures 110 and 111 in upper portions of the substrate 100 respectively. In example embodiments, a third impurity region 142 may be disposed adjacent to the first gate structure 110 in the upper portion of the substrate 100. A fourth impurity region 143 may be disposed adjacent to the second gate structure 111 in the upper portion of the substrate 100. The third impurity region 142 may include n-type impurities, and the fourth impurity region 143 may include p-type impurities.

The impurity regions 142 and 143 and the gate structures 110 and 111 may constitute a transistor. For example, the first gate structure 110 and the third impurity region 142 may constitute a negative-channel metal oxide semiconductor (NMOS) transistor, and the third impurity region 142 may serve as a source/drain region of the NMOS transistor. The second gate structure 111 and the fourth impurity region 143 may constitute a positive-channel metal oxide semiconductor (PMOS) transistor, and the fourth impurity region 143 may serve as a source/drain region of the PMOS transistor.

Referring again to FIG. 1, the first semiconductor pattern 130 may be disposed adjacent to the second gate structure 111 in the second region (II) in the upper portion of the substrate 100. The first semiconductor pattern 130 may include a semiconductor material having a lattice constant greater than that of a semiconductor material of the substrate 100. In example embodiments, when the substrate 100 includes single-crystalline silicon, the first semiconductor pattern 130 may include single-crystalline silicon-germanium.

To form the first semiconductor pattern 130, a trench which may also be referred to as a recess, may be formed by partially removing the upper portion of the substrate 100 in the second region (II), and then the trench may be filled up by a selective epitaxial growth (SEG) process. The first semiconductor pattern 130 may apply a stress on a channel portion under the second gate structure 111 and improve the mobility of a charge carrier in the PMOS transistor. Additionally, the first semiconductor pattern 130 may be doped with impurities, and may be partially overlapped with the fourth impurity region 143.

A second metal-semiconductor composite pattern 164 may be disposed on the first semiconductor pattern 130. The second metal-semiconductor composite pattern 164 may include metal-semiconductor composite. In example embodiments, the second metal-semiconductor composite pattern 164 may include nickel-silicon composite (NiSi) or platinum-nickel-silicon composite (NiPtSi). Here, a concentration of platinum may be about 10% by weight or less.

The second metal-semiconductor composite pattern 164 may make contact with the first semiconductor pattern 130 including silicon-germanium (SiGe). When the second metal-semiconductor composite pattern 164 includes nickel-silicon composite (NiSi), schottky barrier height in the interface with the fourth impurity region 143 including silicon-germanium (SiGe) may be decreased to reduce a contact resistance. For example, the second metal-semiconductor composite pattern 164 may reduce the contact resistance between the source/drain region of the PMOS transistor and the contact 180.

A third metal-semiconductor composite pattern 177 may be disposed in the first region (I) on the substrate 100. The third metal-semiconductor composite pattern 177 may include a metal-semiconductor composite having a work function less than that of the metal-semiconductor composite of the second metal-semiconductor composite pattern 164. For example, the third metal-semiconductor composite pattern 177 may include titanium-silicon composite (TiSi) or cobalt-silicon composite (CoSi).

The third metal-semiconductor composite pattern 177 may make contact with the third impurity region 142 including silicon (Si). When the third metal-semiconductor composite pattern 177 includes titanium-silicon composite (TiSi), schottky barrier height in the interface with the substrate 100 including silicon (Si) may be decreased to reduce a contact resistance. For example, the third metal-semiconductor composite pattern 177 may reduce the contact resistance between the source/drain region of the NMOS transistor and the contact 180.

The surface of the substrate 100 and a metal layer on the substrate surface may be thermally treated to react with each other to form the third metal-semiconductor composite pattern 177. The third metal-semiconductor composite pattern 177 may be formed by consuming silicon atoms in the surface of the substrate 100. Accordingly, a bottom surface of the third metal-semiconductor composite pattern 177 may be lower than the upper surface of the substrate 100.

The semiconductor pattern on the substrate 100 and a metal layer on the semiconductor pattern may be thermally treated to react with each other to form the second metal-semiconductor composite pattern 177. The second metal-semiconductor composite pattern 164 may be formed without consuming silicon atoms in the surface of the substrate 100. Accordingly, a bottom surface of the second metal-semiconductor composite pattern 164 may be positioned at a level higher than the upper surface of the substrate 100.

An insulation interlayer 150 may be formed on the substrate 100 to cover the gate structure 110 and 111 and the spacers 122 and 123. In example embodiments, the insulation interlayer 150 may be formed using a silicon oxide.

The contact 180 may penetrate the insulation interlayer 150 to be electrically connected to the metal-semiconductor composite patterns 164 and 177. In example embodiments, the contact 180 may include a metal such as tungsten, however, it is not be limited thereto.

A barrier layer pattern 176 may surround a bottom surface and a side surface of the contact 180. In example embodiments, the barrier layer pattern 176 may include a metal nitride having conductivity such as titanium nitride. The barrier layer pattern 176 may prevent diffusion of metal atoms included in the contact 180.

A metal layer pattern 171 may be disposed on a sidewall of the barrier layer pattern 176, and may be a residual pattern which is formed by stages of a method of manufacturing a semiconductor device in accordance with example embodiments.

In example embodiments, the second metal-semiconductor composite pattern 164 and the third metal-semiconductor composite pattern 177 may have different work functions. For example, the work function value of the second metal-semiconductor composite pattern 164 may be selected to reduce the contact resistance between the source/drain regions of the NMOS transistor and the contact 180. Likewise the work function value of the third metal-semiconductor composite pattern 177 may be selected to reduce the contact resistance between the source/drain regions of the PMOS transistor and the contact 180.

FIGS. 2 to 13 are cross-sectional views illustrating a method of manufacturing a semiconductor device in accordance with example embodiments.

Figure 2:
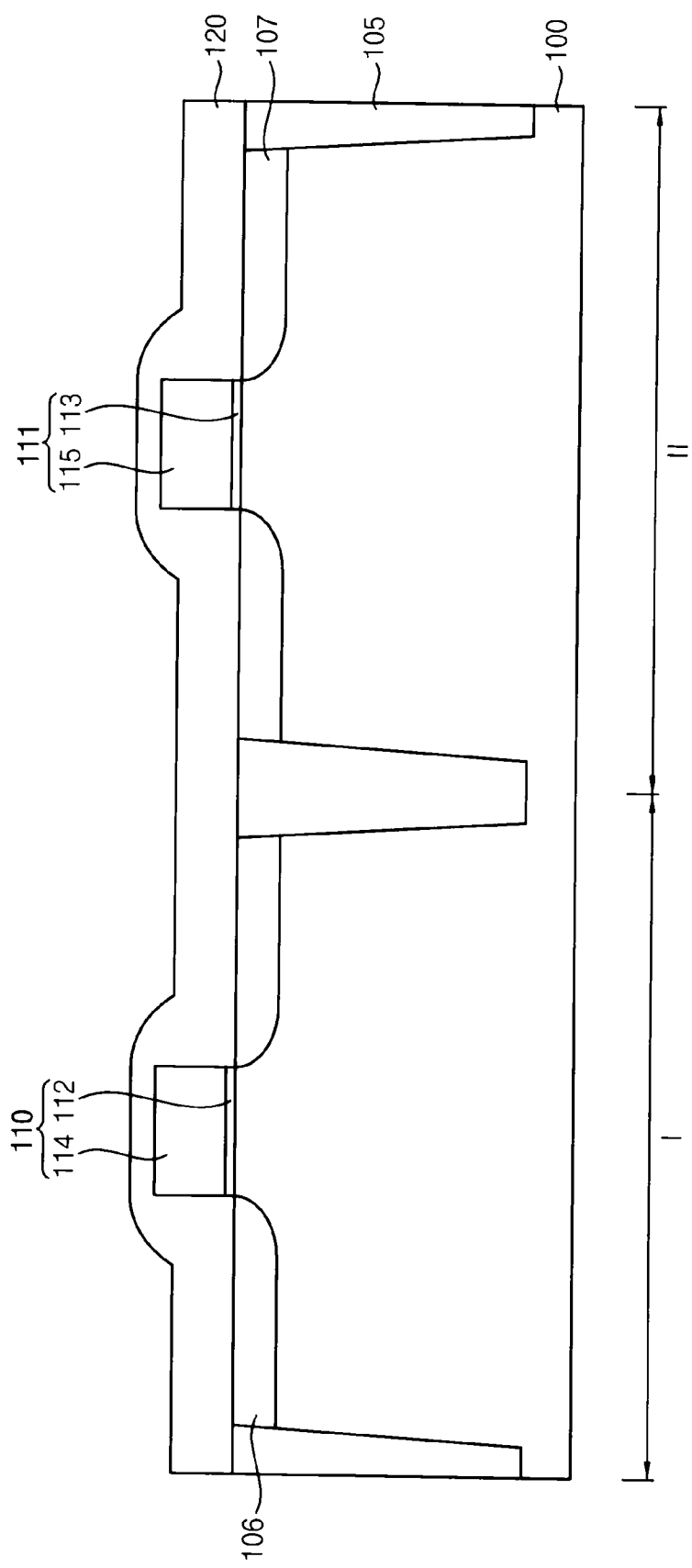
FIGS. 2 to 13 are cross-sectional views illustrating a method of manufacturing a semiconductor device in accordance with example embodiments.

Referring to FIG. 2, an isolation layer 105 may be formed in an upper surface of a substrate 100, and then, gate structures 110 and 111 and impurity regions 106 and 107 may be formed on the substrate 100.

The substrate 100 may be a silicon substrate, a germanium substrate, a silicon-germanium substrate, a silicon-on-insulator (SOI) substrate, a germanium-on-insulator (GOI) substrate, etc.

The substrate 100 may include a first region (I) and a second region (II). In example embodiments, the first region (I) may be NMOS region where MOSFET having N-type channel is arranged, and the second region (II) may be PMOS region where MOSFET having P-type channel is arranged.

First, an upper portion of the substrate 100 may be partially etched to form a first trench, and the isolation layer 105 may be formed to fill the first trench.

In example embodiments, an insulation layer may be formed on the substrate 100 to sufficiently fill the first trench, and the insulation layer may be planarized until a top surface of the substrate 100 is exposed, to form the isolation layer 105. The insulation layer may include an oxide, e.g., silicon oxide.

Then, a first gate structure 110 and a second gate structure 111 may be formed on the substrate 100.

In example embodiments, a gate insulation layer and a gate electrode layer may be sequentially formed on the substrate 100 and the isolation layer 105 and patterned to form the first gate structure 110 in the first region (I) and the second gate structure 111 in the second region (II).

Thus, the first gate structure 110 in the first region (I) may include a first gate insulation layer pattern 112 and a first gate electrode 114, and the second gate structure 111 in the second region (II) may include a second gate insulation layer pattern 113 and a second gate electrode 115. In other example embodiments, a gate mask (not illustrated) may be additionally formed on the gate electrodes 114 and 115.

In example embodiments, the first gate structure 110 may constitute a portion of a negative-channel metal oxide semiconductor (NMOS) transistor, and the second gate structure 111 may constitute a portion of a positive-channel metal oxide semiconductor (PMOS) transistor.

An ion implantation process may be performed to form a first impurity region 106 adjacent to the first gate structure 110 and a second impurity region 107 adjacent to the second gate structure 111 in the upper portion of the substrate 100. In example embodiments, the first impurity region 106 and the second impurity region 107 may include different types of impurities, and thus, the first impurity region 106 and the second impurity region 107 may be formed by different ion implantation processes from each other.

A spacer layer 120 may be formed on the substrate 100 to cover the first and second gate structures 110 and 111. In example embodiments, the spacer layer 120 may be formed of a silicon nitride.

Figure 3:
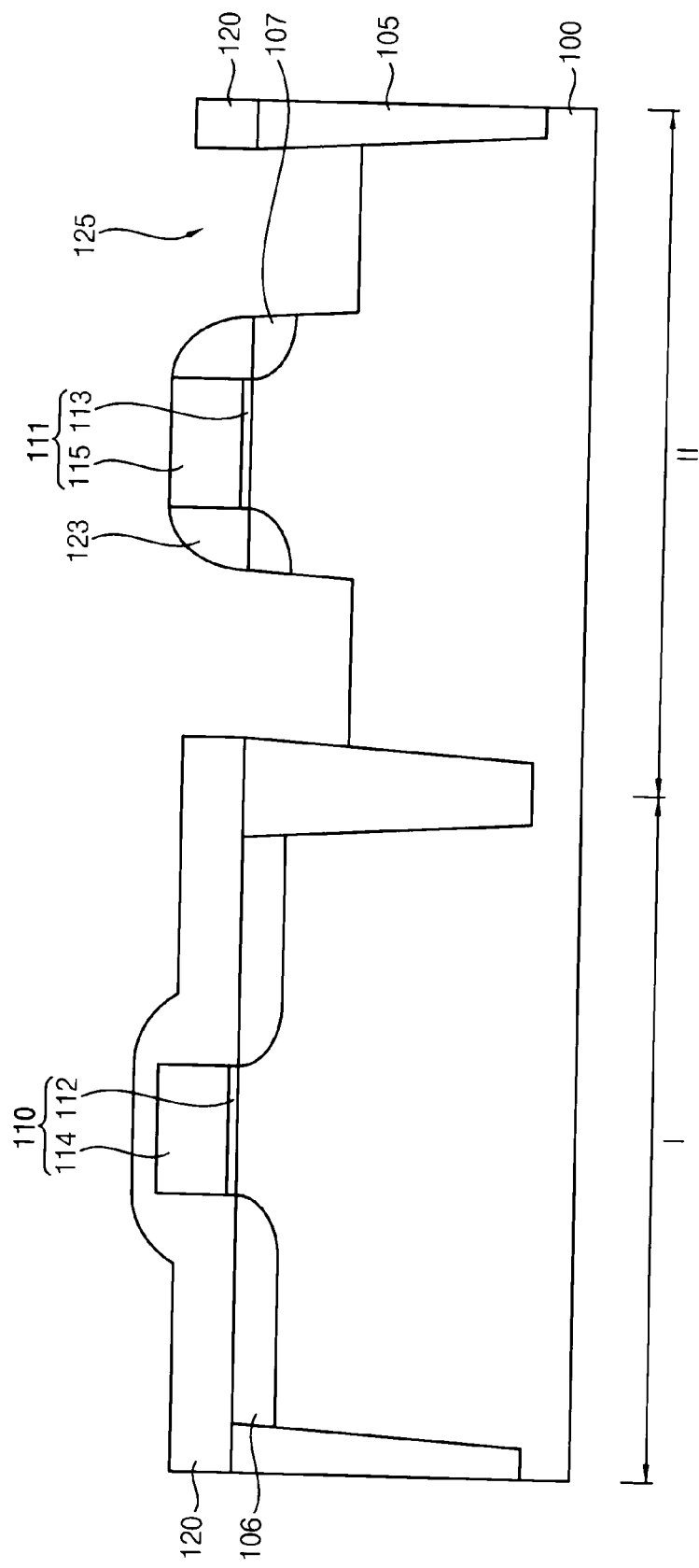

Referring to FIG. 3, the upper portion of the substrate 100 in the second region (II) may be partially removed to form a second trench 125 which may also be referred to as a recess.

In example embodiments, a mask may be formed on the spacer layer 120 and the spacer layer 120 may be partially removed using the mask to expose the substrate 100. Then, the upper portion of the substrate 100 exposed by the spacer layer 120 may be partially removed to form the second trench 125.

Although the second trench 125 is defined by an upper surface and a sidewall of the substrate 100 and a sidewall of the isolation layer 105 as illustrated in FIG. 3, it may not be limited thereto. For example, the second trench 125 may be defined by the upper surface and both sidewalls of the substrate 100.

Figure 4:
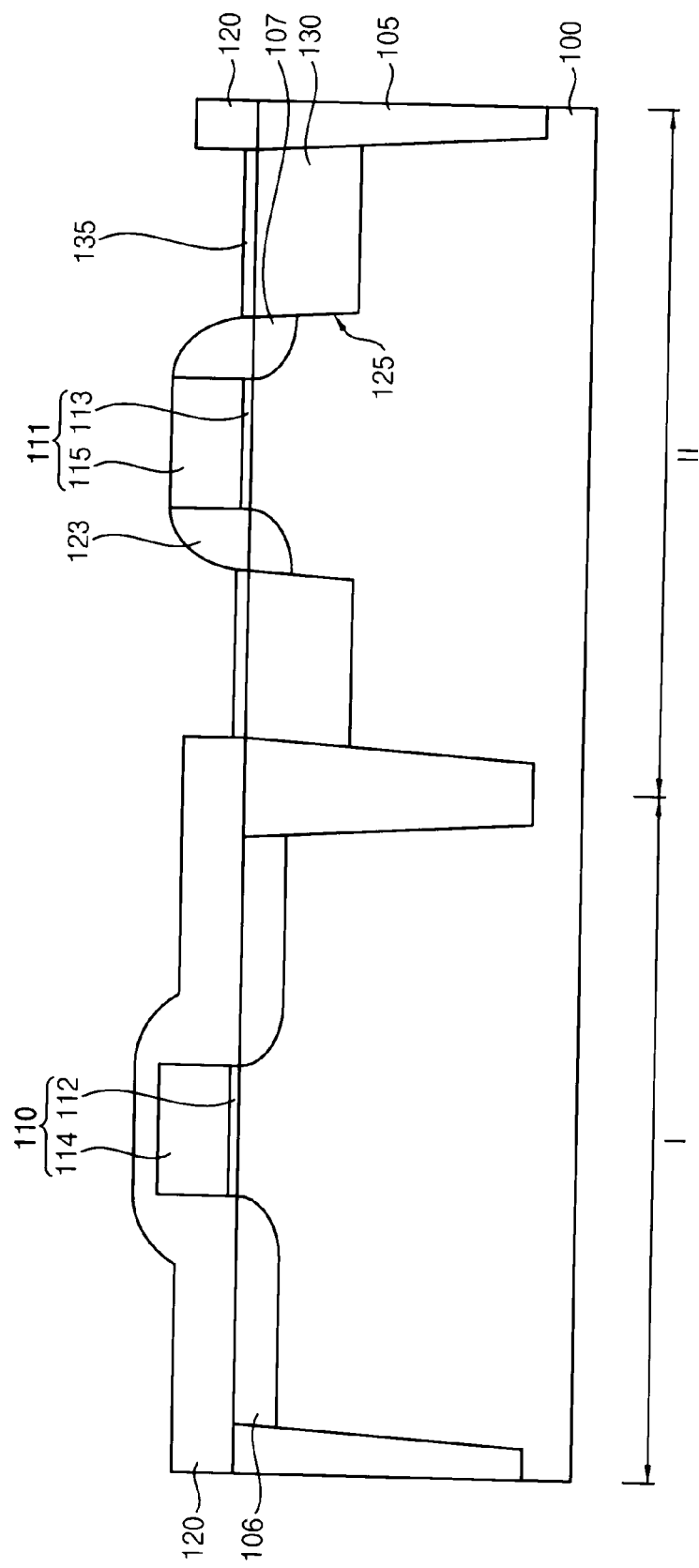

Referring to FIG. 4, a first semiconductor pattern 130 may be formed to fill the second trench 125, and a second semiconductor pattern 135 may be formed on the first semiconductor pattern 130.

In example embodiments, the first semiconductor pattern 130 may be formed using silicon-germanium (SiGe), and the second semiconductor pattern 135 may be formed of silicon.

For example, the first semiconductor pattern 130 may be formed by a first selective epitaxial growth (SEG) process using the surface of the substrate 100 exposed by the second trench 125 as a seed. For example, the substrate 100 including the resulting structures may be loaded into a process chamber, and then, a silicon source gas, a germanium source gas and a carrier gas may be suppled into the process chamber to perform the first SEG process. Then, a silicon source gas and a carrier gas may be sequentially supplied into the process chamber to perform a second SEG process such that the second semiconductor pattern 135 may be formed on the first semiconductor pattern 130.

The first and second SEG processes may be performed using the silicon source gas, e.g., disilane ($Si_2H_6$) gas, the germanium source gas, e.g., germane ($GeH_4$) gas and the carrier gas, e.g., hydrogen ($H_2$) gas, to form the single crystalline first and second semiconductor patterns 130 and 135. Here, a p-type impurity source gas, e.g., diborane ($B_2H_6$) gas may be also used for the first and second SEG processes.

In example embodiments, flow rates of the gases used for the first SEG process may be controlled such that germanium concentrations in the first semiconductor pattern 130 may be adjusted along a depth. Thus, a lattice mismatch between the first semiconductor pattern 130 and the substrate 100 may be reduced. For example, the germanium concentration in the first semiconductor pattern 130 may vary to continuously decrease as the depth decreases, or decrease in step-wise fashion as the depth decreases. In another example, the germanium concentration in the first semiconductor pattern 130 may vary to continuously increase as the depth decreases or increase in a step-wise fashion as the depth decreases.

Figure 5:
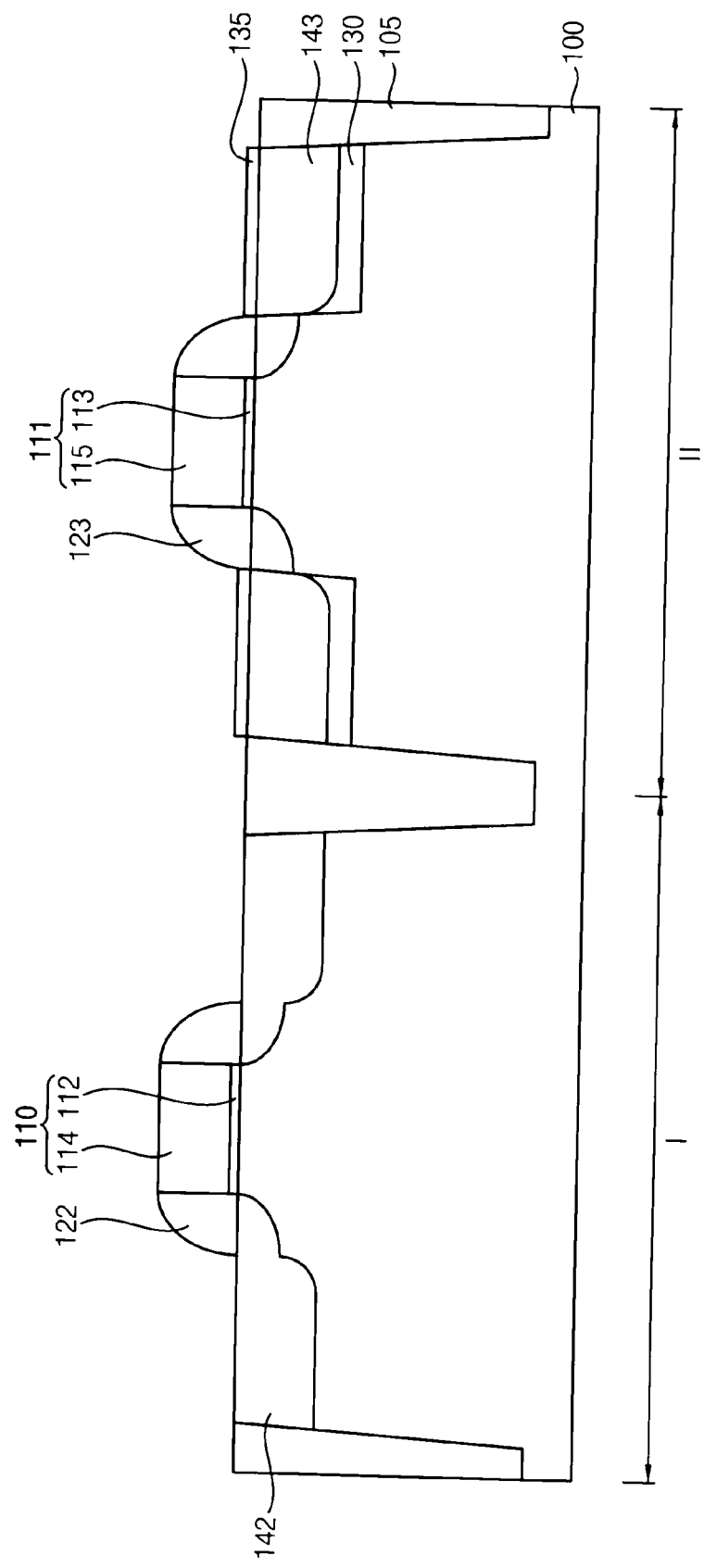

Referring to FIG. 5, the spacer layer 120 may be partially removed to form a first spacer 122 and a second spacer 123, and then, impurities may be implanted to form an impurity region.

In example embodiments, a mask may be formed on the spacer layer 120 and may be used as an etching mask to form the first and second spacers 122 and 123. For example, the first spacer 122 may be formed on a sidewall of the first gate structure 110, and the second spacer 123 may be formed on a sidewall of the second gate structure 111.

Then, the impurities may be implanted into the upper portion of the substrate 100 and the first semiconductor pattern 130 using the first and second gate structures 110 and 111 and the first and second spacers 122 and 123 as an ion implantation mask. Thus, the third impurity region 142 may serve as a source/drain region of the NMOS transistor, and the fourth impurity region 143 may serve as a source/drain region of the PMOS transistor.

In other example embodiments, the ion implantation process may be performed before forming the second semiconductor pattern 135.

Figure 6:
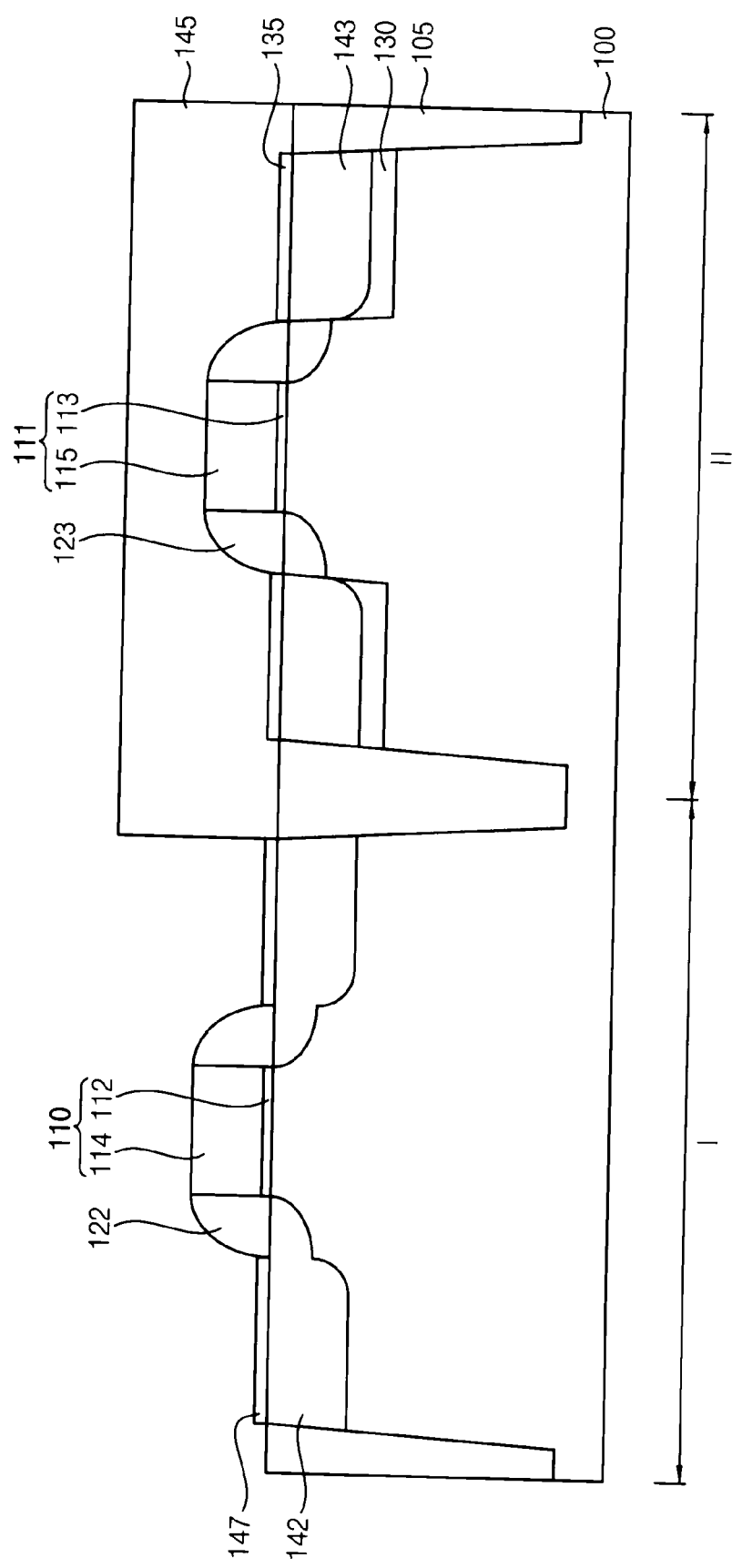

Referring to FIG. 6, a third semiconductor pattern 147 may be formed in the first region (I) of the substrate 100.

A blocking layer 145 may be formed to entirely cover the second gate structure 111, the second spacer 123 and the second semiconductor pattern 135 in the second region (II) of the substrate 100.

Then, the third semiconductor pattern 147 may be formed on the exposed region of the substrate 100. In example embodiments, the third semiconductor pattern 147 may be formed using a semiconductor material different from the second semiconductor pattern 135. For example, when the second semiconductor pattern 135 includes silicon, the third semiconductor pattern 147 may be formed using germanium.

For example, the third semiconductor pattern 147 may be formed by a third SEG process using the surface of the substrate 100 exposed by the first gate structure 110 and the first spacer 122 as a seed. For example, the substrate 100 including the resulting structures may be loaded into a process chamber (not illustrated), and then, a silicon source gas, a germanium source gas and a carrier gas may be suppled into the process chamber to perform the third SEG process.

Then, the blocking layer 145 may be removed by performing an etch process.

Figure 7:
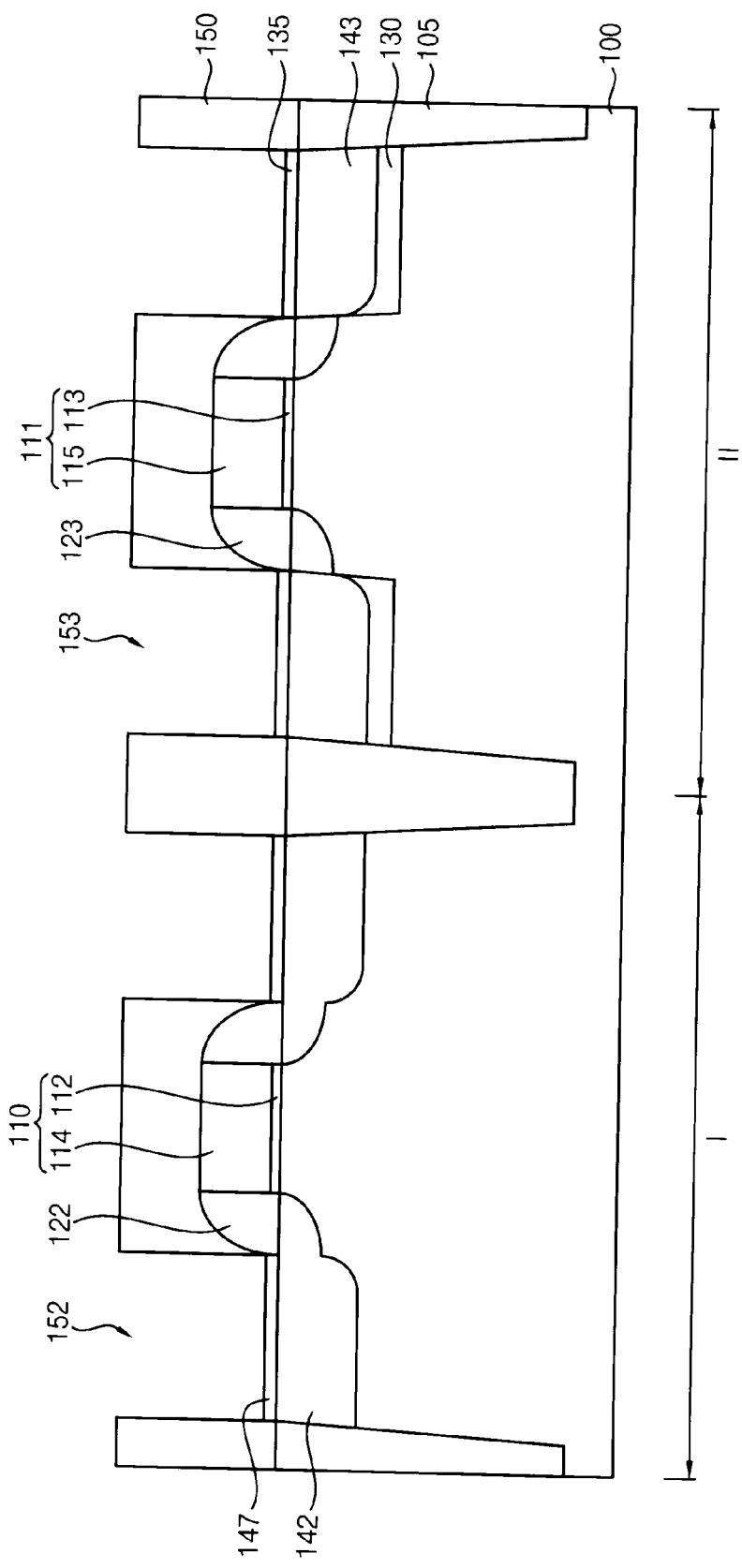

Referring to FIG. 7, an insulation interlayer 150 may be formed on the substrate 100 and partially removed to form a first opening 152 and a second opening 153.

In example embodiments, the insulation interlayer 150 may be formed using a silicon oxide. The insulation interlayer 150 may be formed to entirely cover the first and second gate structures 110 and 111, the first and second spacers 122 and 123, and the second and third semiconductor patterns 135 and 147.

Then, the insulation interlayer 150 may be partially removed to form the first opening 152 in the first region (I) and the second opening 153 in the second region (II). In example embodiments, the first opening 152 may entirely expose the third semiconductor patterns 147, and the second opening 153 may entirely expose the second semiconductor patterns 135.

Figure 8:
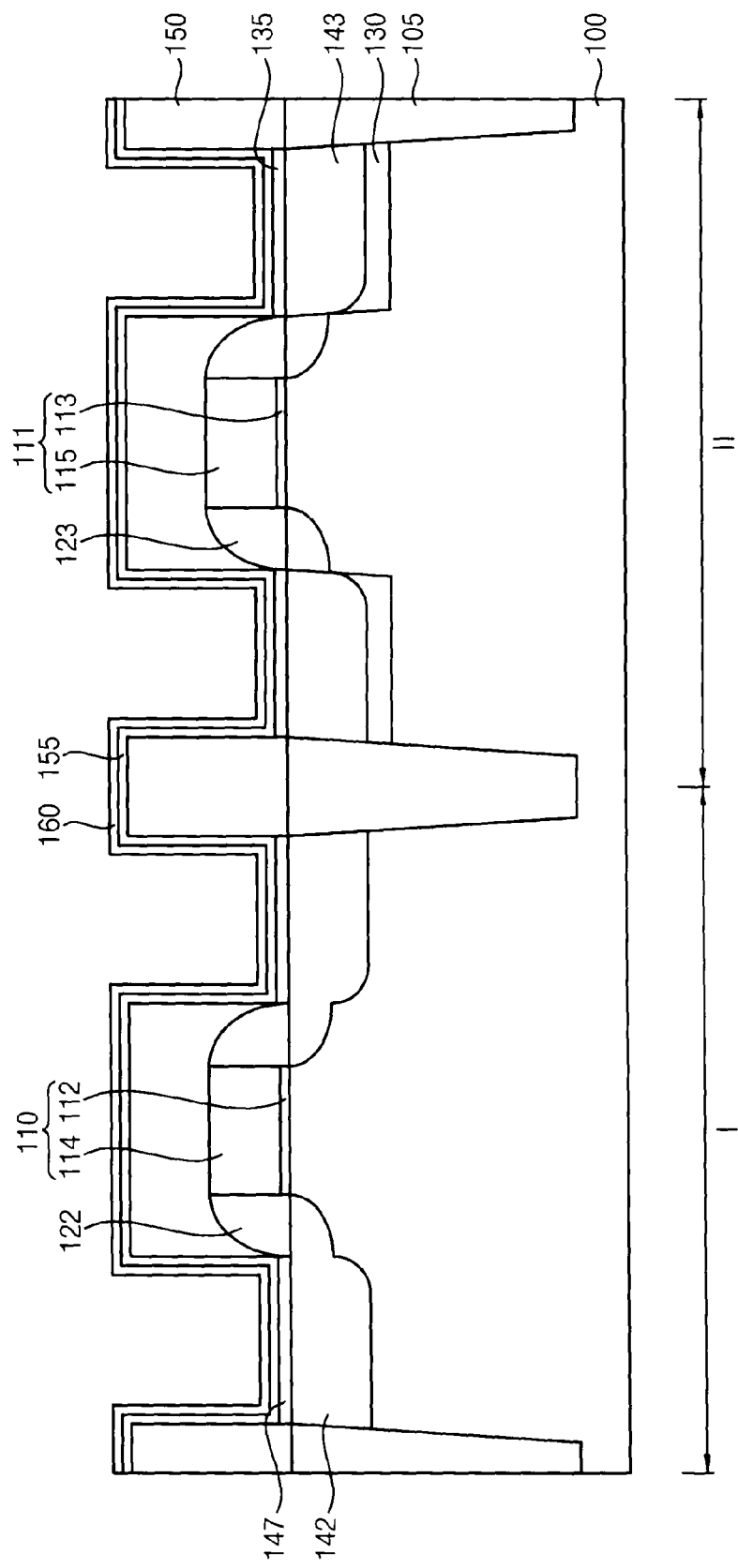

Referring to FIG. 8, a first metal layer 155 and a protection layer 160 may be formed.

By performing deposition processes, the first metal layer 155 and the protection layer 160 having uniform thicknesses may be sequentially formed. The first metal layer 155 may be formed conformally on an upper surface and a sidewall of the insulation interlayer 150, the second semiconductor pattern 135 and the third semiconductor patterns 147.

The first metal layer 155 and the protection layer 160 may be formed by a physical vapor deposition (PVD) process, a chemical vapor deposition (CVD) process, an atomic layer deposition (ALD) process, or the like. When the CVD process or the ALD process is performed, a layer having a uniform thickness may be formed on a surface of a complicated profile.

In example embodiments, the first metal layer 155 may be formed of titanium, cobalt, nickel, platinum or an alloy thereof, and the protection layer 160 may be formed of a metal nitride. For example, the first metal layer 155 may be formed of nickel, and the protection layer 160 may be formed of titanium nitride (TiN).

The thickness of the first metal layer 155 may be determined in consideration of the thickness of the third semiconductor pattern 147. The thickness of the first metal layer 155 may be less than 50% of the thickness of the third semiconductor pattern 147. For example, the thickness of the first metal layer 155 may be less than 40% of the thickness of the third semiconductor pattern 147. When the thickness of the first metal layer 155 is greater than 50% of the thickness of the third semiconductor pattern 147, during a heat treatment process as described later with reference to FIG. 9 metal atoms included in the first metal layer 155 may penetrate the third semiconductor pattern 147 and diffuse to the upper portion of the substrate 100. When the thickness of the first metal layer 155 is less than 50% of the thickness of the third semiconductor pattern 147, the upper portion of the substrate 100 may be prevented from being contaminated by the metal of the first metal layer 155.

Further, during processes including the heat treatment process as described later with reference to FIG. 9 the protection layer 160 may prevent the first metal layer 155 or other elements from being oxidized or damaged to deteriorate.

In example embodiments, the first metal layer 155 and the protection layer 160 may be formed entirely on the first region (I) and the second region (II) of the substrate 100. Accordingly, a patterning process using a photo mask may not be used here.

In other example embodiments, a process of forming the protection layer 160 may be omitted.

Figure 9:
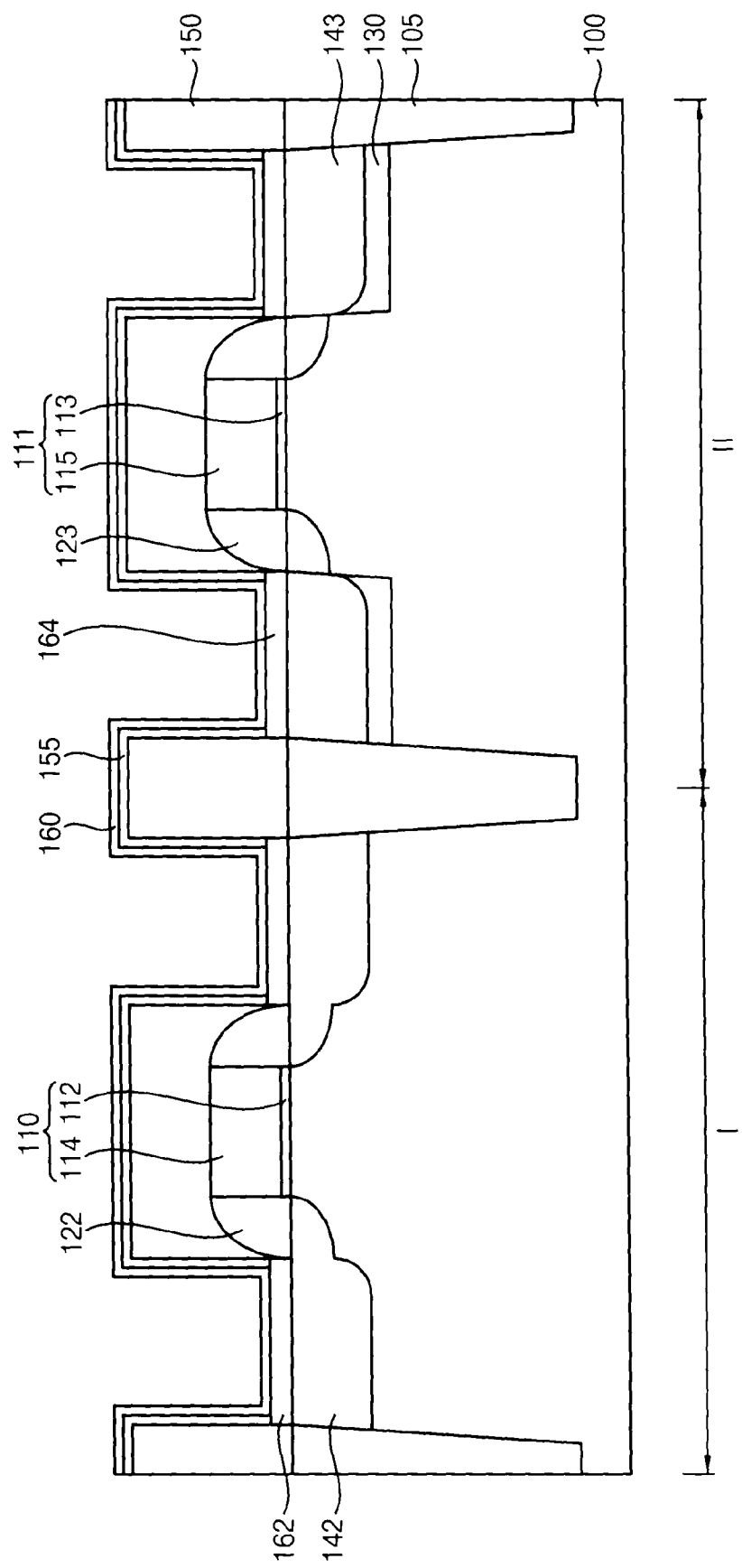

Referring to FIG. 9, a heat treatment process may be performed to form a first metal-semiconductor composite pattern 162 and a second metal-semiconductor composite pattern 164.

For example, the substrate 100 having the resulting structures may be loaded into a process chamber, an inert gas such as argon, neon, etc., or a nitrogen gas may be supplied into the process chamber, and the process chamber may be heated to a predetermined temperature.

For example, the heat treatment process may be performed such that the substrate 100 may be heated to a temperature of at least 600° C. or more. In some examples, the substrate 100 may be heated to a temperature of from 800° C. to 900° C.

In the heat treatment process, the metal atoms included in the first metal layer 155 may be diffused to the second semiconductor pattern 135 and the third semiconductor pattern 147. Thus, the second semiconductor pattern 135 and the first metal layer 155 may react with each other to form the second metal-semiconductor composite pattern 164, and the third semiconductor pattern 147 and the first metal layer 155 may react with each other to form the first metal-semiconductor composite pattern 162. Since the thickness of the first metal layer 155 is less than about 50% of the thickness of the third semiconductor pattern 147, the first metal layer 155 on the second and third semiconductor patterns 135 and 147 may be consumed during the heat treatment process so that the first metal layer 155 on the semiconductor patterns 135 and 147 may not remain after performing the heat treatment process.

For example, in case that the first metal layer 155 includes nickel, the first metal-semiconductor composite pattern 162 may include nickel-germanium composite (NiGe), and the second metal-semiconductor composite pattern 164 may include nickel-silicon composite (NiSi).

The second metal-semiconductor composite pattern 164 may make contact with the fourth impurity region 143 including silicon-germanium (SiGe). When the second metal-semiconductor composite pattern 164 includes nickel-silicon composite (NiSi), schottky barrier height in the interface with the fourth impurity region 143 including silicon-germanium (SiGe) may be decreased to reduce a contact resistance. For example, the second metal-semiconductor composite pattern 164 may reduce the contact resistance between the source/drain region of the PMOS transistor and a contact 180 which will be described later.

Figure 10:
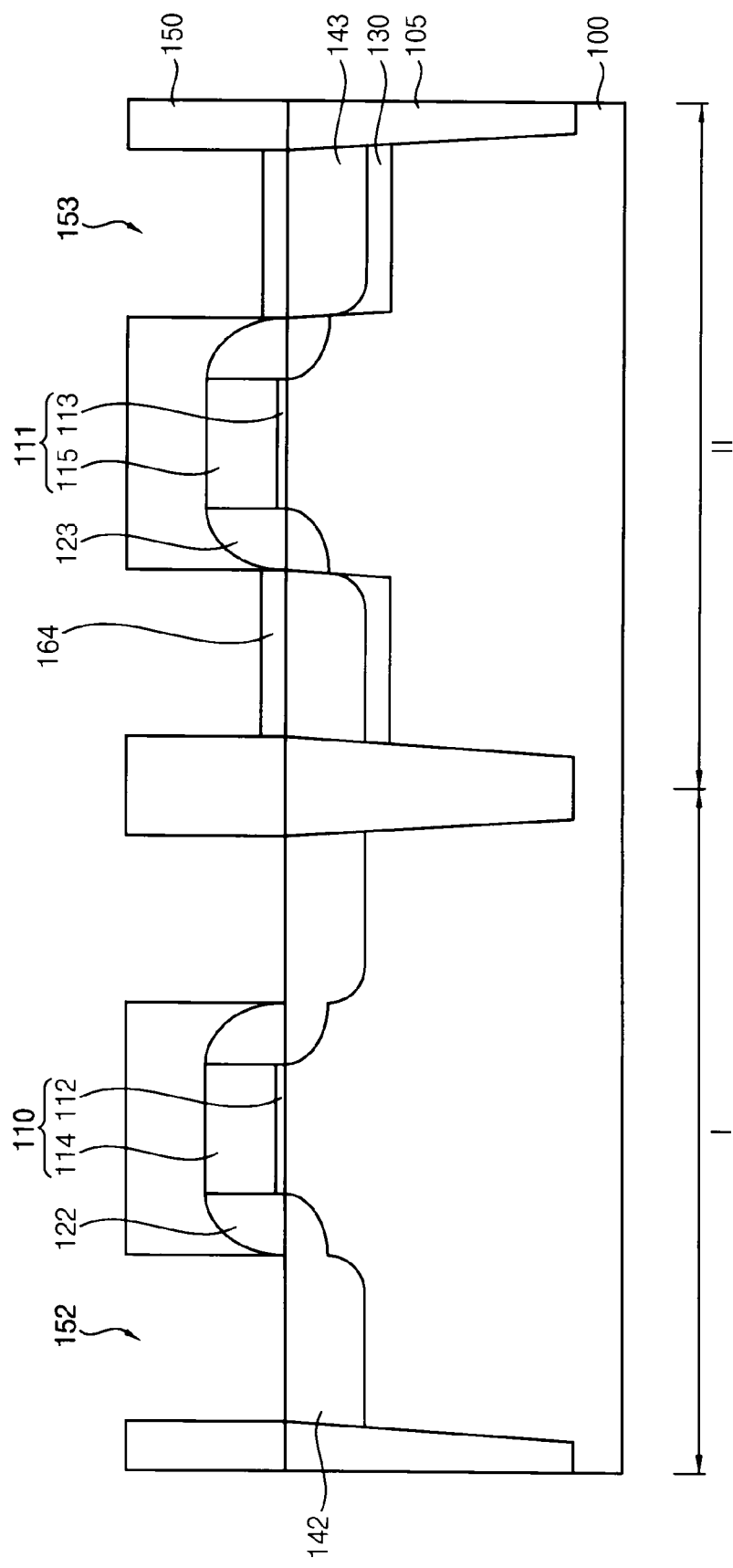

Referring to FIG. 10, the first metal-semiconductor composite pattern 162, the first metal layer 155 and the protection layer 160 may be removed from the substrate 100.

A wet etch process may be performed using an etching solution to sufficiently remove the first metal-semiconductor composite pattern 162, the first metal layer 155 and the protection layer 160. In example embodiments, the etching solution may have different etch selectivities with respect to the first metal-semiconductor composite pattern 162 and the second metal-semiconductor composite pattern 164. For example, the etching solution may be a solution including sulfuric acid.

For example, when the etching solution includes sulfuric acid peroxide mixture (SPM), the etching solution may have a relatively low etching rate for nickel-silicon composite (NiSi) and have a relatively high etching rate for nickel-germanium composite (NiGe). For example, the etching solution may be used to leave the second metal-semiconductor composite pattern 164 and effectively remove the first metal-semiconductor composite pattern 162, the first metal layer 155 and the protection layer 160.

In example embodiments, the etch process may be performed using an etch selectivity of the etching solution. Accordingly, a patterning process using a photo mask may not be used here.

Figure 11:
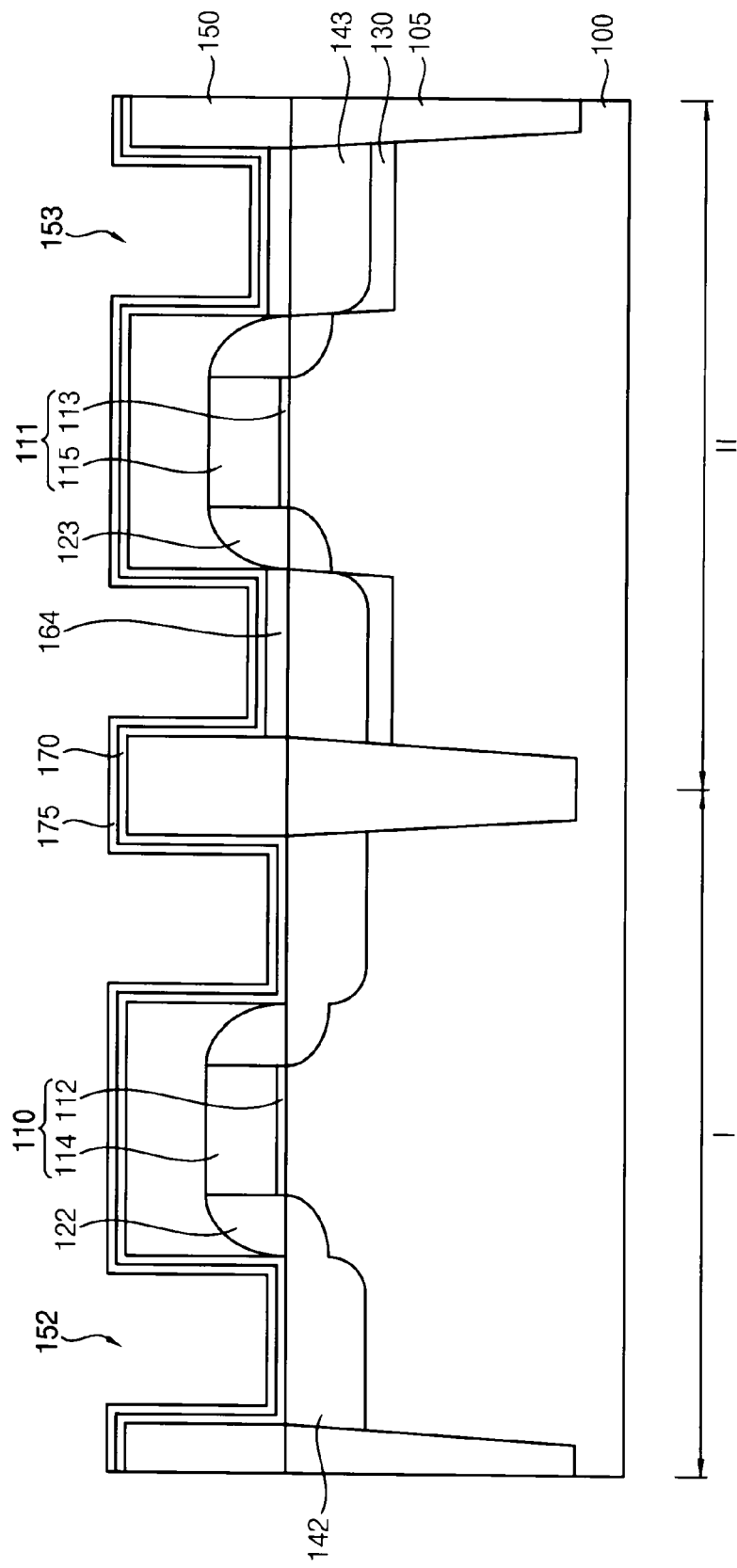

Referring to FIG. 11, a second metal layer 170 and a barrier layer 175 may be formed.

By performing deposition processes, the second metal layer 170 and the barrier layer 170 having uniform thicknesses may be sequentially formed. The second metal layer 170 may be formed conformally on the upper surface and the sidewall of the insulation interlayer 150, the second metal-semiconductor composite pattern 164 and the exposed substrate 100.

The second metal layer 170 and the barrier layer 175 may be formed by a physical vapor deposition (PVD) process, a chemical vapor deposition (CVD) process, an atomic layer deposition (ALD) process, or the like. When the CVD process or the ALD process is performed, a layer having a uniform thickness may be formed on a surface of a complicated profile.

In example embodiments, the second metal layer 170 may be formed using titanium, cobalt, nickel, platinum or an alloy thereof, and the barrier layer 175 may be formed using a metal nitride. For example, the second metal layer 170 may be formed using nickel, and the barrier layer 175 may be formed using titanium nitride (TiN).

Further, during processes including the heat treatment process as described later with reference to FIG. 12 the barrier layer 175 may prevent the second metal layer 170 or other elements from being oxidized or damaged to deteriorate. The barrier layer 175 may prevent diffusion or reduce the amount of diffusion of metal atoms of the contact 180, described later with reference to FIG. 13.

In example embodiments, the second metal layer 170 and the barrier layer 175 may be formed entirely on the first region (I) and the second region (II) of the substrate 100. Accordingly, a patterning process using a photo mask may not be used here.

In other example embodiments, a process of forming the barrier layer 175 may be omitted.

Figure 12:
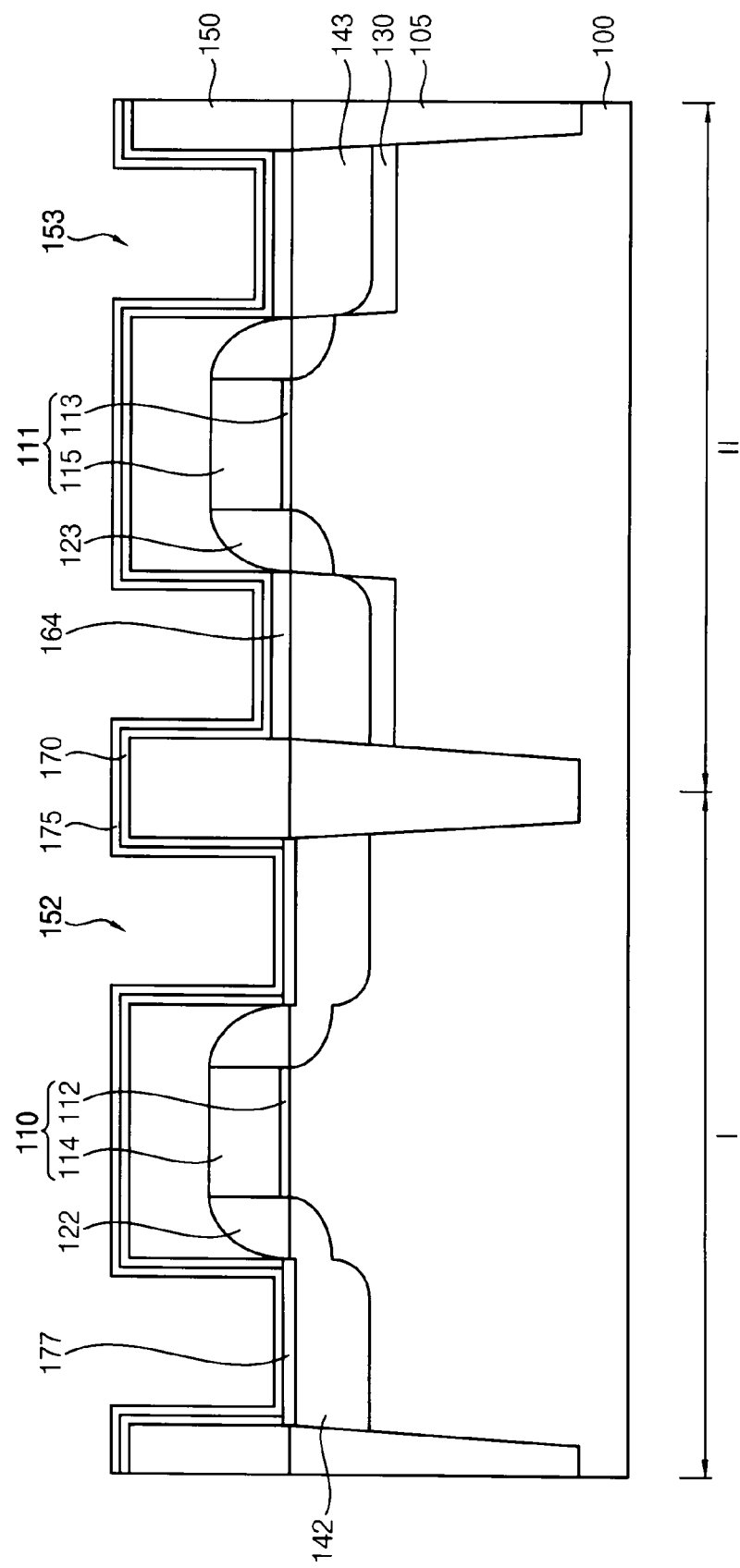

Referring to FIG. 12, a heat treatment process may be performed to form a third metal-semiconductor composite pattern 177.

For example, the substrate 100 having the resulting structures may be loaded into a process chamber (not illustrated), an inert gas such as argon, neon, etc. or a nitrogen gas may be supplied into the process chamber, and the process chamber may be heated to a predetermined temperature.

For example, the heat treatment process may be performed such that the substrate 100 may be heated to a temperature of at least 600° C. or more. In certain examples, the substrate 100 may be heated to a temperature of from 800° C. to about 900° C.

In the heat treatment process, metal atoms included in the second metal layer 170 may be diffused to the surface of the substrate 100 in the first region (I). Thus, the metal layer 170 and the surface of the substrate 100 may react with each other to form the third metal-semiconductor composite pattern 177. Since the second metal-semiconductor composite pattern 164 in the second region (II) includes a metal-semiconductor composite, metal atoms may not be diffused to the second metal-semiconductor composite pattern 164. That is, the second metal layer 170 and the second metal-semiconductor composite pattern 164 may not react with each other.

A material included in the third metal-semiconductor composite pattern 177 may have a work function less than that of a material included in the second metal-semiconductor composite pattern 164. For example, when the second metal layer 170 includes titanium, the third metal-semiconductor composite pattern 177 may include titanium-silicon composite (TiSi).

The third metal-semiconductor composite pattern 177 may make contact with the third impurity region 142 including silicon (Si). When the third metal-semiconductor composite pattern 177 includes titanium-silicon composite (TiSi), schottky barrier height in the interface with the substrate 100 including silicon (Si) may be decreased to reduce the contact resistance. For example, the third metal-semiconductor composite pattern 177 may reduce the contact resistance between the source/drain region of the NMOS transistor and a contact 180 which will be described later.

As a result, the second metal-semiconductor composite pattern 164 and the third metal-semiconductor composite pattern 177 may have different metal-semiconductor composites, to thereby reduce the contact resistance. For example, the second metal-semiconductor composite pattern 146 may be formed of a material selected to reduce the contact resistance between the impurity region 143 and the contact pattern. Likewise, the third metal-semiconductor composite pattern 177 may be formed of a material selected to reduce the contact resistance between the impurity region 142 and the contact pattern. For example, the second and third metal-semiconductor composite patterns may have appropriate work function values to reduce the contact resistances.

Figure 13:
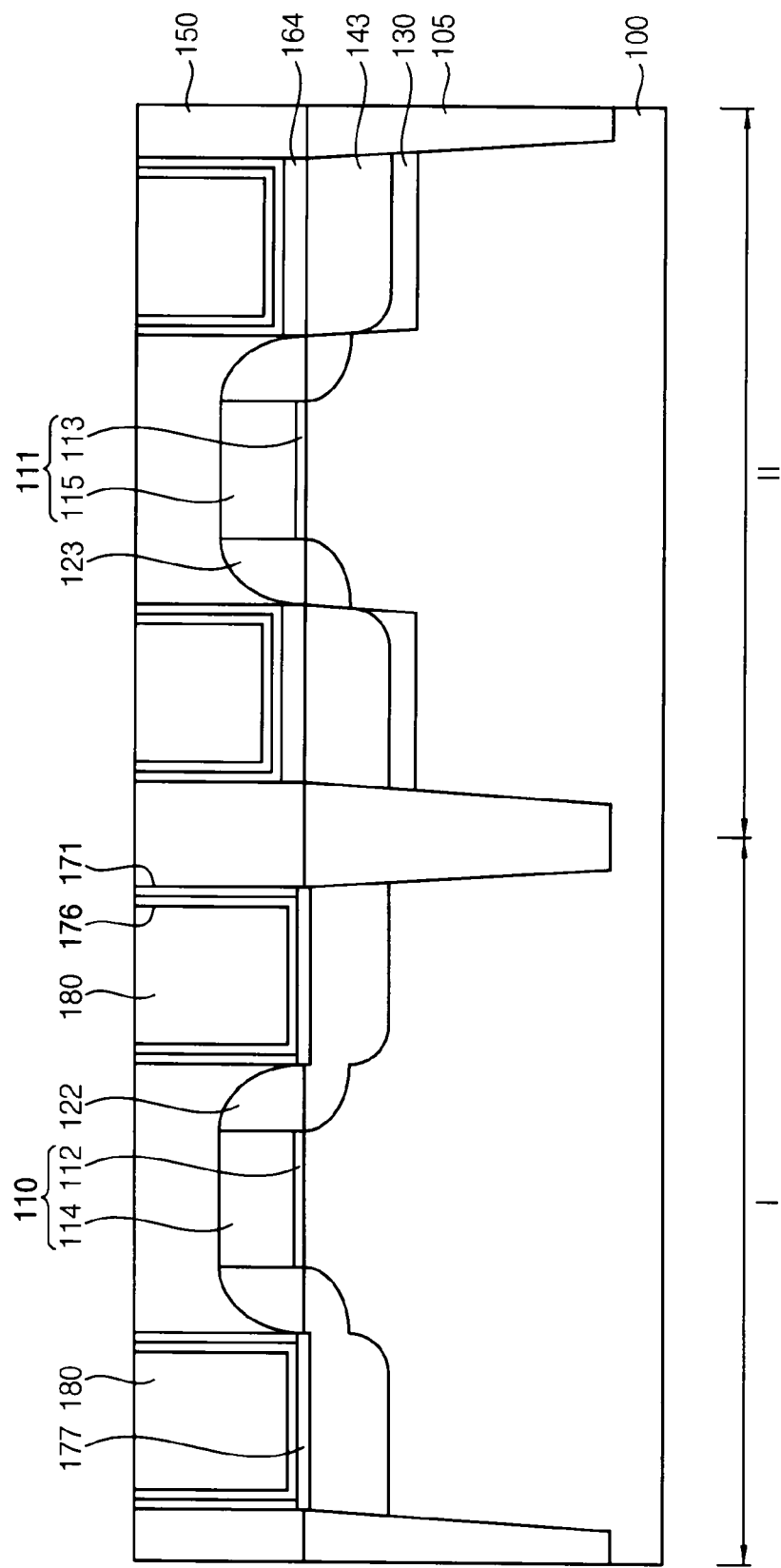

Referring to FIG. 13, a contact 180 may be formed on the barrier layer 175.

A contact layer may be formed on the barrier layer 175 and an upper portion of the contact layer may be removed to form the contact 180. Thus, the contacts 180 may be electrically connected to the second metal-semiconductor composite pattern 164 and the third metal-semiconductor composite pattern 177 respectively. In example embodiments, the contact 180 may be formed using a metal such as tungsten W by a sputtering process.

While the upper portion of the contact layer is removed, upper portions of the barrier layer 175 and the second metal layer 170 may be partially removed, to form a barrier layer pattern 176 and a second metal layer pattern 171.

In example embodiments, the NMOS transistor and the PMOS transistor may include different metal-semiconductor composites to reduce the contact resistance in the source/drain regions. Before the first metal layer 155 is formed, the third semiconductor pattern 147 may be formed, so that the first metal-semiconductor composite pattern 162 formed in a following heat treatment process may be removed by a wet etch process. Accordingly, the number of using masks may be reduced and a semiconductor device having an improved electrical performance may be formed.

FIGS. 14 to 20 are cross-sectional views illustrating a method of manufacturing a semiconductor device in accordance with example embodiments. The method of manufacturing a semiconductor device may be substantially similar to the method described with reference to FIGS. 2 to 13. Thus, same reference numerals will be used to refer to the same or like elements, and repetitive explanation concerning the above elements will be omitted.

Figure 14:
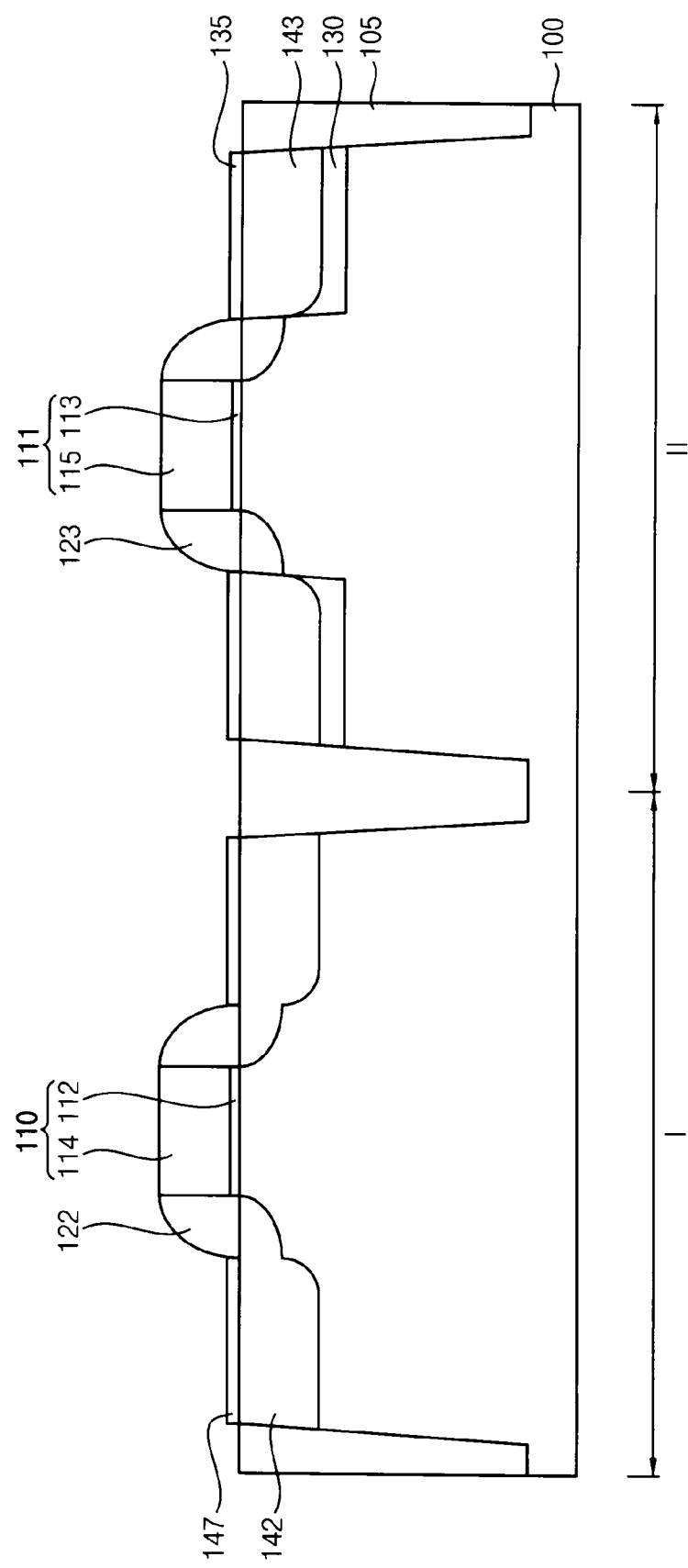
FIGS. 14 to 20 are cross-sectional views illustrating a method of manufacturing a semiconductor device in accordance with example embodiments.

Referring to FIG. 14, substantially the same processes as those illustrated with reference to FIGS. 2 to 6 may be performed.

For example, an isolation layer 105 may be formed in an upper portion of a substrate 100, gate structures 110 and 111 and impurity regions may be formed on the substrate 100, and a spacer layer 120 may be formed to cover the gate structures. Then, the upper portion of the substrate 100 in a second region (II) may be partially removed to form a second trench 125 which may also be referred to as a second depression, a first semiconductor pattern 130 may be formed to fill the second trench 125, and a second semiconductor pattern 135 may be formed on the first semiconductor pattern 130. The spacer layer 120 may be partially removed to form a first spacer 122 and a second spacer 123, and then, impurities may be implanted to form impurity regions 142 and 143. A third semiconductor pattern 147 having a material different from the second semiconductor pattern 135 may be formed in a first region (I) of the substrate 100.

Figure 15:
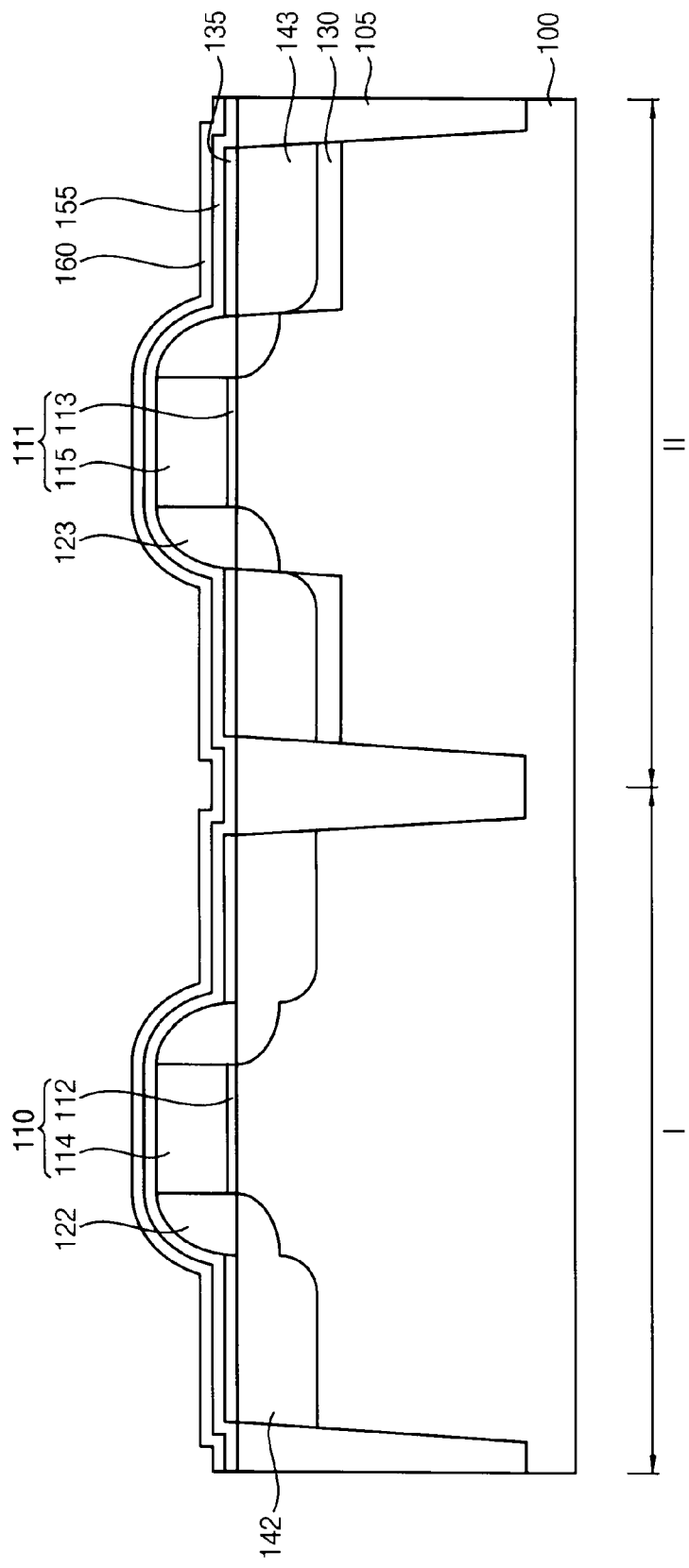

Referring to FIG. 15, a first metal layer 155 and a protection layer 160 may be formed. Processes of forming the first metal layer 155 and the protection layer 160 may be substantially the same as or similar to those described with reference to FIG. 8.

In example embodiments, the first metal layer 155 may be formed conformally on the first gate structure 110, the second gate structure 111, the first spacer 122, the second semiconductor pattern 135 and the third semiconductor patterns 147. The protection layer 160 may be formed on the first metal layer 155.

Figure 16:
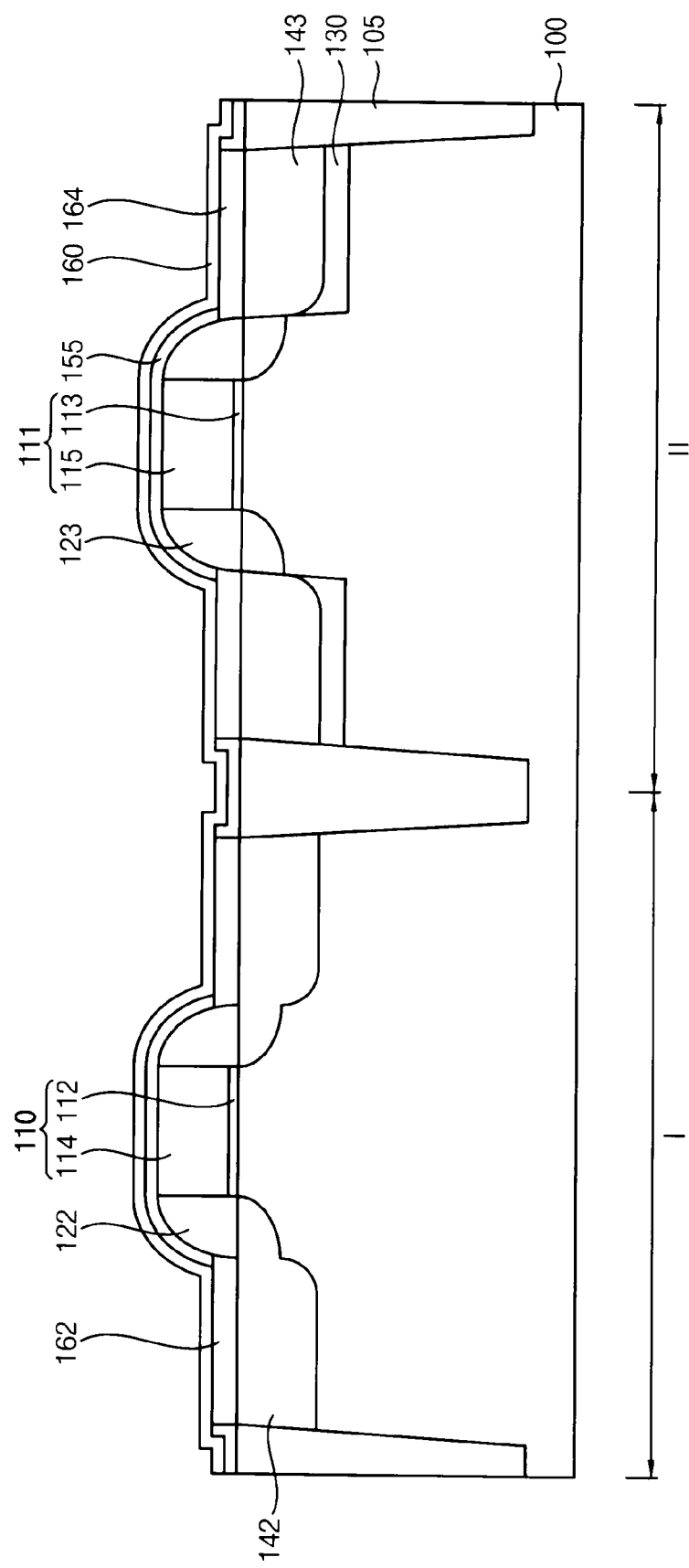

Referring to FIG. 16, a heat treatment process may be performed to form a first metal-semiconductor composite pattern 162 and a second metal-semiconductor composite pattern 164. The heat treatment process may be substantially the same as or similar to that described with reference to FIG. 9.

By the heat treatment process, the first metal-semiconductor composite pattern 162 and the second metal-semiconductor composite pattern 164 may be formed. For example, in case that the first metal layer 155 includes nickel, the first metal-semiconductor composite pattern 162 may include nickel-germanium composite (NiGe), and the second metal-semiconductor composite pattern 164 may include nickel-silicon composite (NiSi).

When the second metal-semiconductor composite pattern 164 includes nickel-silicon composite (NiSi), schottky barrier height in the interface with the fourth impurity region 143 including silicon-germanium (SiGe) may be decreased to reduce the contact resistance. For example, the second metal-semiconductor composite pattern 164 may reduce the contact resistance between the source/drain region of a PMOS transistor and a contact 180 which will be described later.

Figure 17:
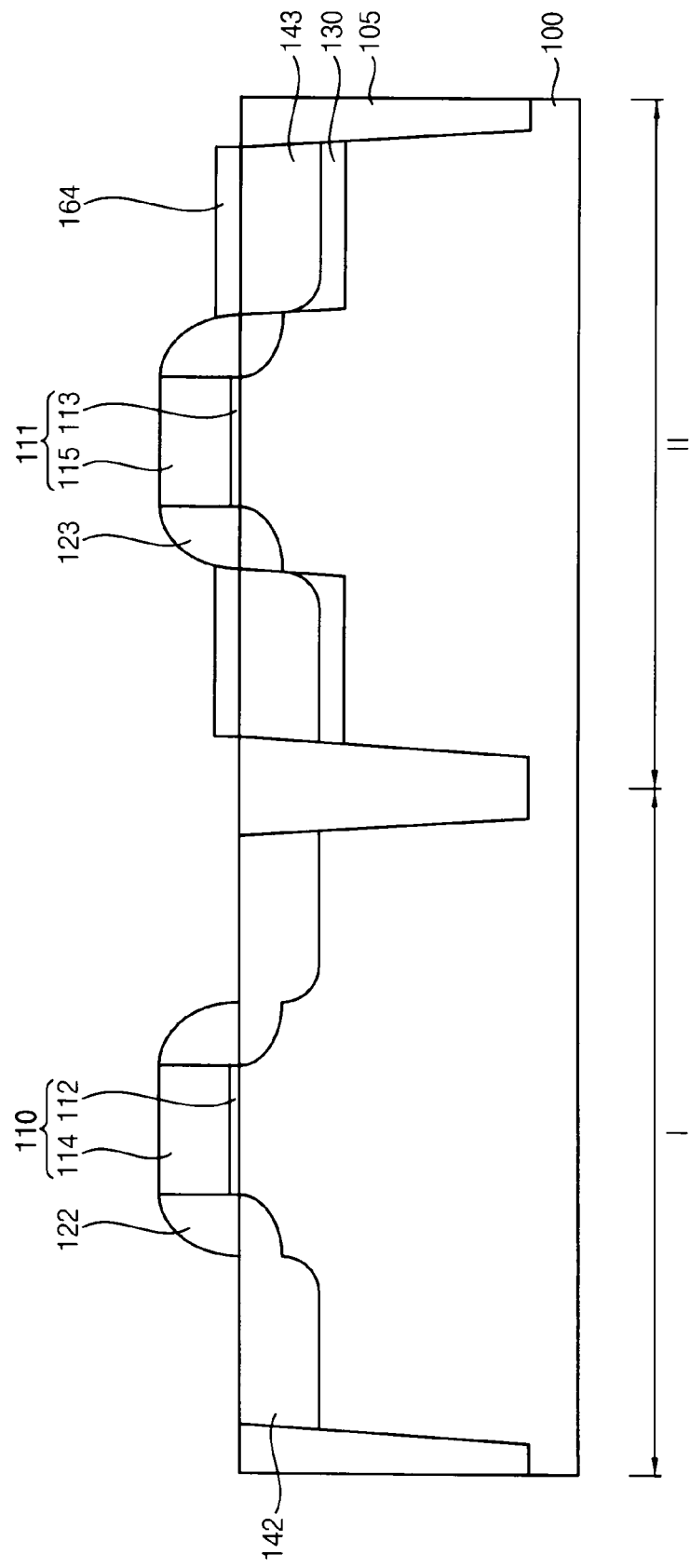

Referring to FIG. 17, the first metal-semiconductor composite pattern 162, the first metal layer 155 and the protection layer 160 may be removed from the substrate 100 by an etch process. The etch process may be substantially the same as or similar to that described with reference to FIG. 10.

Figure 18:
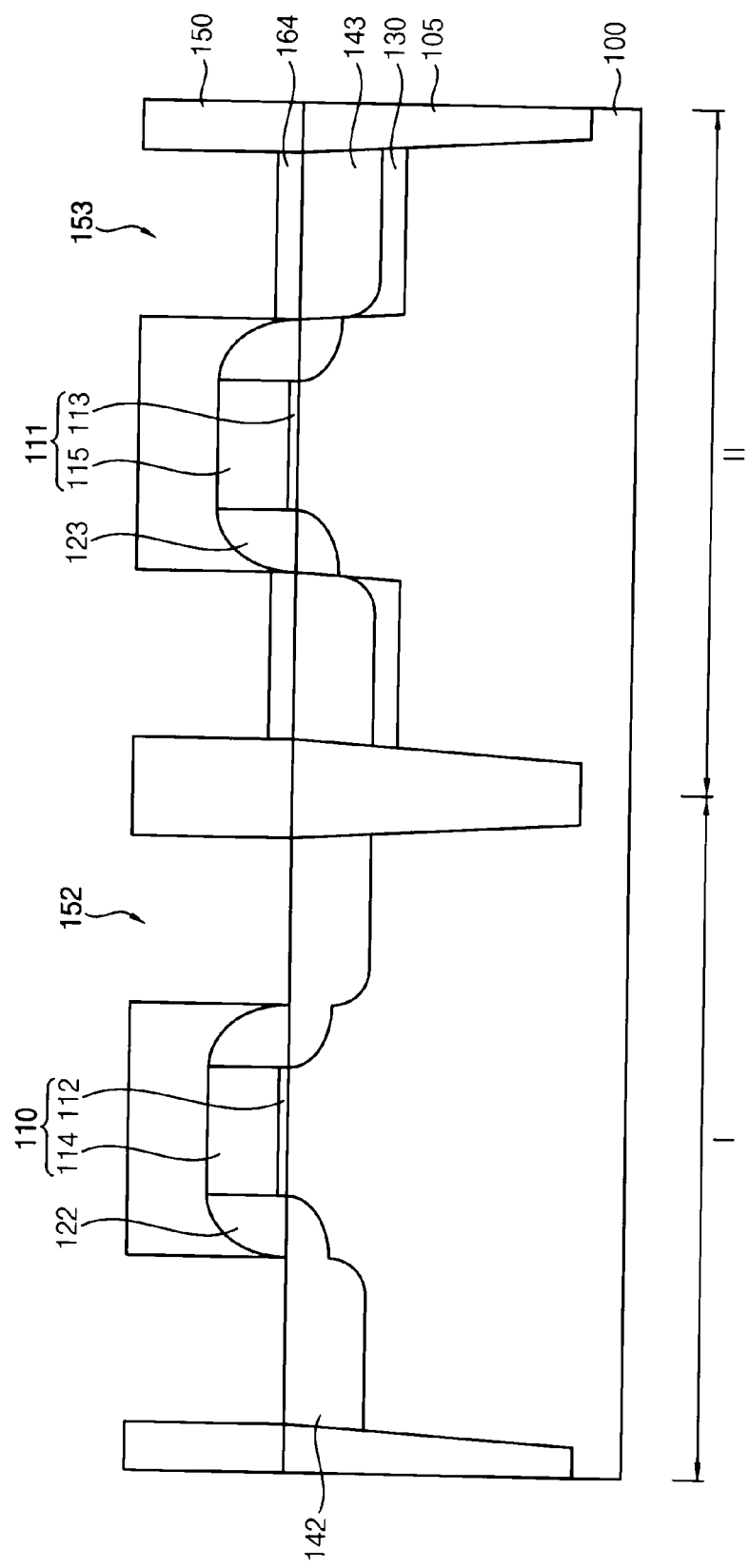

Referring to FIG. 18, an insulation interlayer 150 may be formed on the substrate 100 and partially removed to form a first opening 152 and a second opening 153.

In example embodiments, the insulation interlayer 150 may be formed using a silicon oxide. The insulation interlayer 150 may be partially removed to form the first opening 152 in the first region (I) and the second opening 153 in the second region (II). In example embodiments, the first opening 152 may expose the third impurity region 142, and the second opening 153 may expose the second metal-semiconductor composite pattern 164.

Figure 19:
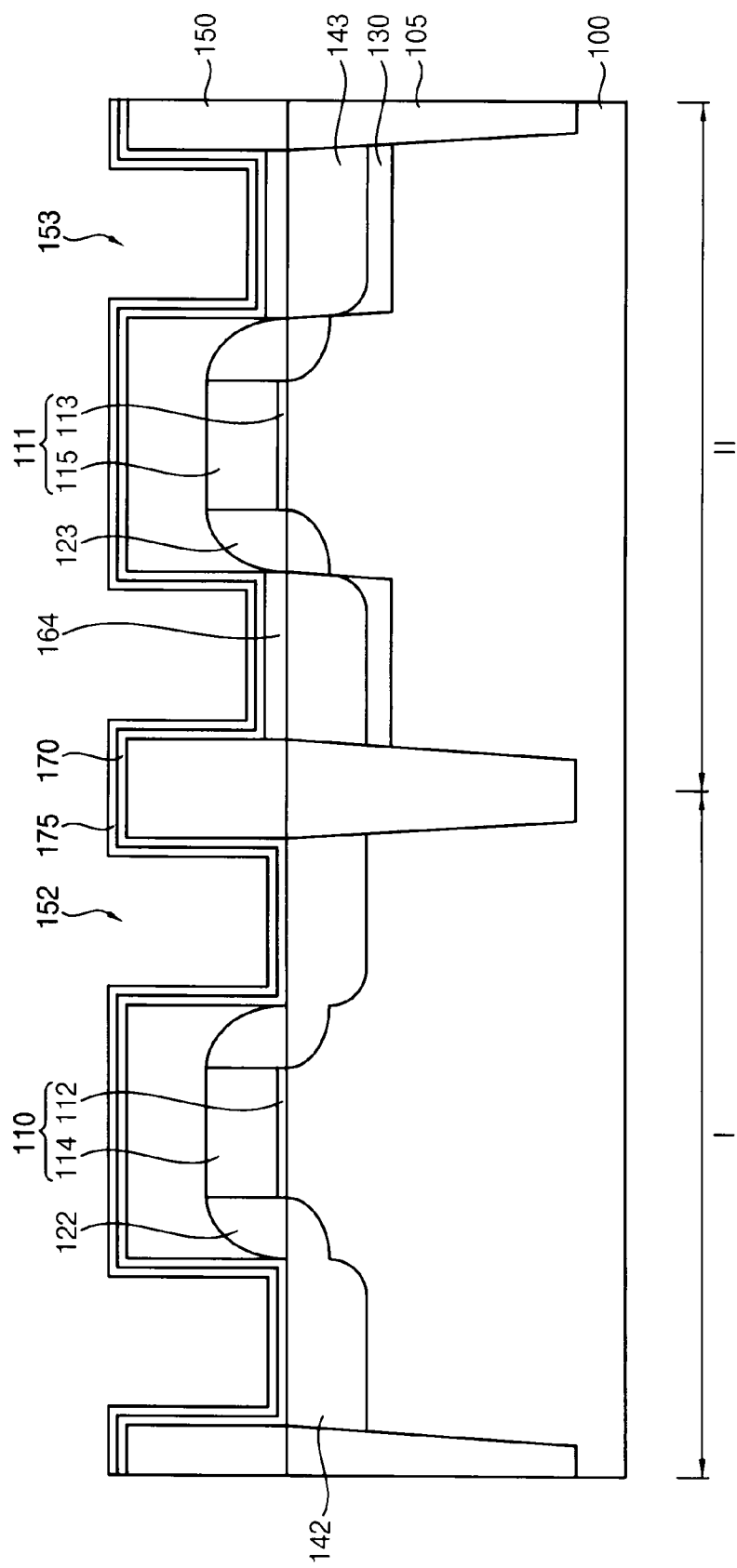

Referring to FIG. 19, a second metal layer 170 and a barrier layer 175 may be formed. Processes of forming the second metal layer 170 and the barrier layer 175 may be substantially the same as or similar to those described with reference to FIG. 11.

In example embodiments, the second metal layer 170 may be formed conformally on an upper surface and a sidewall of the insulation interlayer 150, the second metal-semiconductor composite pattern 164 and the exposed substrate 100. The barrier layer 175 may be formed on the second metal layer 170.

Figure 20:
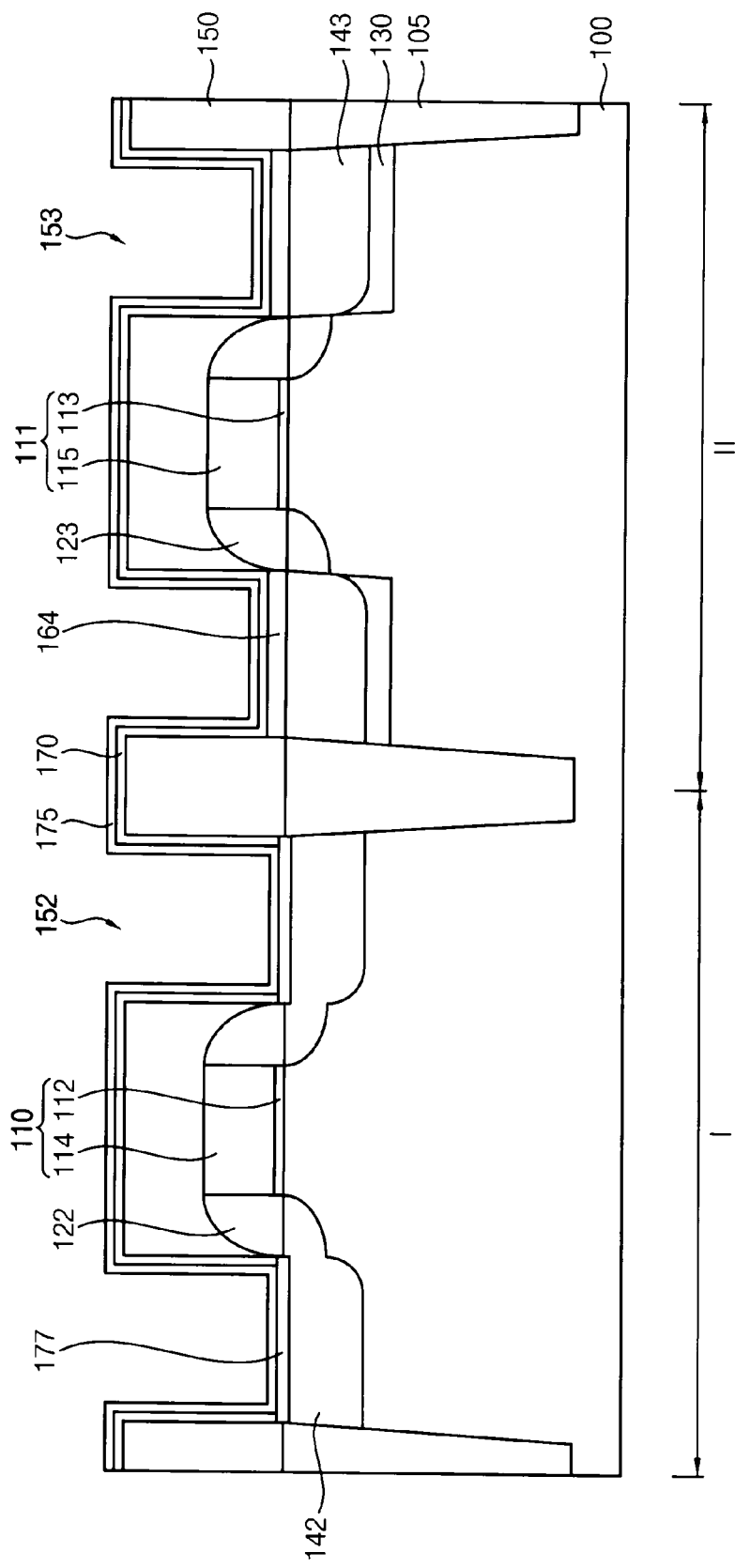

Referring to FIG. 20, a heat treatment process may be performed to form a third metal-semiconductor composite pattern 177. The heat treatment process may be substantially the same as or similar to that described with reference to FIG. 12.

In the heat treatment process, the metal layer 170 and the surface of the substrate 100 may react with each other to form the third metal-semiconductor composite pattern 177. For example, when the second metal layer 170 includes titanium, the third metal-semiconductor composite pattern 177 may include titanium-silicon composite (TiSi).

When the third metal-semiconductor composite pattern 177 includes titanium-silicon composite (TiSi), schottky barrier height in the interface with the substrate 100 including silicon (Si) may be decreased to reduce the contact resistance. For example, the third metal-semiconductor composite pattern 177 may reduce the contact resistance between the source/drain region of an NMOS transistor and a contact 180 which will be described later.

Then, the process described with reference to FIG. 13 may be performed to manufacture a semiconductor device.

In example embodiments, the process of forming the insulation interlayer 150 may be performed after the first and second metal-semiconductor composite patterns 162 and 164 are formed.

Figure 21:
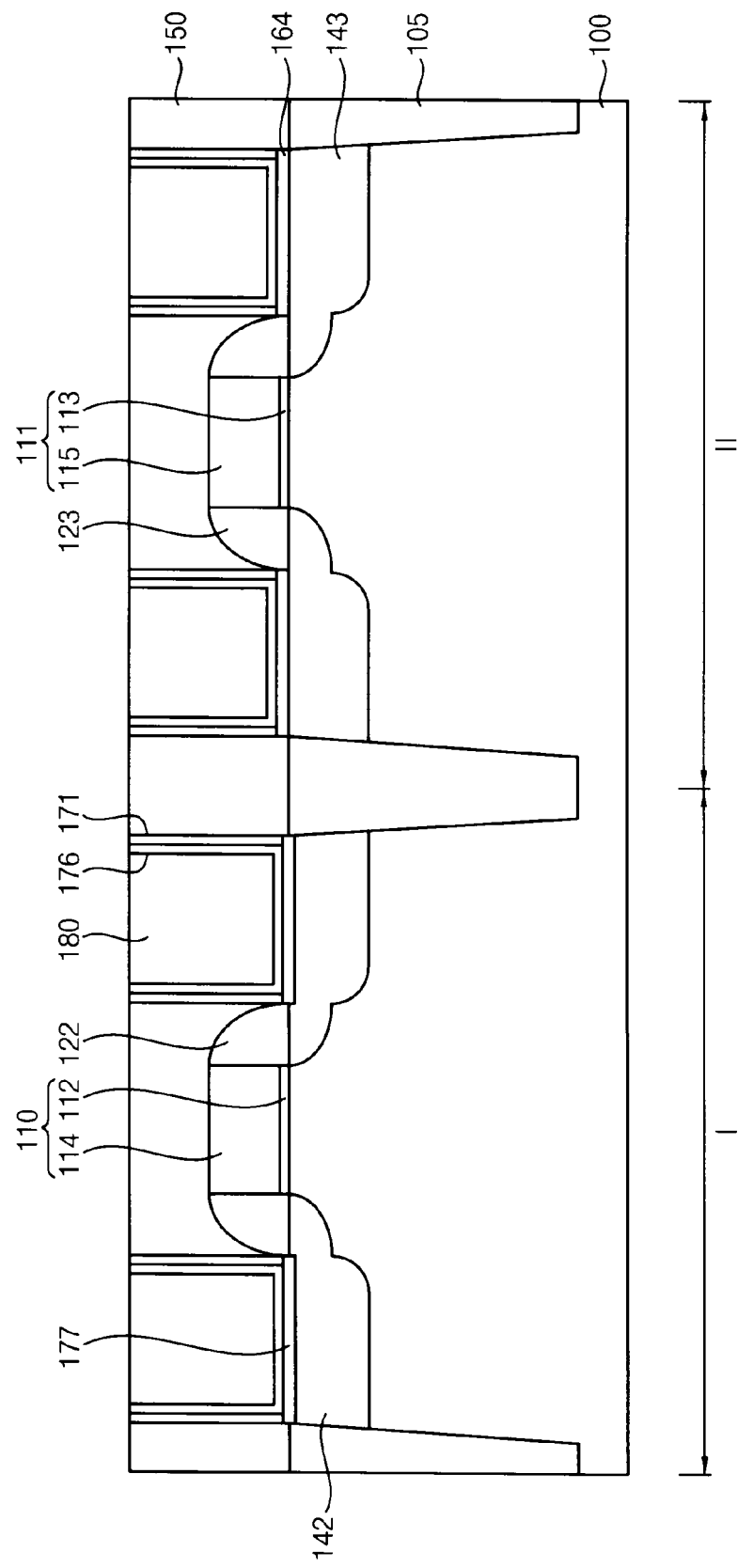
FIG. 21 is a cross-sectional view illustrating a semiconductor device in accordance with example embodiments.

FIG. 21 is a cross-sectional view illustrating a semiconductor device in accordance with example embodiments. The semiconductor device may be substantially the same as or similar to the semiconductor device described with reference to FIG. 1, except that the first semiconductor pattern is omitted. Thus, same reference numerals will be used to refer to the same or like elements, and repetitive explanation concerning the above elements will be omitted.

Referring to FIG. 21, a semiconductor device may include gate structures 110 and 111 on a substrate 100, impurity regions 142 and 143 adjacent to the gate structures 110 and 111 in the substrate 100, metal-semiconductor composite patterns 164 and 177 on the impurity regions 142 and 143, and contacts 180 electrically connected to the metal-semiconductor composite patterns 164 and 177.

A second metal-semiconductor composite pattern 164 may be disposed on the first semiconductor pattern 130. The second metal-semiconductor composite pattern 164 may include metal-semiconductor composite. In example embodiments, the second metal-semiconductor composite pattern 164 may include nickel-silicon composite (NiSi) or platinum-nickel-silicon composite (NiPtSi). Here, the concentration of platinum may be about 10% by weight or less.

The second metal-semiconductor composite pattern 164 may serve as a source/drain region of a PMOS transistor and make contact with the fourth impurity region 143 including silicon (Si) and/or germanium (Ge). When the second metal-semiconductor composite pattern 164 includes nickel-silicon composite (NiSi), schottky barrier height in the interface with the fourth impurity region 143 including silicon-germanium (SiGe) may be decreased to reduce the contact resistance. For example, the second metal-semiconductor composite pattern 164 may reduce the contact resistance between the source/drain region of the PMOS transistor and the contact 180.

In example embodiments, the second metal-semiconductor composite pattern 164 and the third metal-semiconductor composite pattern 177 may have different work functions. For example, the material of the second metal-semiconductor composite pattern 164 may be selected to have an appropriate work function value for an NMOS transistor, and thus, the contact resistance between the source/drain regions of the NMOS transistor and the contact patterns 180 may be reduced. Likewise, the material of the third metal-semiconductor composite pattern 177 may be selected to have an appropriate work function value for a PMOS transistor, and thus, the contact resistance between the source/drain regions of the PMOS transistor and the contact patterns 180 may be reduced.

FIGS. 22 to 27 are cross-sectional views illustrating a method of manufacturing a semiconductor device in accordance with example embodiments. The method of manufacturing a semiconductor device may be substantially similar to the method described with reference to FIGS. 2 to 13. Thus, same reference numerals will be used to refer to the same or like elements, and repetitive explanation concerning the above elements will be omitted.

Figure 22:
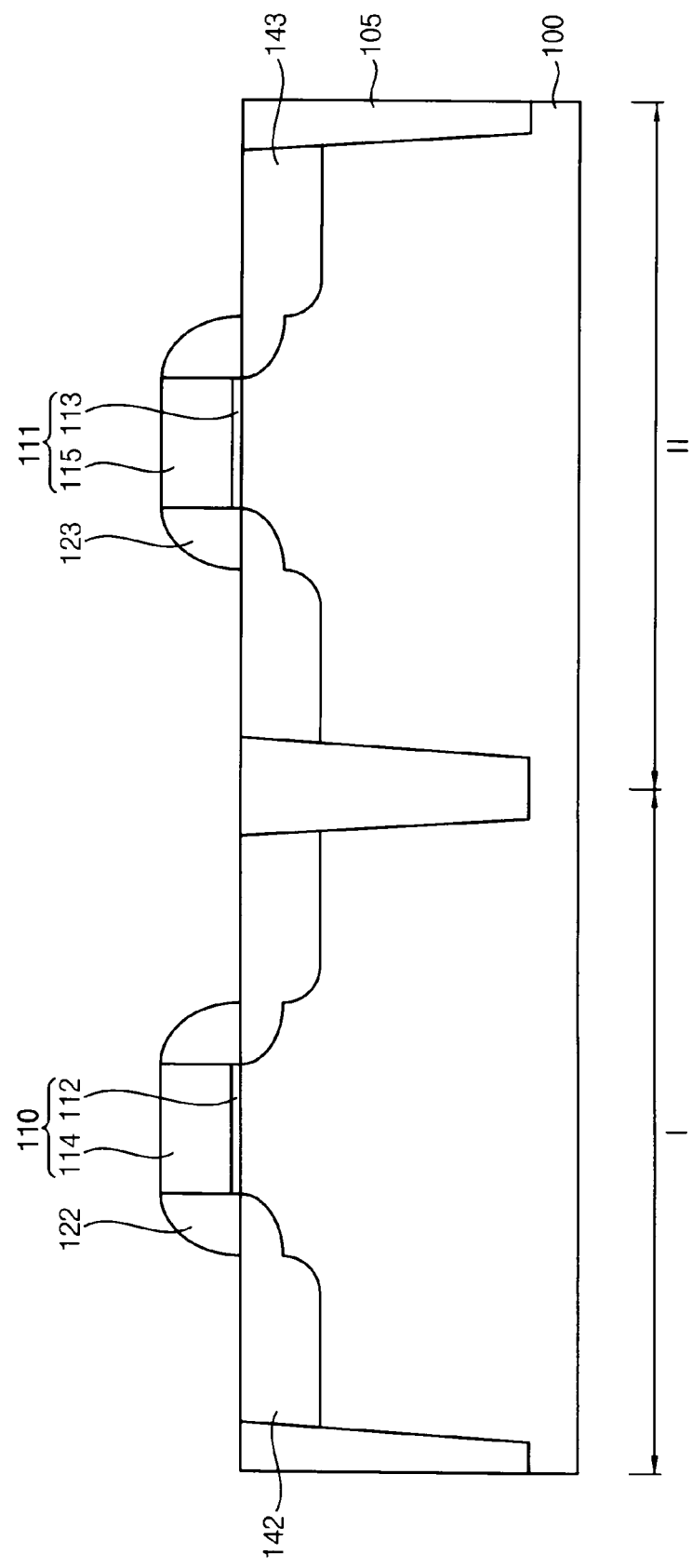
FIGS. 22 to 27 are cross-sectional views illustrating a method of manufacturing a semiconductor device in accordance with example embodiments.

Referring to FIG. 22, substantially similar processes to those illustrated with reference to FIGS. 2 to 5 may be performed. Here, descriptions of the processes of forming the first trench and the first semiconductor pattern may be omitted.

For example, an isolation layer 105 may be formed in an upper portion of a substrate 100, gate structures 110 and 111 may be formed on the substrate 100, and impurities may be implanted into the upper portion of the substrate 100 using the gate structures 110 and 111 as an ion implantation mask. Spacers 122 and 123 may be formed on sidewalls of the gate structures 110 and 111 respectively, and impurities may be implanted into the upper portion of the substrate 100 using the gate structures 110 and 111 and the spacers 122 and 123 as an ion implantation mask, to form impurity regions 142 and 143 respectively.

Thus, the first gate structure 110 and the third impurity region 142 may constitute a negative-channel metal oxide semiconductor (NMOS) transistor, and the third impurity region 142 may serve as a source/drain region of the NMOS transistor. The second gate structure 111 and the fourth impurity region 143 may constitute a positive-channel metal oxide semiconductor (PMOS) transistor, and the fourth impurity region 143 may serve as a source/drain region of the PMOS transistor.

Figure 23:
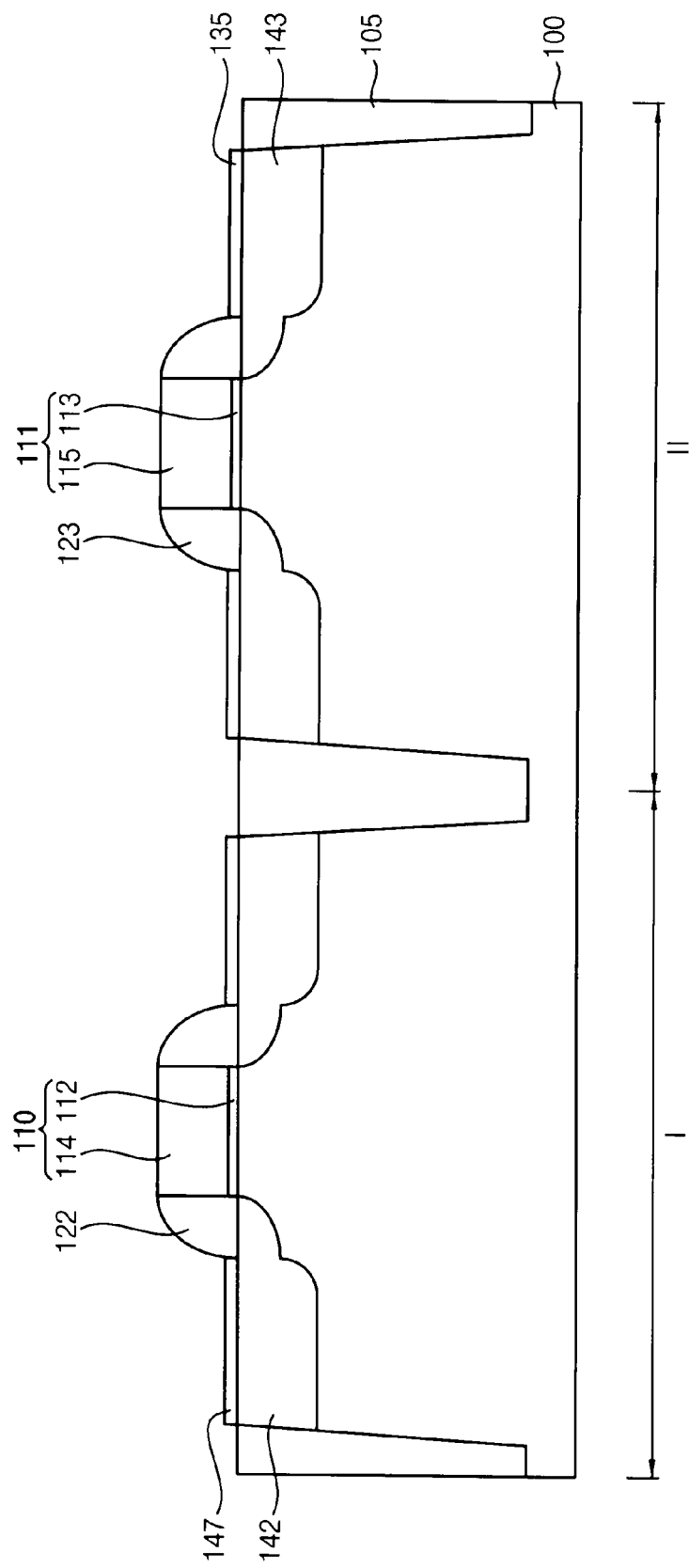

Referring to FIG. 23, a second semiconductor pattern 135 may be formed adjacent to the second gate structure 111 on the substrate 100, and a third semiconductor pattern 147 may be formed adjacent to the first gate structure 110 on the substrate 100.

The second semiconductor pattern 135 and the third semiconductor pattern 147 may include different semiconductor material. The processes of forming the second and third semiconductor patterns 135 and 147 may be performed separately. In example embodiments, the second semiconductor pattern 135 may be formed by a selective epitaxial growth (SEG) process using a silicon source gas, and the third semiconductor pattern 147 may be formed by a SEG process using a germanium source gas.

Figure 24:
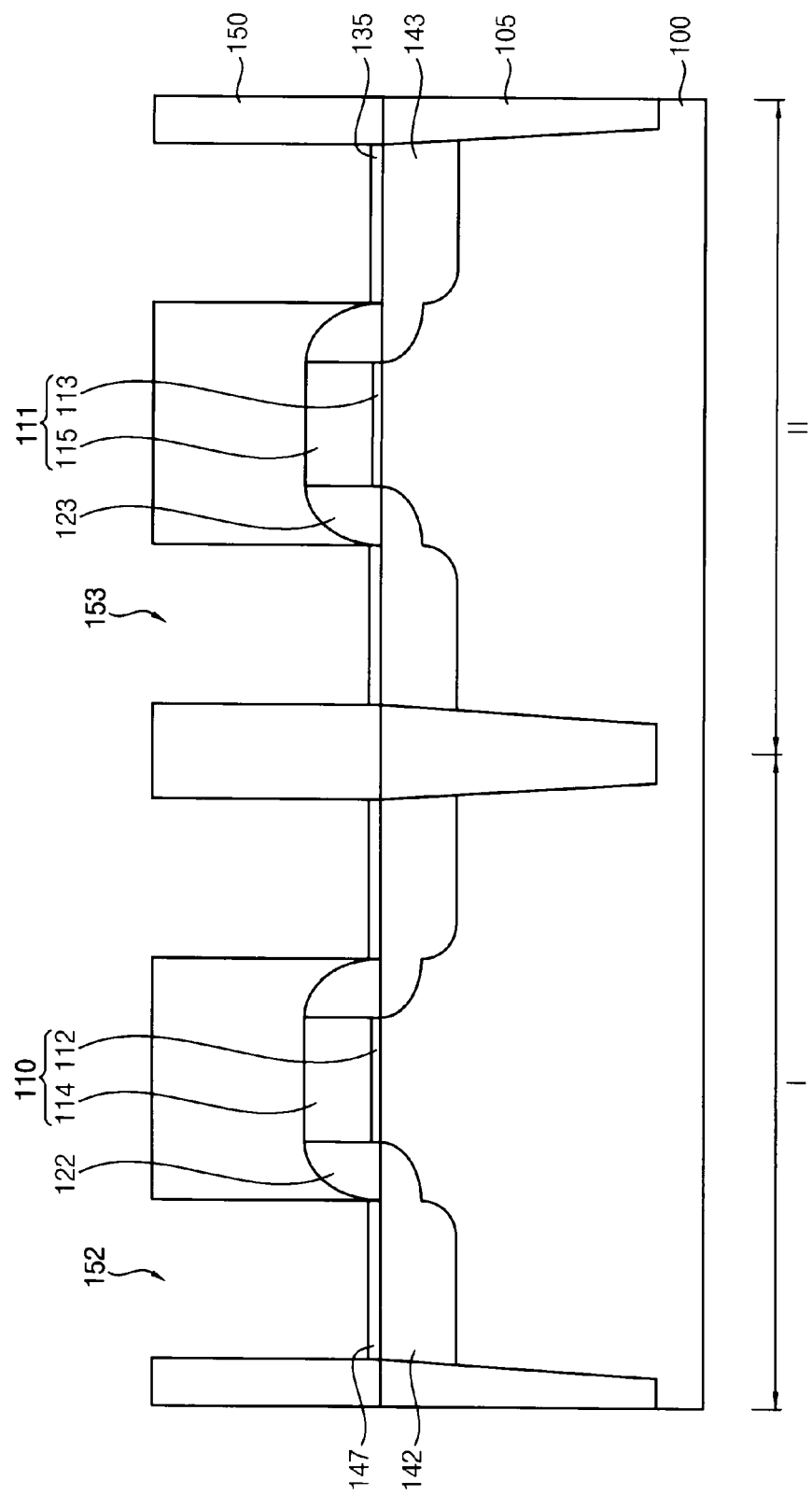

Referring to FIG. 24, an insulation interlayer 150 may be formed on the substrate 100 and partially removed to form a first opening 152 and a second opening 153. A process of forming the insulation interlayer 150 may be substantially the same as or similar to that described with reference to FIG. 7.

Figure 25:
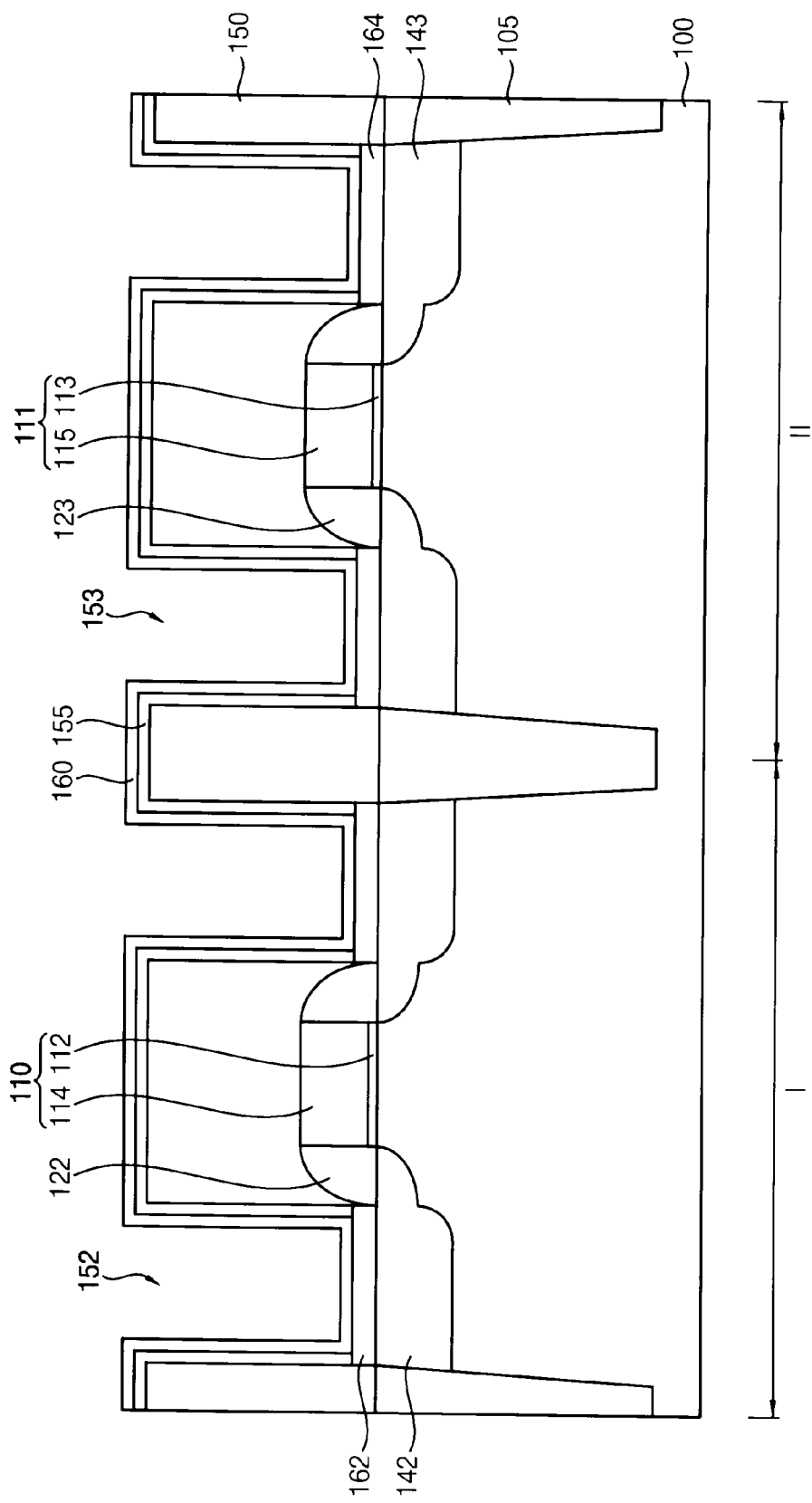

Referring to FIG. 25, a first metal layer 155 and a protection layer 160 may be formed to cover the insulation interlayer 150, the second semiconductor pattern 135 and the third semiconductor pattern 147, and then, a heat treatment process may be performed to form a first metal-semiconductor composite pattern 162 and a second metal-semiconductor composite pattern 164. These processes may be substantially the same as or similar to those described with reference to FIGS. 8 and 9.

For example, in case that the first metal layer 155 includes nickel, the first metal-semiconductor composite pattern 162 may include nickel-germanium composite (NiGe), and the second metal-semiconductor composite pattern 164 may include nickel-silicon composite (NiSi).

When the second metal-semiconductor composite pattern 164 includes nickel-silicon composite (NiSi), schottky barrier height in the interface with the fourth impurity region 143 including silicon (Si) may be decreased to reduce the contact resistance. For example, the second metal-semiconductor composite pattern 164 may reduce the contact resistance between the source/drain region of the PMOS transistor and the contact 180 (see FIG. 21).

Figure 26:
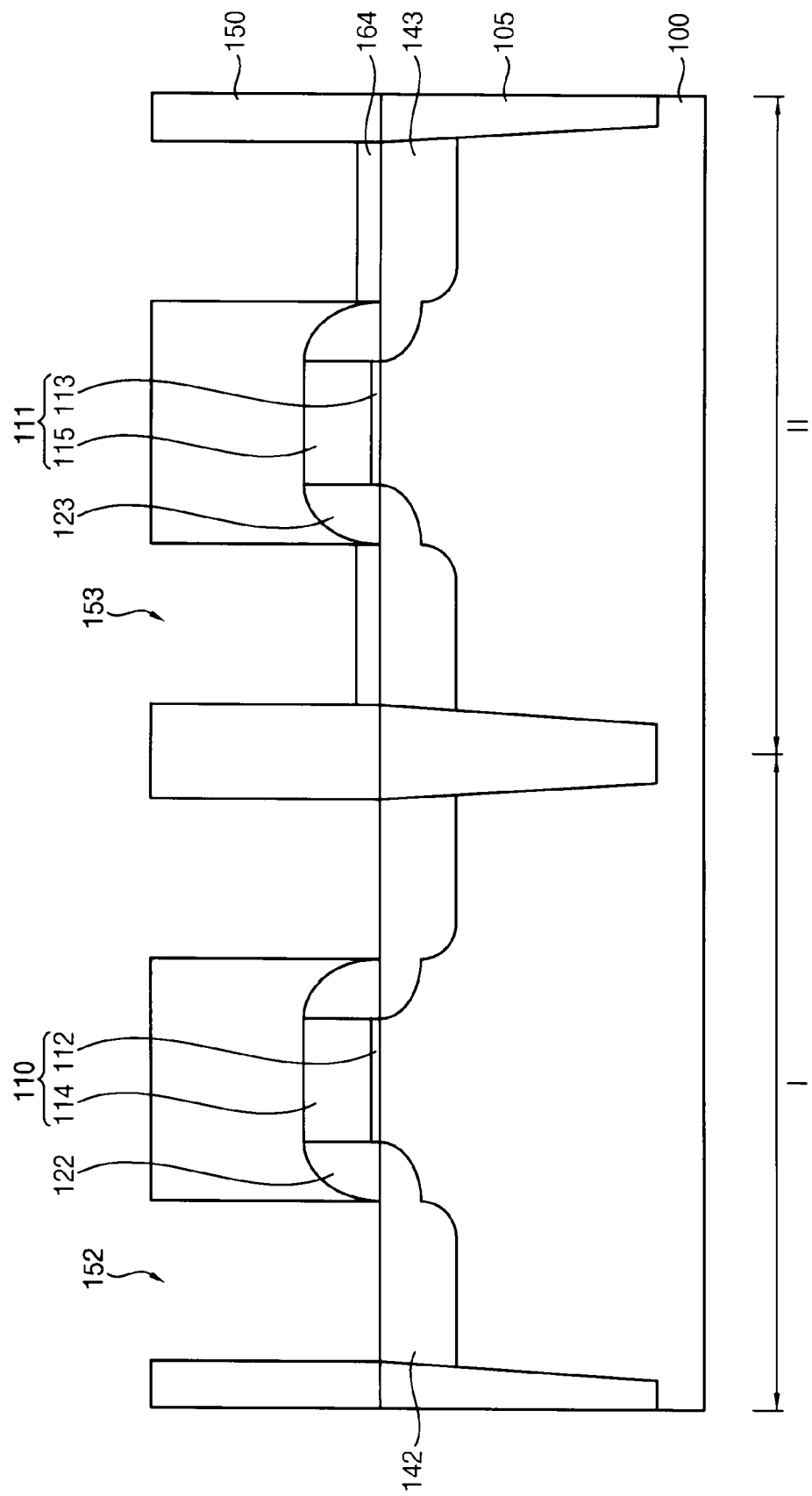

Referring to FIG. 26, the first metal-semiconductor composite pattern 162, the first metal layer 155 and the protection layer 160 may be removed from the substrate 100 by an etch process. The second metal-semiconductor composite 164 may not be removed by the etch process to remain.

Figure 27:
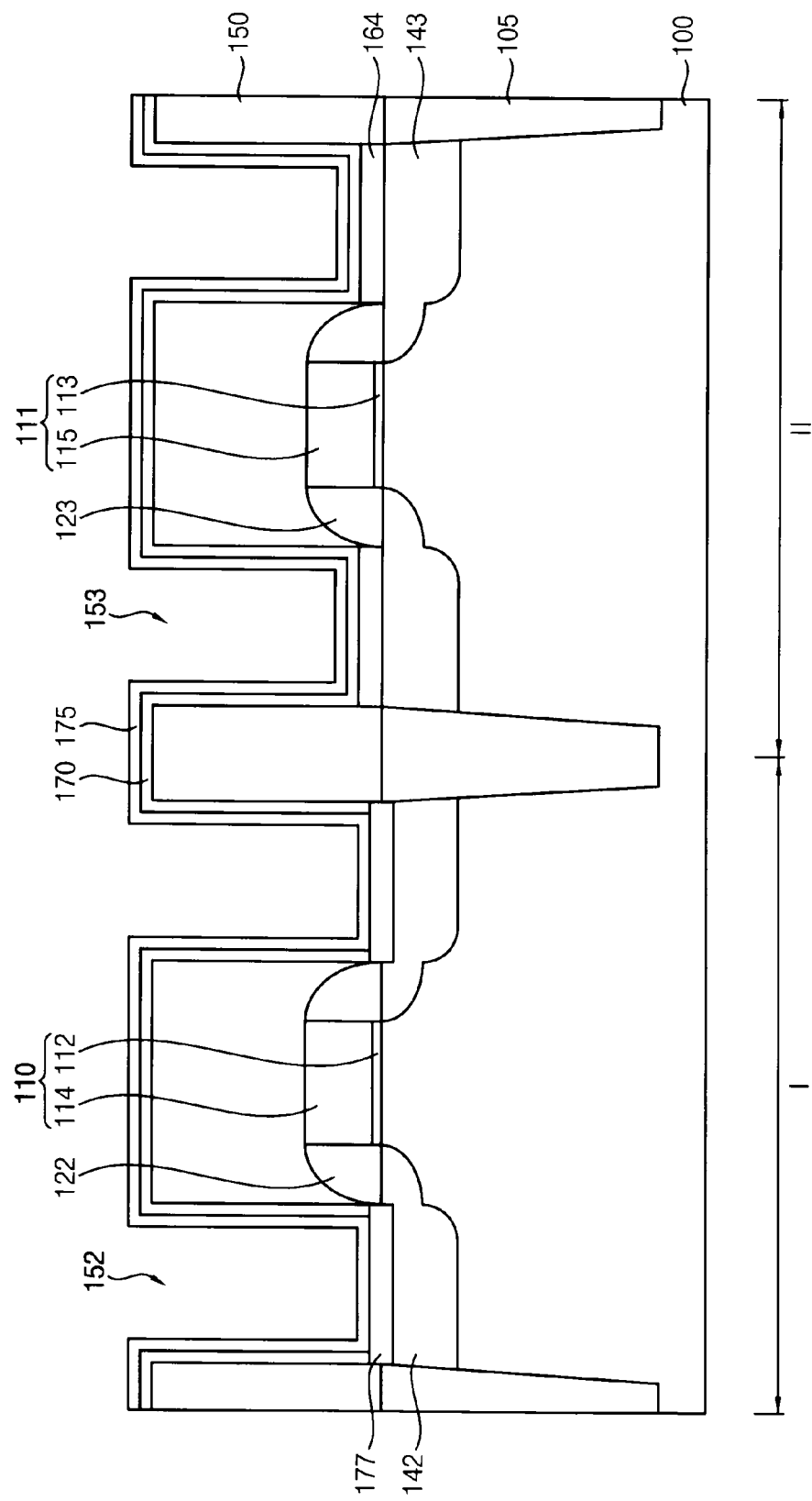

Referring to FIG. 27, a second metal layer 170 and a barrier layer 175 may be formed to cover the insulation interlayer 150 and the second metal-semiconductor composite pattern 164, and then, a heat treatment process may be performed to form a third metal-semiconductor composite pattern 177. These processes may be substantially the same as or similar to those described with reference to FIGS. 11 and 12.

For example, when the second metal layer 170 includes titanium, the third metal-semiconductor composite pattern 177 may include titanium-silicon composite (TiSi). A material included in the third metal-semiconductor composite pattern 177 may have a work function less than that of a material included in the second metal-semiconductor composite pattern 164.

When the third metal-semiconductor composite pattern 177 includes titanium-silicon composite (TiSi), schottky barrier height in the interface with the substrate 100 including silicon (Si) may be decreased to reduce the contact resistance. For example, the third metal-semiconductor composite pattern 177 may reduce the contact resistance between the source/drain region of the NMOS transistor and the contact 180.

Then, substantially the same process as described with reference to FIG. 13 may be performed to manufacture the semiconductor device in FIG. 21.

FIGS. 28 to 65 are plan views and cross-sectional views illustrating a method of manufacturing a semiconductor device in accordance with example embodiments. Particularly, FIGS. 28, 30, 34, 37, 42 and 46 are plan views, and FIGS. 29, 31-33, 35-36, 38-41, 43-45 and 47-65 are cross-sectional views.

FIGS. 31, 35, 38, 40, 43, 47, 49, 51, 54, 57, 60, 63 and 65 are cross-sectional views taken along a line A-A' of corresponding plan views, FIGS. 29, 32, 44 and 48 are cross-sectional views taken along a line B-B' of corresponding plan views, FIGS. 33, 36, 39, 41, 45, 52, 55, 56, 58 and 61 are cross-sectional views taken along a line C-C' of corresponding plan views, and FIGS. 50, 53, 56, 62 and 64 are cross-sectional views taken along a line D-D' of corresponding plan views.

Figure 28:
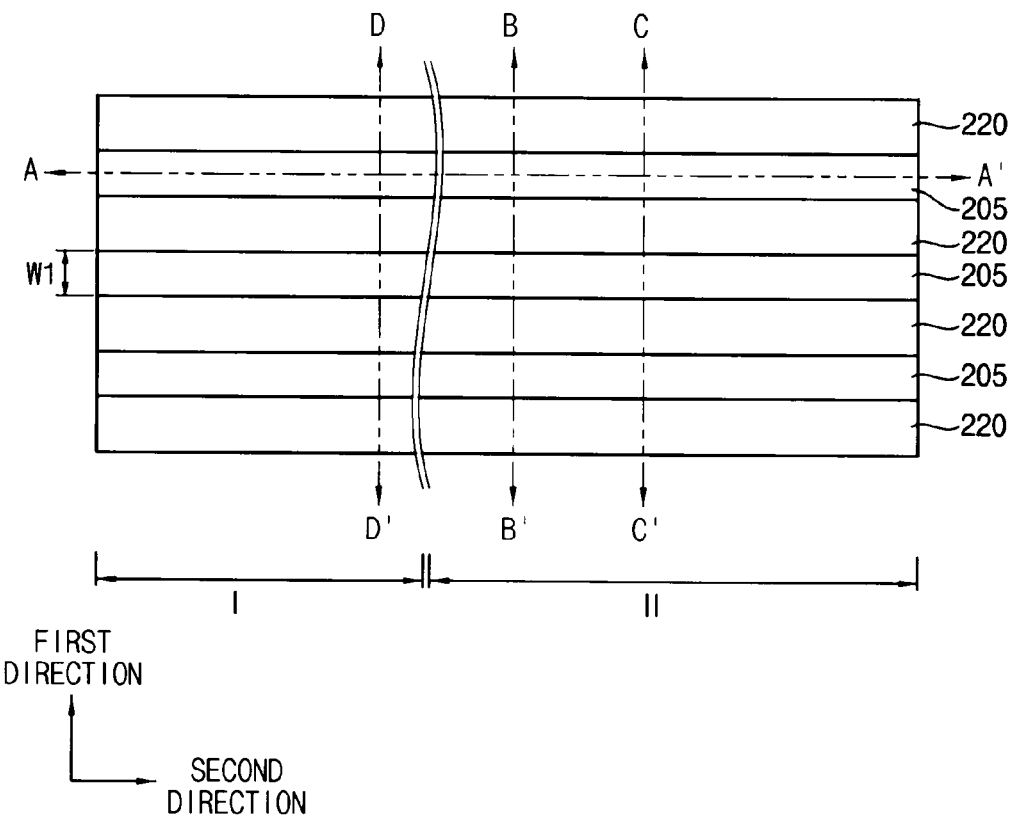
FIGS. 28 to 65 are plan views and cross-sectional views illustrating a method of manufacturing a semiconductor device in accordance with example embodiments.
Figure 29:
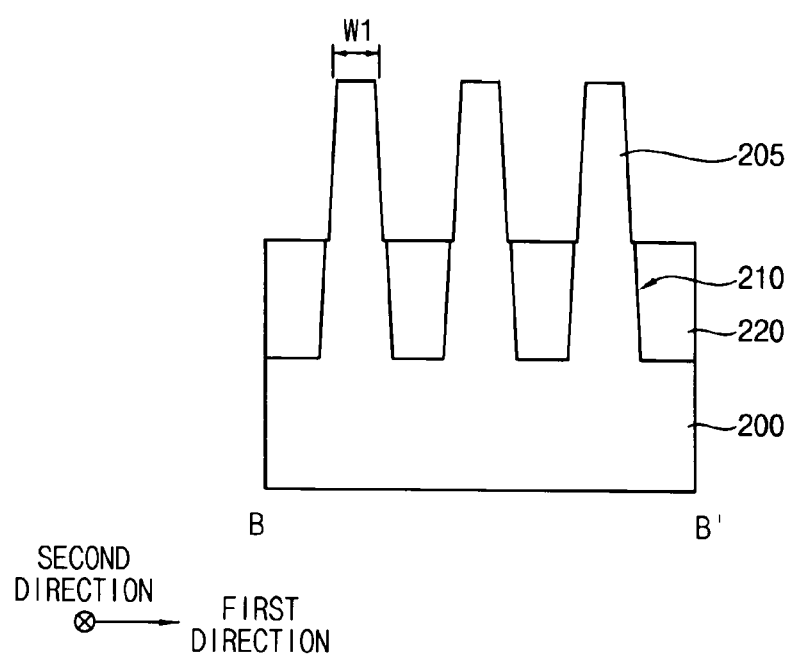
Figure 30:
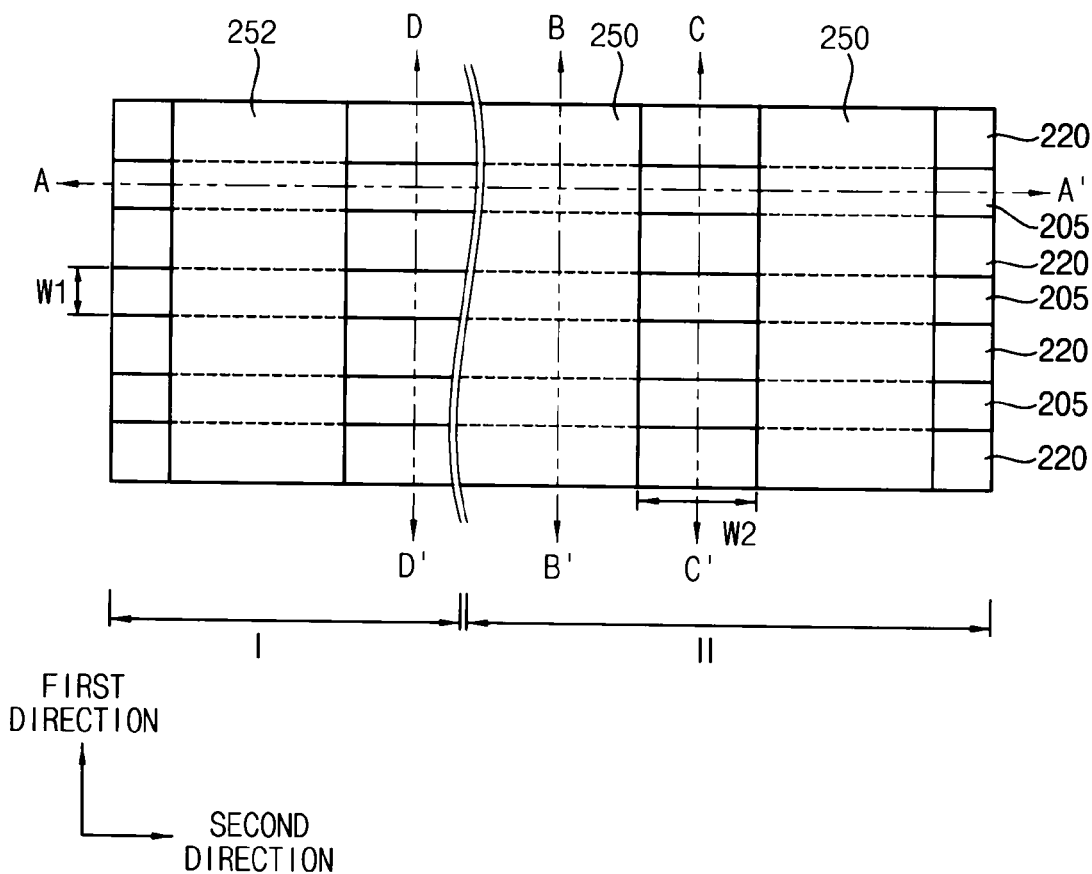
Figure 31:
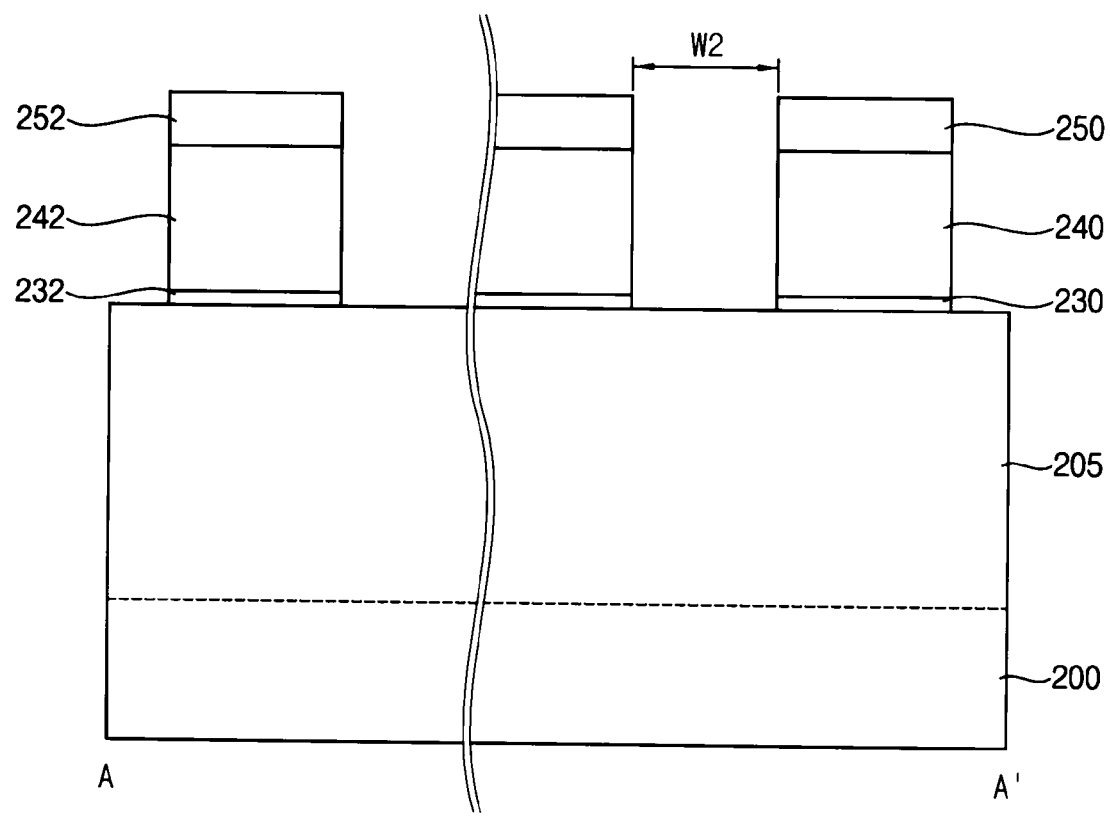
Figure 32:
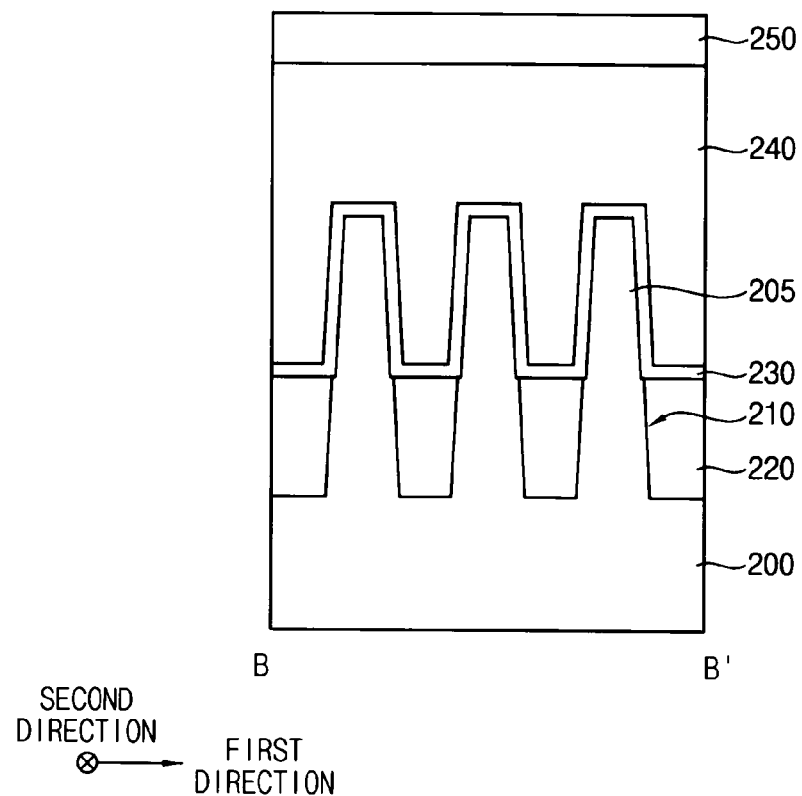
Figure 33:
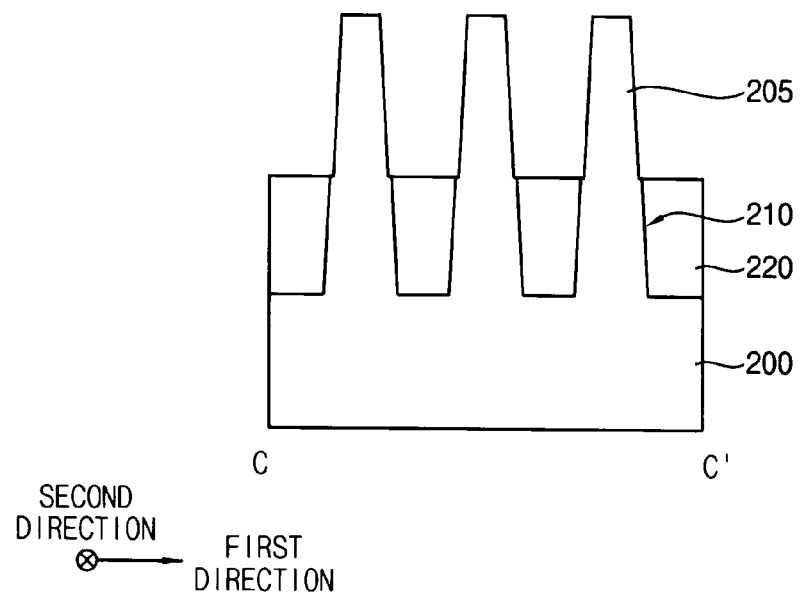

Referring to FIGS. 28 and 29, an upper portion of the substrate 200 may be partially etched to form a trench 210 which may also be referred to as a depression, and an isolation layer 220 may be formed to fill a lower portion of the trench 210.

The substrate 200 may be a silicon substrate, a germanium substrate, a silicon-germanium substrate, a silicon-on-insulator (SOI) substrate, a germanium-on-insulator (GOI) substrate, etc.

The substrate 200 may be divided into a first region (I) and a second region (II). In example embodiments, the first region (I) may be NMOS region where MOSFET having N type channel is arranged, and the second region (II) may be PMOS region where MOSFET having P type channel is arranged.

In example embodiments, the isolation layer 220 may be formed by forming an insulation layer on the substrate 200 to sufficiently fill the trench 210, planarizing the insulation layer until a top surface of the substrate 200 may be exposed, and removing an upper portion of the insulation layer to expose an upper portion of the trench 210. When the upper portion of the insulation layer is removed, an upper portion of the substrate 200 adjacent thereto may be also removed to have a reduced width. The insulation layer may be formed to include an oxide, e.g., silicon oxide.

When the isolation layer 220 is formed on the substrate 200, a field region having a top surface covered by the isolation layer 220 and an active region having a top surface not covered by the isolation layer 220 may be defined in the substrate 200. The active region may have a fin-like shape protruding from the substrate 200, and thus may be referred to as an active fin 205.

In example embodiments, the active fin 205 may extend in a second direction substantially parallel to a top surface of the substrate 200, and a plurality of the active fins 105 may be formed in a first direction substantially parallel to the top surface of the substrate 200 and substantially perpendicular to the second direction. The active fin 205 may have a uniform width (W1) in the first direction.

Referring to FIGS. 30 to 33, first and second dummy gate structures may be formed on the substrate 200.

The first and second dummy gate structures may be formed by sequentially stacking a dummy gate insulation layer, a dummy gate electrode layer and a dummy gate mask layer on the active fin 205 of the substrate 200 and the isolation layer 220, patterning the dummy gate mask layer by a photolithography process using a photoresist pattern (not shown) to form a dummy gate mask 250, 252, and sequentially etching the dummy gate electrode layer and the dummy gate insulation layer using the dummy gate mask 250, 252 as an etching mask.

Thus, each dummy gate structure may be formed to include a dummy gate insulation layer pattern 230, 232, a dummy gate electrode 240, 242 and the dummy gate mask 250, 252 sequentially stacked on the active fin 205 of the substrate 200 and a portion of the isolation layer 220 adjacent thereto in the first direction.

In example embodiments, the first dummy gate structure may be arranged in the second region (II), and include the first gate insulation layer pattern 230, the first dummy gate electrode 240 and the first gate mask 250. The second dummy gate structure may be arranged in the first region (I), and include the second gate insulation layer pattern 232, the second dummy gate electrode 240, and the second gate mask 252.

The dummy gate insulation layer may be formed to include an oxide, e.g., silicon oxide, the dummy gate electrode layer may be formed to include, e.g., polysilicon, and the dummy gate mask layer may be formed to include a nitride, e.g., silicon nitride. The dummy gate insulation layer, the dummy gate electrode layer, and the dummy gate mask layer may be formed by a chemical vapor deposition (CVD) process, an atomic layer deposition (ALD) process, or the like. Alternatively, the dummy gate insulation layer may be formed by a thermal oxidation process on an upper portion of the substrate 200.

In example embodiments, the dummy gate structure may be formed on the active fins 205 of the substrate 200 and the isolation layer 220 to extend in the first direction, and a plurality of the dummy gate structures may be formed to be spaced apart from each other in the second direction.

After forming the dummy gate structure, an ion implantation process may be performed to form impurity regions in the upper portions of the active fins 205 adjacent to the first and second dummy gate structures respectively.

Figure 34:
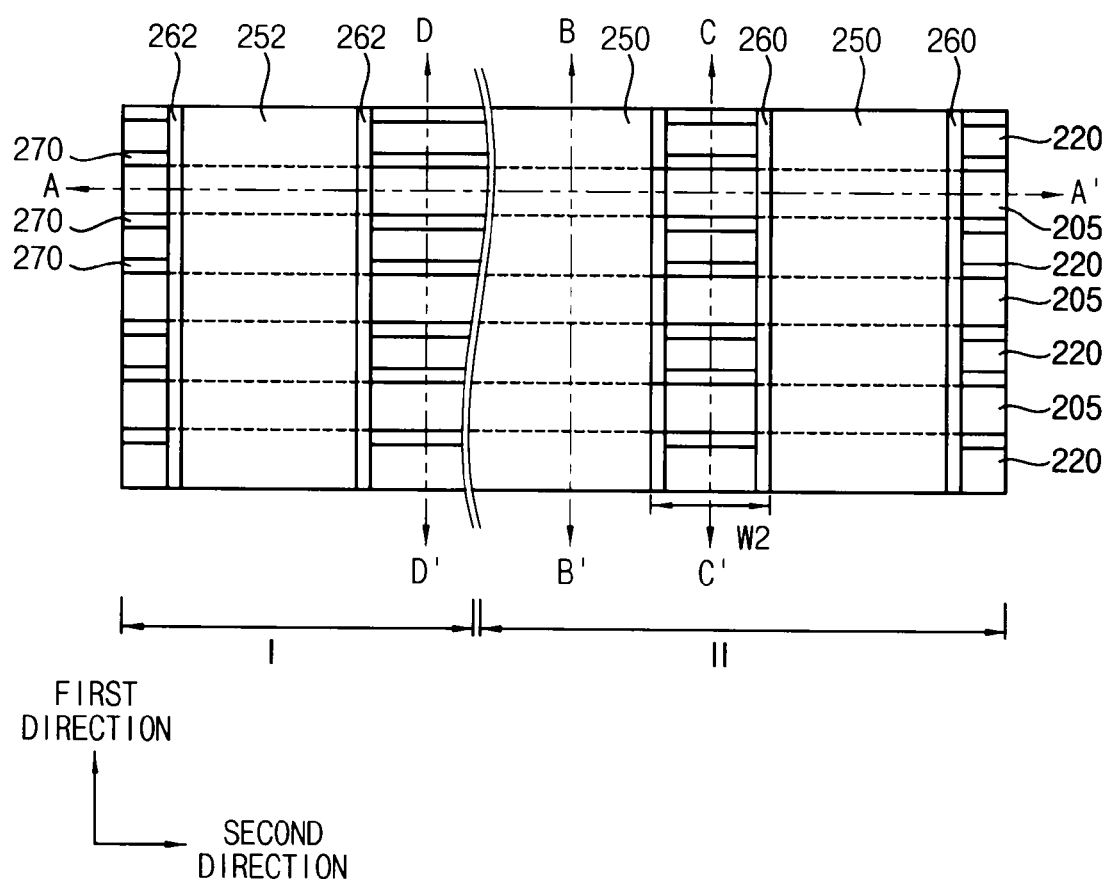
Figure 35:
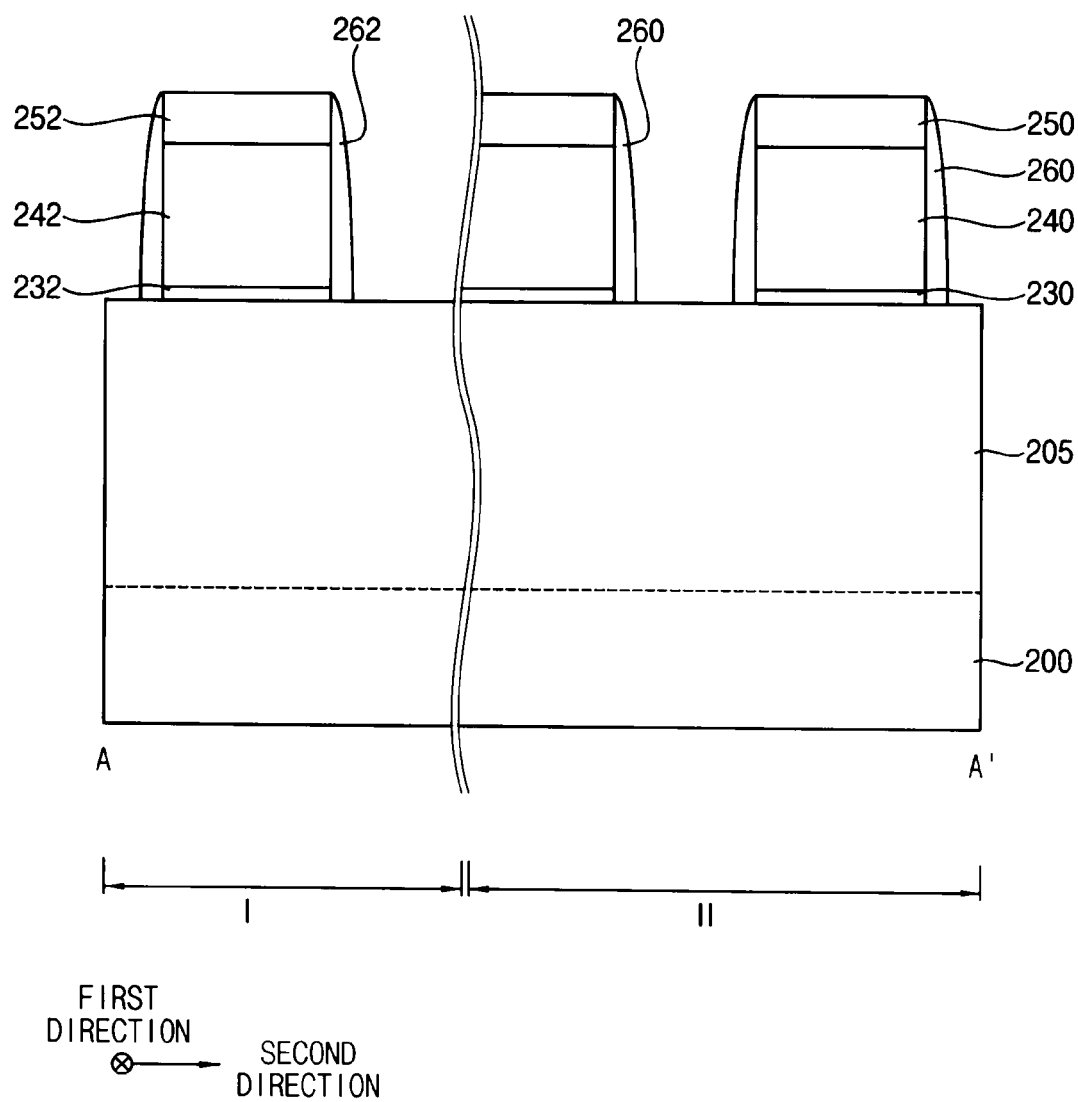
Figure 36:
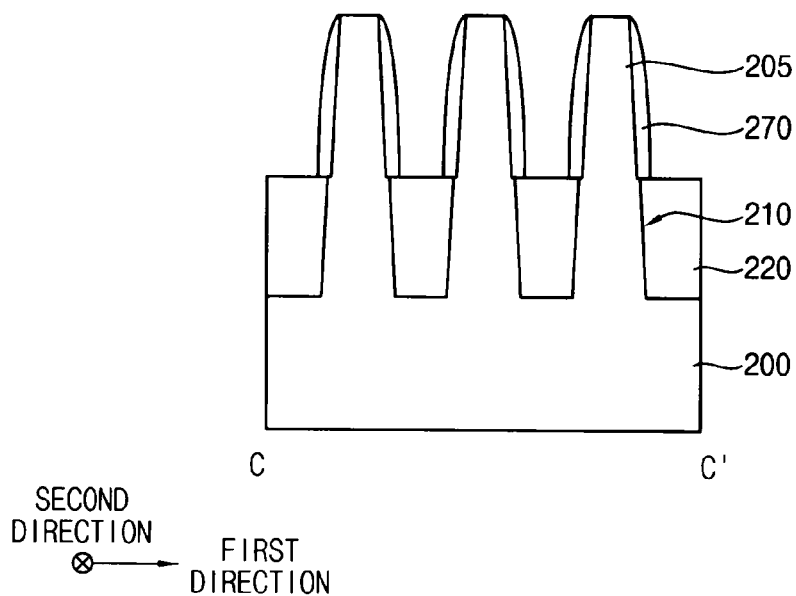

Referring to FIGS. 34 to 36, first and second gate spacers 260 and 262 and a spacer 270 may be formed on sidewalls of the first and second dummy gate structures and a sidewall of the active fin 205, respectively.

In example embodiments, the first and second gate spacers 260 and 262 may be formed by forming a spacer layer on the dummy gate structures, the active fin 205 and the isolation layer 220, and anisotropically etching the spacer layer. The spacer layer may be formed to include a nitride, e.g., silicon nitride, silicon oxynitride, etc.

In example embodiments, the first gate spacer 260 may be formed on both sidewalls of the first dummy gate structure in the second direction, and the second gate spacer 262 may be formed on both sidewalls of the second dummy gate structure in the second direction. Additionally, the spacer 270 may be formed on both sidewalls of each of the active fins 205 in the first direction.

Figure 37:
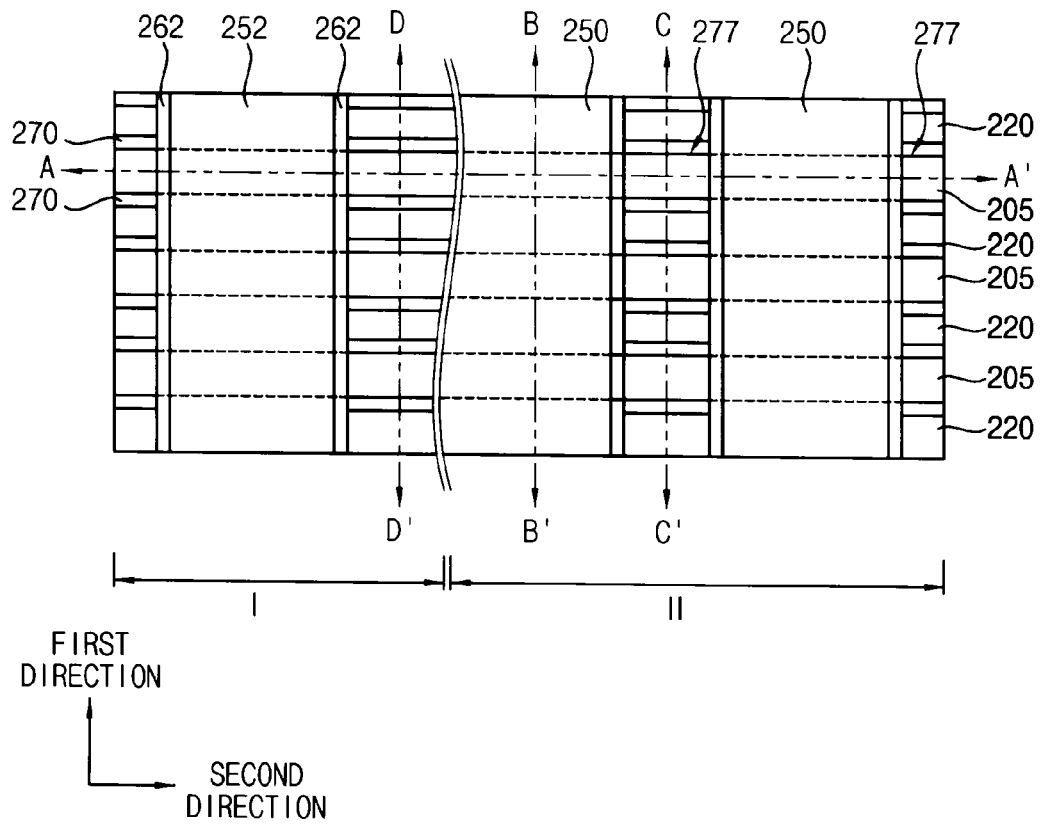
Figure 38:
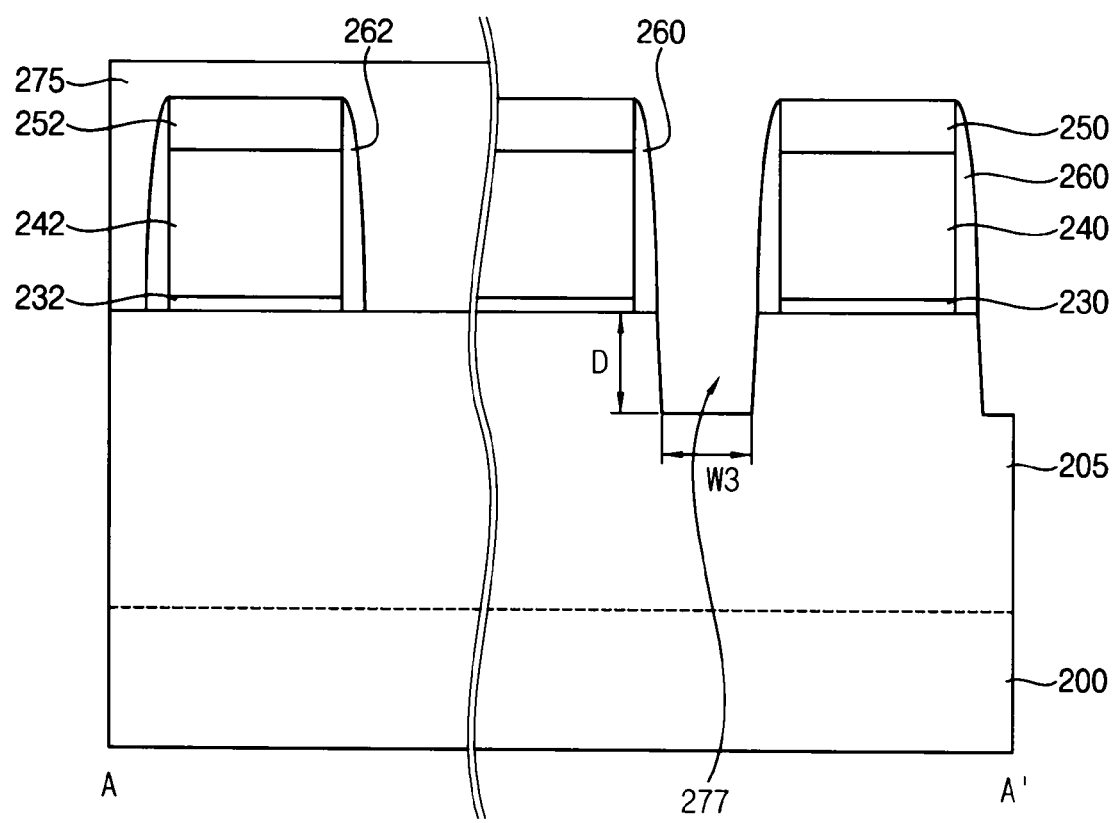
Figure 39:
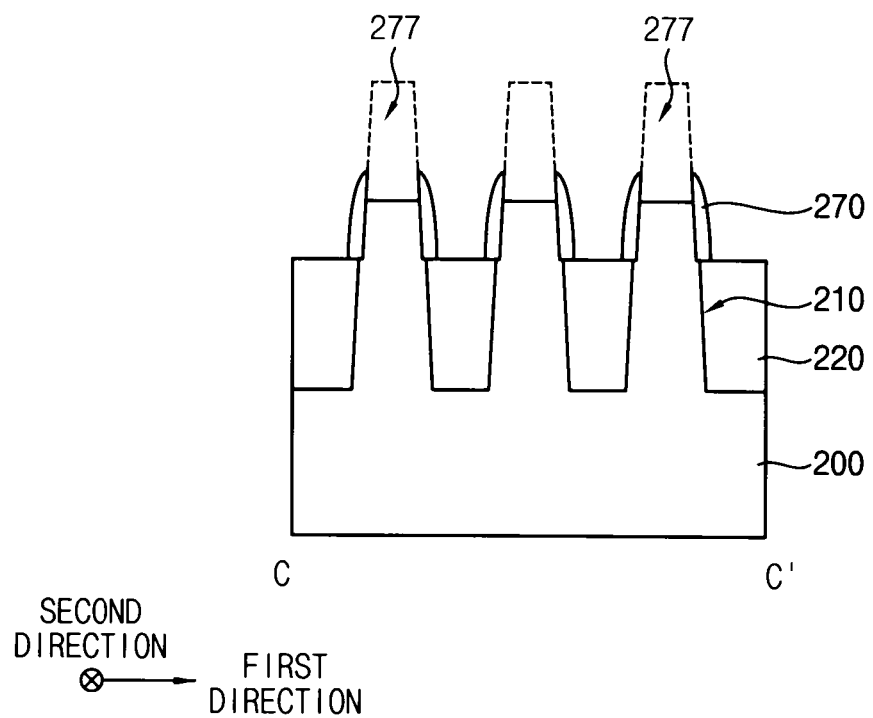

Referring to FIGS. 37 to 39, an upper portion of the active fin 205 of the substrate 200 may be partially etched using a first blocking layer 275, the first dummy gate structures and the gate spacer 260 as an etching mask to form a second trench 277 which may also be referred to as a second depression, in the second region (II).

The first blocking layer 275 may be formed to entirely cover the first region (I) of the substrate 200. In example embodiments, the first blocking layer 275 may protect the second gate structures and the active fins arranged in the first region (I) during an etch process which will be described later.

Then, an etch process may be performed on the second region (II). By the etch process, an upper portion of the spacer 270 may be partially removed, so that a top surface of the etched spacer 270 may be lower than the top surface of the initial active fin 205. Hereinafter, a space defined by an upper surface of the active fin 205 etched by the etch process and both inner surfaces of the initial spacers 270 before performing the etch process may be referred to as a second trench 277. Here, the second trench 277 may have a depth (D) into the substrate 200, and have a width (W3) in the second direction.

Figure 40:
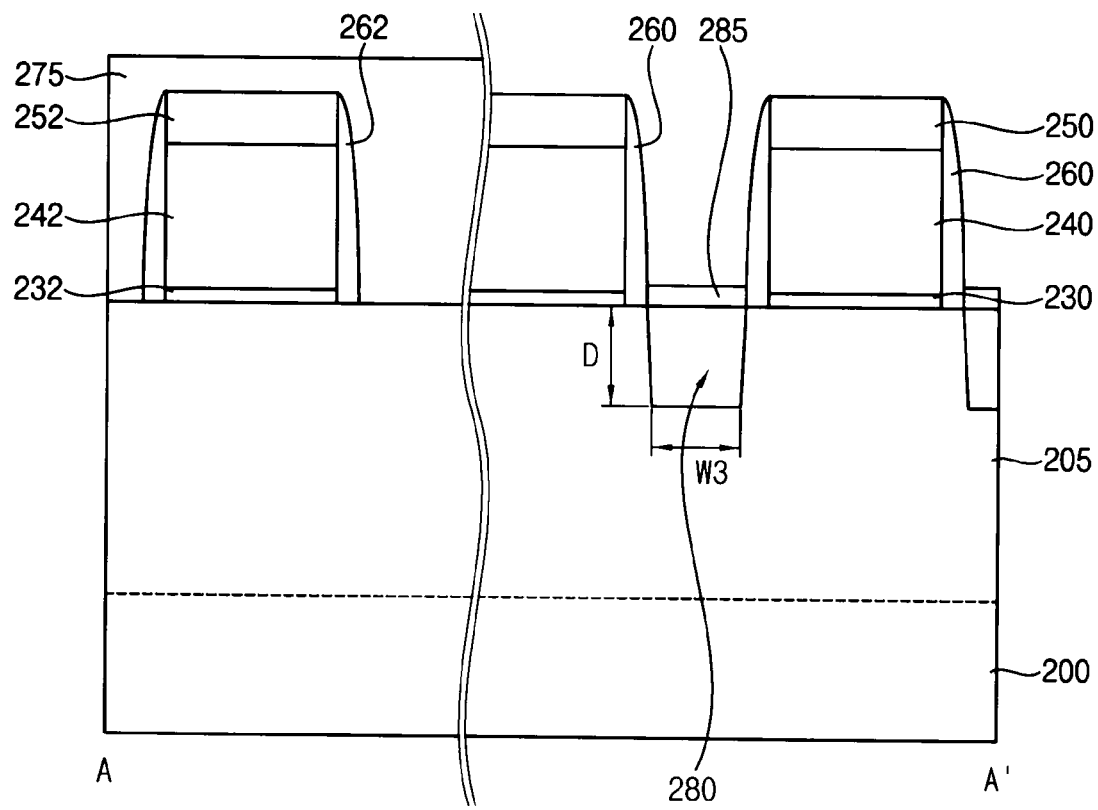
Figure 41:
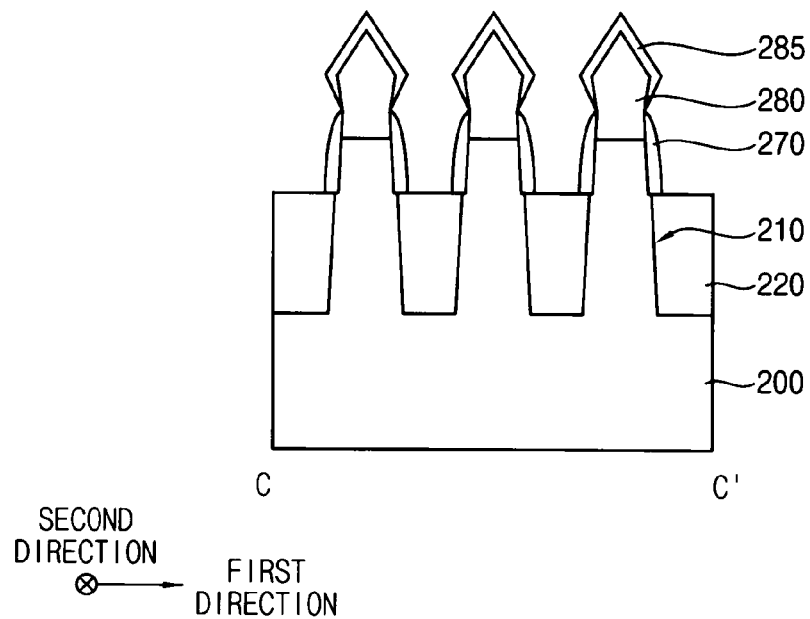
Figure 42:
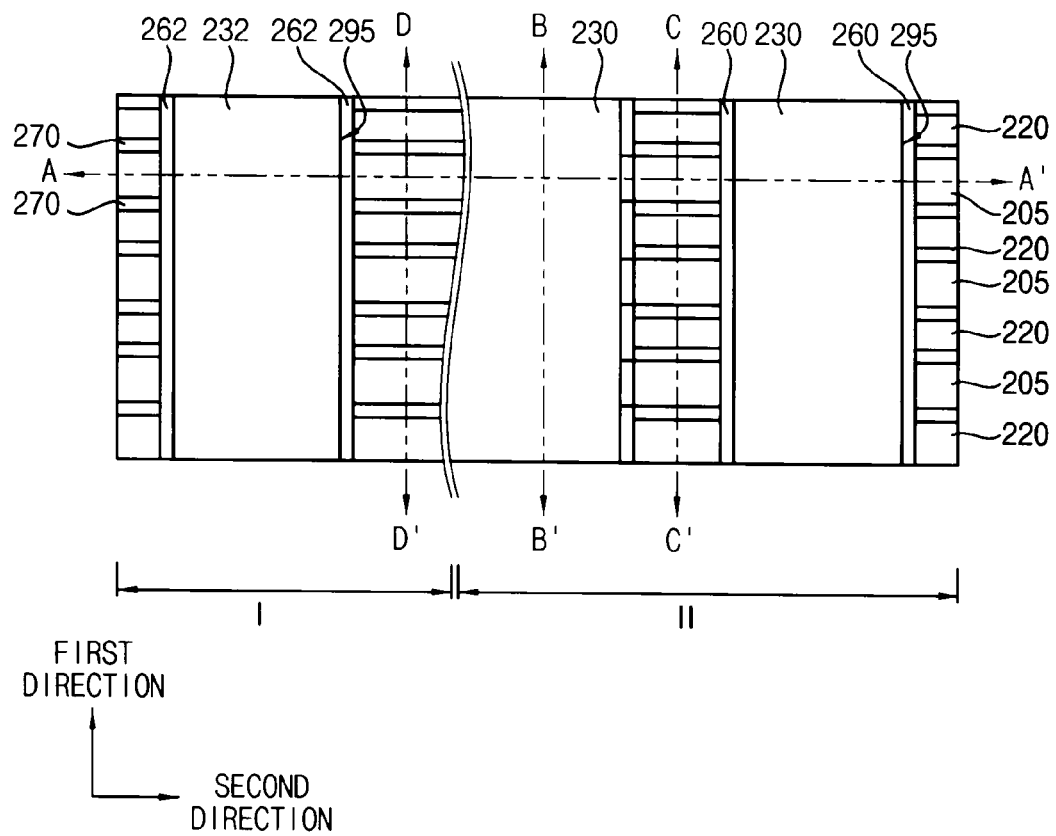
Figure 43:
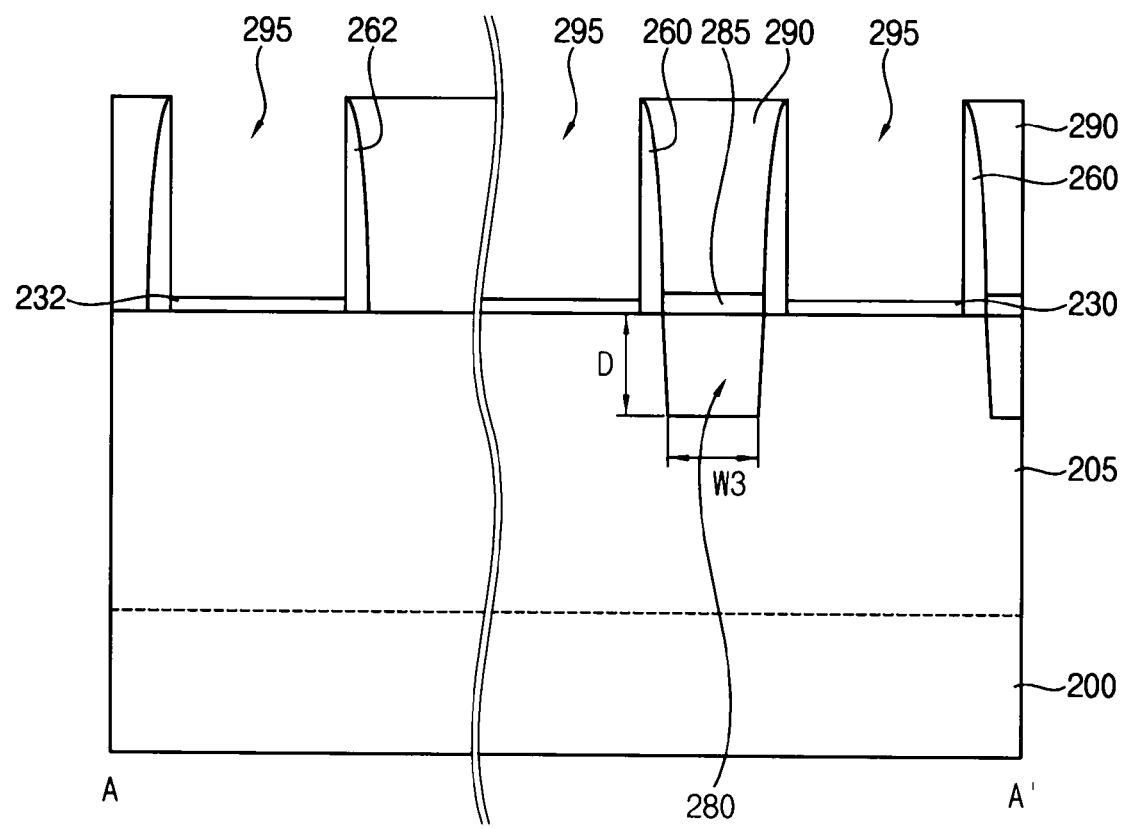
Figure 44:
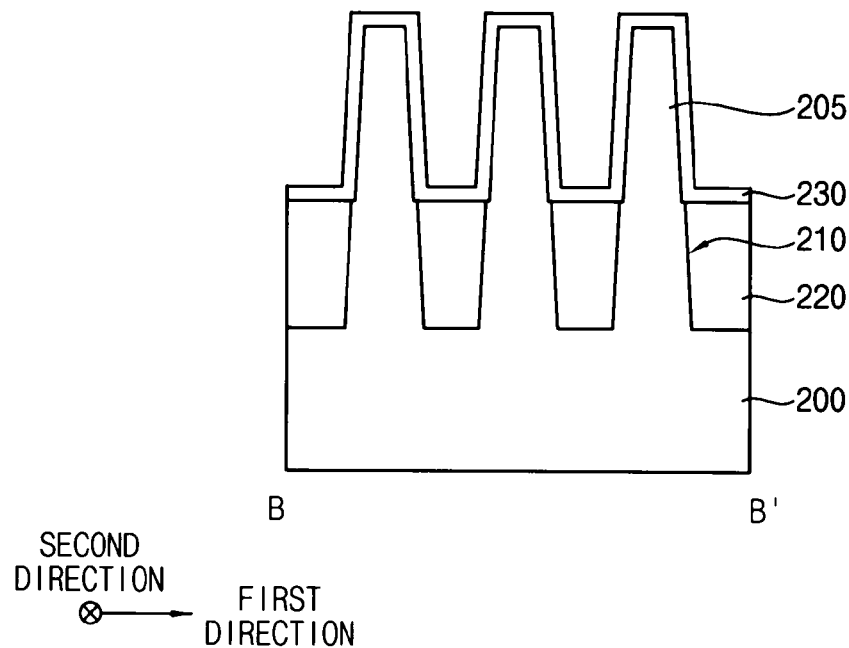
Figure 45:
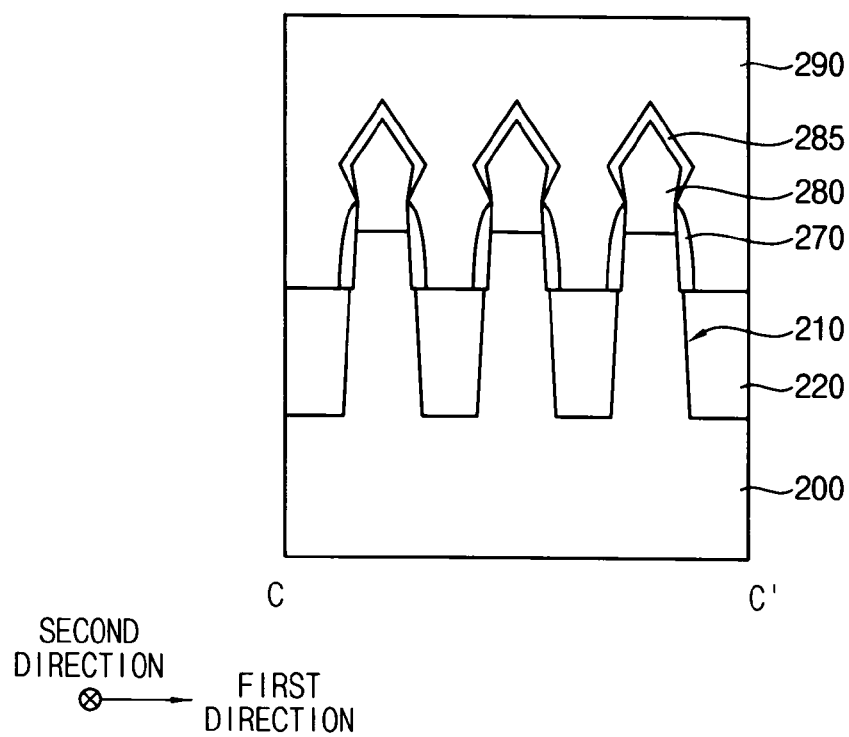

Referring to FIGS. 40 and 41, a first semiconductor pattern 280 may be formed on the active fin 205 to fill the second trench 277, and a second semiconductor pattern 285 may be formed on the second semiconductor pattern 285.

In example embodiments, the first semiconductor pattern 280 may be formed using silicon-germanium (SiGe), and the second semiconductor pattern 285 may be formed using silicon.

For example, the first semiconductor pattern 280 may be formed by a first selective epitaxial growth (SEG) process using the upper surface of the active fin 205 exposed by the second trench 277 as a seed. For example, the substrate 200 including the resulting structures may be loaded into a process chamber (not illustrated), and then, a silicon source gas, a germanium source gas and a carrier gas may be suppled into the process chamber to perform the first SEG process. Then, a silicon source gas and a carrier gas may be sequentially supplied into the process chamber to perform a second SEG process such that the second semiconductor pattern 285 may be formed on the first semiconductor pattern 280.

The first and second SEG processes may be performed using the silicon source gas, e.g., disilane ($Si_2H_6$) gas, the germanium source gas, e.g., germane ($GeH_4$) gas and the carrier gas, e.g., hydrogen ($H_2$) gas, to form the single crystalline first and second semiconductor patterns 280 and 285. Here, a p-type impurity source gas, e.g., diborane ($B_2H_6$) gas may be also used for the first and second SEG processes.

In example embodiments, flow rates of the gases used for the first SEG process may be controlled such that germanium concentrations in the first semiconductor pattern 280 may be adjusted to vary along a depth. Thus, a lattice mismatch between the first semiconductor pattern 280 and the substrate 200 may be reduced.

In example embodiments, as illustrated in FIG. 41, an upper portion of the first semiconductor pattern 280 may have a polygonal shape according to a crystal growth direction. In the first SEG process, an additional etch process may be performed repeatedly such that the upper portion of the first semiconductor pattern 280 may have an oval shape.

Referring to FIGS. 42 to 45, a first insulation interlayer 290 may be formed to a predetermined height to cover the first and second dummy gate structures, the first and second gate spacers 260 and 262, the second semiconductor pattern 285, the spacer 270 and the isolation layer 220, and then, the first insulation interlayer 290 may be planarized until top surfaces of the dummy gate electrodes 240 and 242 of the first and second dummy gate structures are exposed. Here, the first and second gate masks 250 and 252 of the dummy gate structures and upper portions of the first and second gate spacers 260 and 262 may be also removed. In example embodiments, the planarization process may be performed by a chemical mechanical polishing (CMP) process and/or by an etch-back process.

Then, the exposed first and second dummy gate electrodes 240 and the 242 may be removed to form openings 295 exposing top surfaces of the first and second gate insulation layer patterns 230 and 232.

In example embodiments, a dry etch process may be performed firstly and a wet etch process may be performed secondly to sufficiently remove the exposed first and second dummy gate electrodes 240 and 242. The wet etch process may be performed using hydrogen fluoride (HF) as an etching solution.

Figure 46:
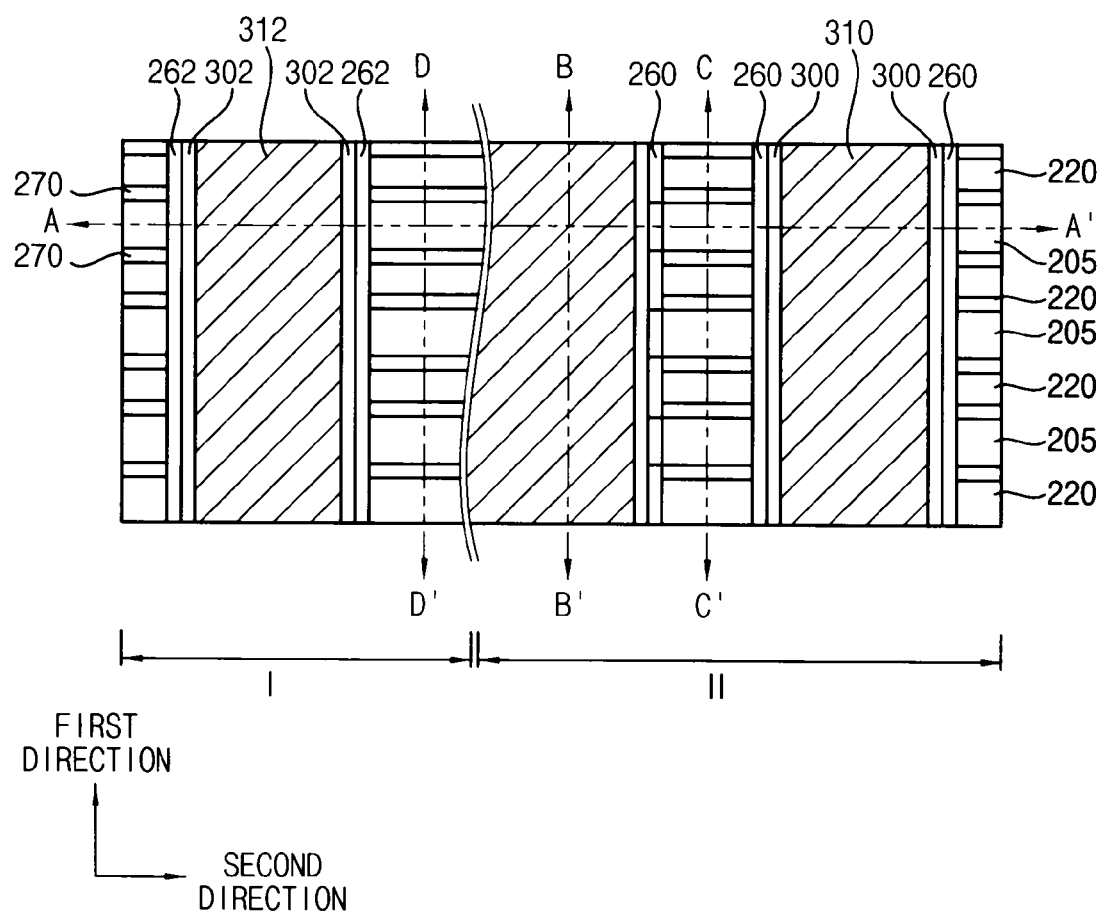
Figure 47:
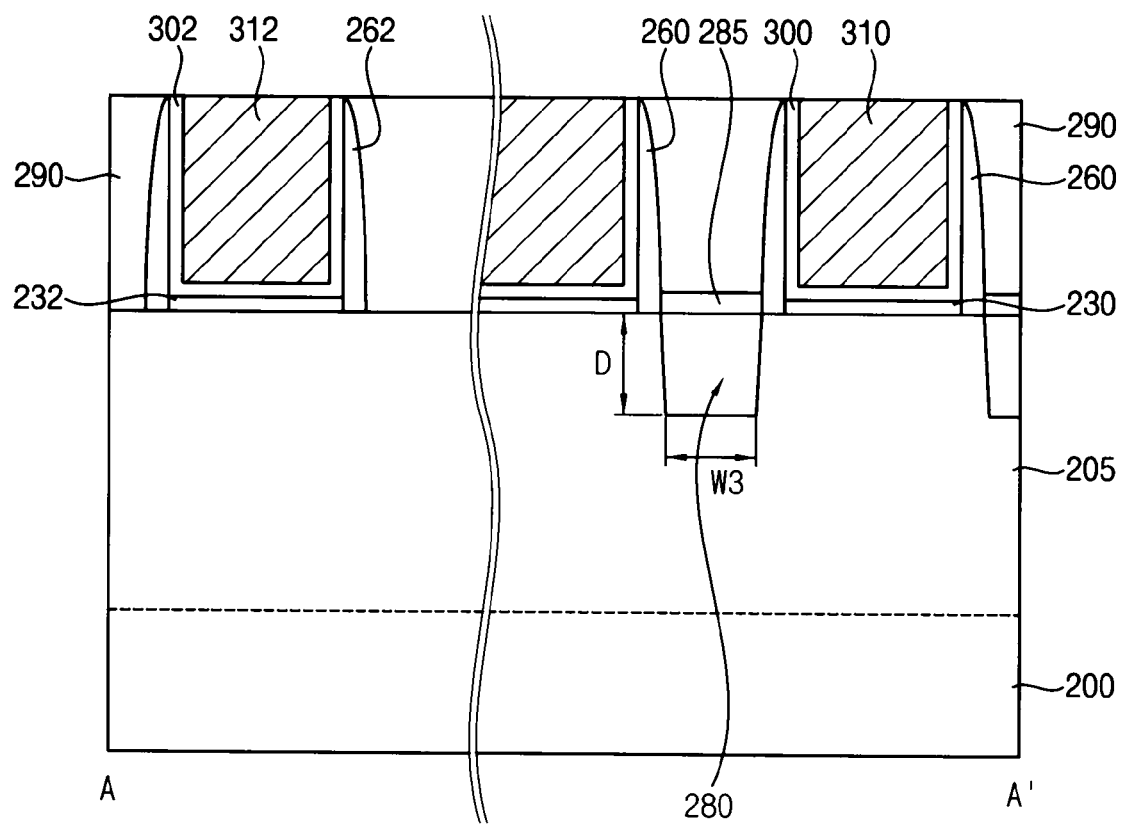
Figure 48:
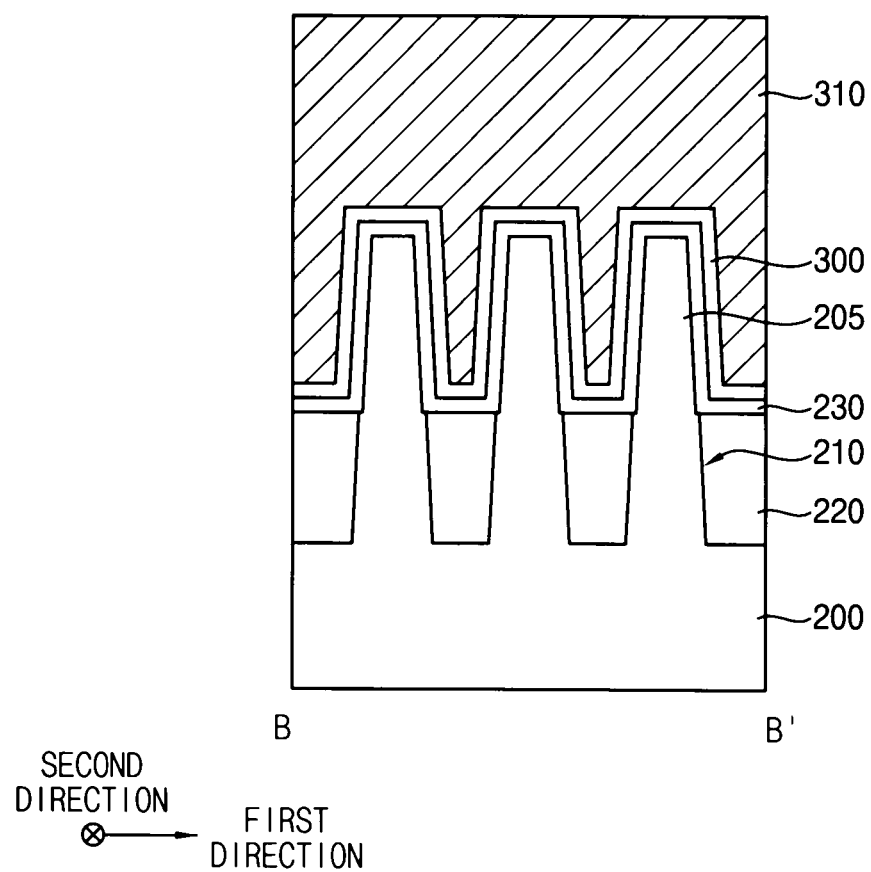

Referring to FIGS. 46 to 48, high-k dielectric layer patterns 300 and 302 and gate electrodes 310 and 312 may be formed to fill the openings 295 respectively.

For example, a high-k dielectric layer may be formed on the exposed top surfaces of the first and second gate insulation layer patterns 230 and 232, sidewalls of the openings 295 and the upper surface of the first insulation interlayer 290, and a gate electrode layer may be formed on the high-k dielectric layer to sufficiently fill a remaining portion of the openings 295.

The high-k dielectric layer may be formed to include a metal oxide, e.g., hafnium oxide ($HfO_2$), tantalum oxide ($Ta_2O_5$), zirconium oxide ($ZrO_2$), or the like. The gate electrode layer may be formed to include a material having a low resistance, e.g., a metal such as aluminum (Al), copper (Cu), tantalum (Ta), etc., or a metal nitride thereof by an ALD process, a physical vapor deposition (PVD) process, or the like. Then, a heat treatment process, e.g., a rapid thermal annealing (RTA) process, a spike rapid thermal annealing (spike RTA) process, a flash rapid thermal annealing (flash RTA) process or a laser annealing process may be further performed on the gate electrode layer. Alternatively, the gate electrode layer may be formed to include doped polysilicon.

Then, the gate electrode layer and the high-k dielectric layer may be planarized until the top surface of the first insulating interlayer 290 may be exposed to form the high-k dielectric layer patterns 300 and 302 on the top surfaces of the gate insulation layer pattern 230 and 232 and the sidewalls of the openings 295, and the gate electrodes 310 and 312 may be formed on the high-k dielectric layer patterns 300 and 302 to fill the remaining portion of the openings 295. Accordingly, a bottom surface and a sidewall of the gate electrode 300, 302 may be covered by the high-k dielectric layer pattern 300, 302. In example embodiments, the planarization process may be performed by a CMP process and/or an etch-back process.

In example embodiments, the first gate insulation layer pattern 230, the first high-k dielectric layer pattern 300 and the first gate electrode 310 may form a first gate structure in the second region (II), and the first gate structure may form a PMOS transistor. Here, a source region and a drain region of the PMOS transistor may be the first semiconductor pattern 280 including silicon-germanium (SiGe).

The second gate insulation layer pattern 232, the second high-k dielectric layer pattern 302 and the second gate electrode 312 may form a second gate structure in the first region (I), and the second gate structure may form an NMOS transistor. Here, a source region and a drain region of the NMOS transistor may be the upper portion of the active fin 205 including silicon (Si).

In example embodiments, the first high-k dielectric layer pattern 300 and the second high-k dielectric layer pattern 302 may be formed at the same time to include the same material, as described with reference to FIGS. 42 to 48. Additionally, the first gate electrode 310 and the second gate electrode 312 may be formed at the same time to include the same material, as described with reference to FIGS. 42 to 48. However, it may not be limited thereto. For example, the first high-k dielectric layer pattern 300 and the second high-k dielectric layer pattern 302 may be formed using different materials by different processes, respectively.

Figure 49:
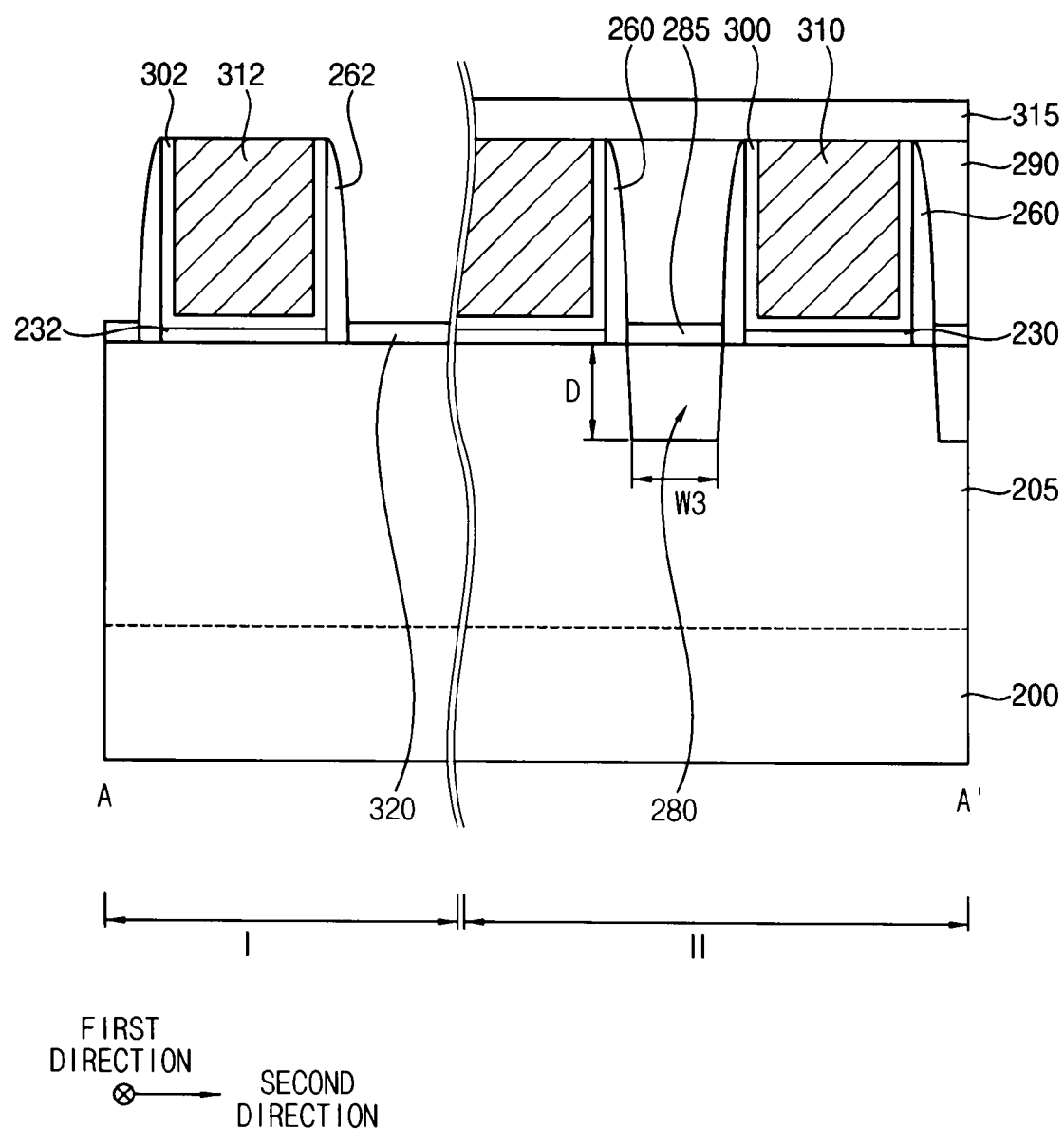
Figure 50:
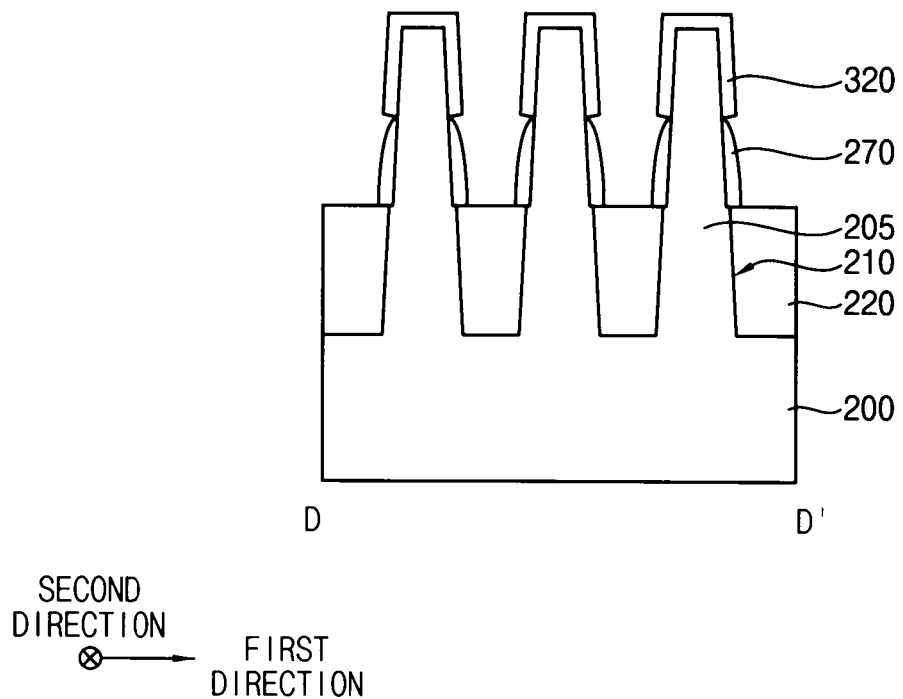

Referring to FIGS. 49 and 50, a third semiconductor pattern 320 may be formed on the active fin 205 in the first region (I) to expose the second gate structures.

A second blocking layer 315 may be formed to entirely cover the first gate structure and the first insulation layer 290 in the second region (II) of the substrate 100, and then, the first insulation layer 290 in the first region (I) may be removed to expose the active fin 205. Here, an etch process may be additionally performed to partially remove an upper portion of the spacer 270 in the first region (I) such that the upper portion of the active fin 205 is exposed by the etched spacer 270. By the etch process, a top surface of the etched spacer 270 in the first region (I) may be substantially coplanar with or higher than the top surface of the active fin 205 in the second region (II). The etch process may be omitted for simplicity.

Then, the third semiconductor pattern 320 may be formed on the exposed surface of the active fin 205. In example embodiments, the third semiconductor pattern 320 may be formed using germanium.

For example, the third semiconductor pattern 320 may be formed by a third SEG process using the upper surface and sidewalls of the active fin 205 exposed by the first gate structure, the second gate spacer 262 and the spacer 270 as a seed. For example, the substrate 200 including the resulting structures may be loaded into a process chamber (not illustrated), and then, a silicon source gas, a germanium source gas and a carrier gas may be suppled into the process chamber to perform the third SEG process.

Then, the second blocking layer 315 and the first insulation interlayer 290 may be removed by an etch process.

Figure 51:
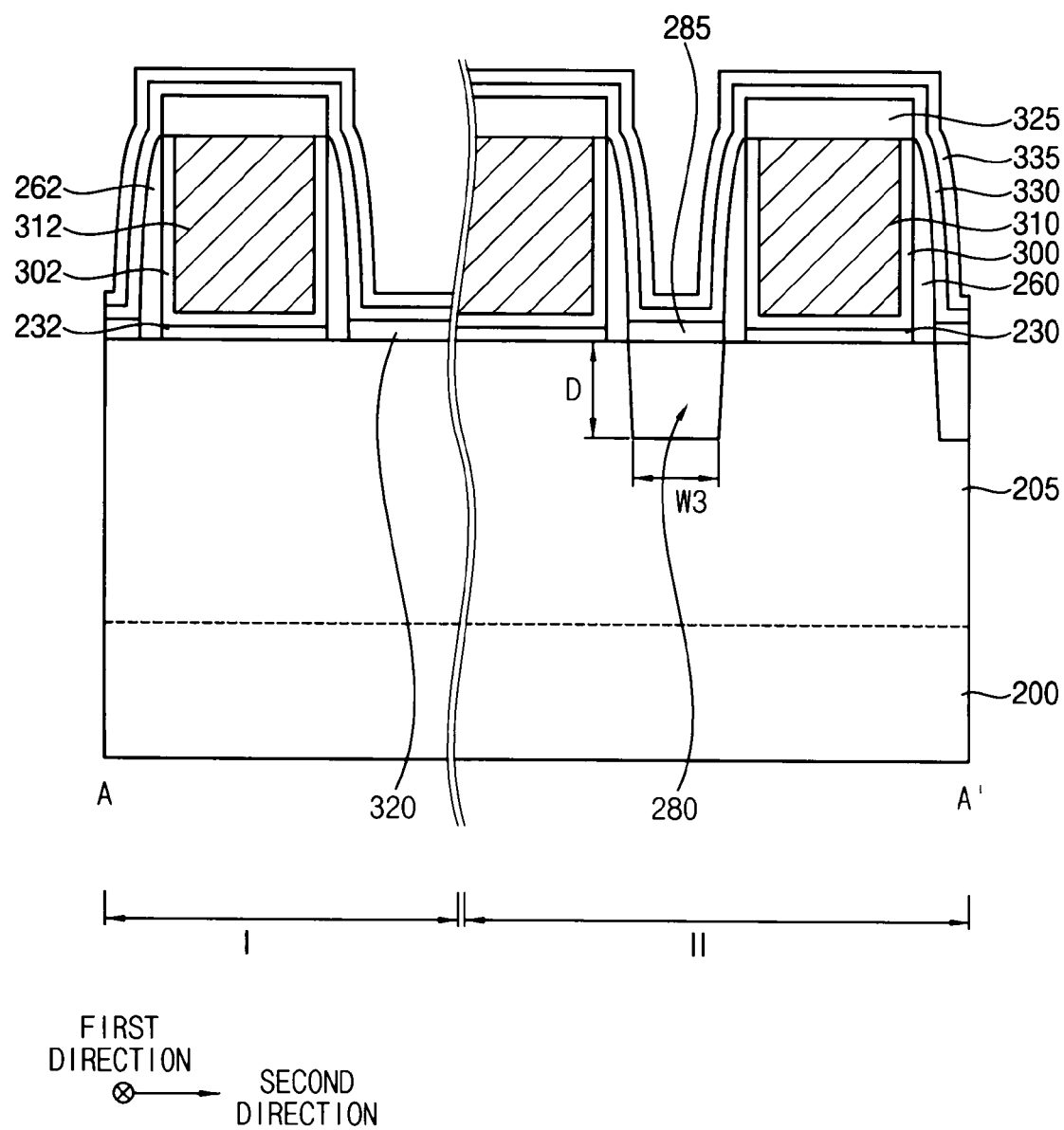
Figure 52:
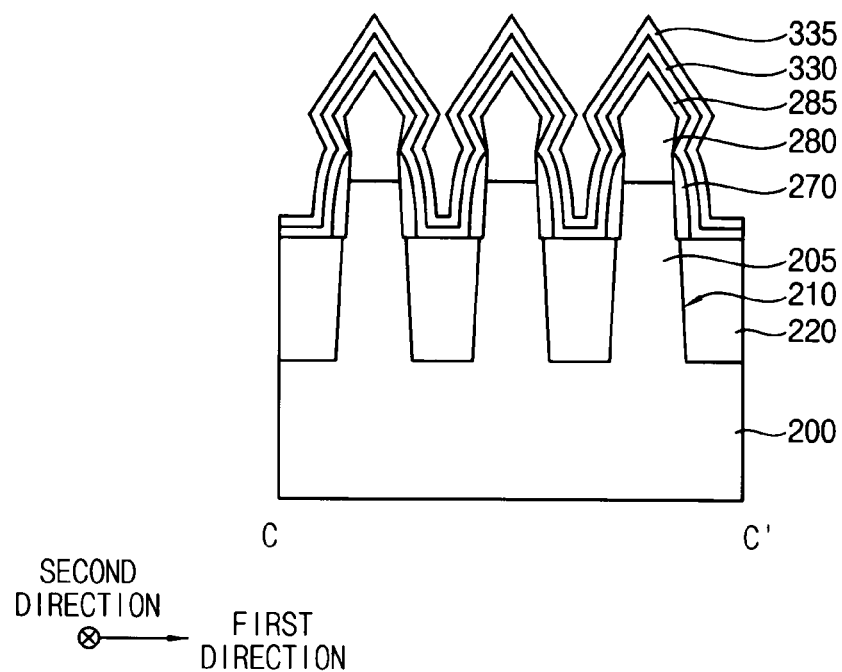
Figure 53:
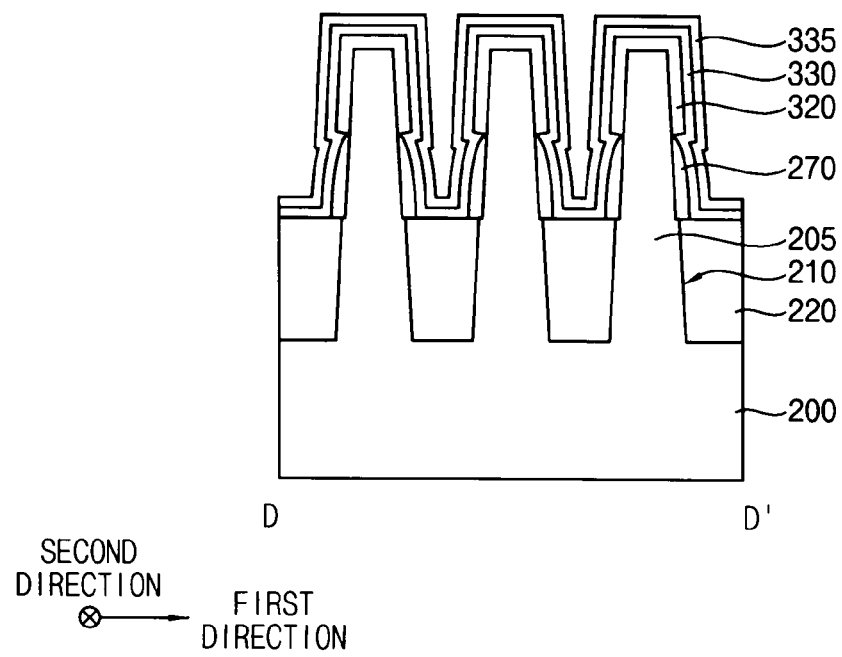

Referring to FIGS. 51 to 53, a first metal layer 330 and a protection layer 335 may be formed.

First, a first insulation layer may be formed and then partially removed to form a first insulation layer pattern 325 covering the high-k dielectric layer patterns 300 and 302 and the gate electrodes 310 and 312.

Then, by performing deposition processes, the first metal layer 330 and the protection layer 335 having uniform thicknesses may be sequentially formed. The first metal layer 330 may be formed conformally on an upper surface and a sidewall of the first insulation layer pattern 325, an upper surface of the second semiconductor pattern 285, an upper surface and a sidewall of the third semiconductor pattern 320, the sidewall of the spacer 270 and the upper surface of the isolation layer 220.

The first metal layer 330 and the protection layer 335 may be formed by a physical vapor deposition (PVD) process, a chemical vapor deposition (CVD) process, an atomic layer deposition (ALD) process, or the like. When the CVD process or the ALD process is performed, a layer having a uniform thickness may be formed on a surface of a complicated profile.

In example embodiments, the first metal layer 330 may be formed using titanium, cobalt, nickel, platinum or an alloy thereof, and the protection layer 335 may be formed using a metal nitride. For example, the first metal layer 330 may be formed using nickel, and the protection layer 335 may be formed using titanium nitride (TiN).

The thickness of the first metal layer 330 may be determined in consideration of the thickness of the third semiconductor pattern 320. The thickness of the first metal layer 330 may be less than about 50% of the thickness of the third semiconductor pattern 320. For example, the thickness of the first metal layer 330 may be less than about 40% of the thickness of the third semiconductor pattern 320. When the thickness of the first metal layer 330 is greater than about 50% of the thickness of the third semiconductor pattern 320, during a heat treatment process as described later with reference to FIGS. 54 to 56 metal atoms included in the first metal layer 330 may penetrate the third semiconductor pattern 320 and diffuse to the upper portion of the active fin 205. When the thickness of the first metal layer 330 is less than about the 50% of the thickness of the third semiconductor pattern 320, the upper portion of the active fin 205 may be prevented from being contaminated by the metal of the first metal layer 330.

During various processes including the heat treatment process as described later with reference to FIGS. 54 to 56 the protection layer 335 may prevent the first metal layer 330 or other elements from being oxidized or damaged to deteriorate.

Figure 54:
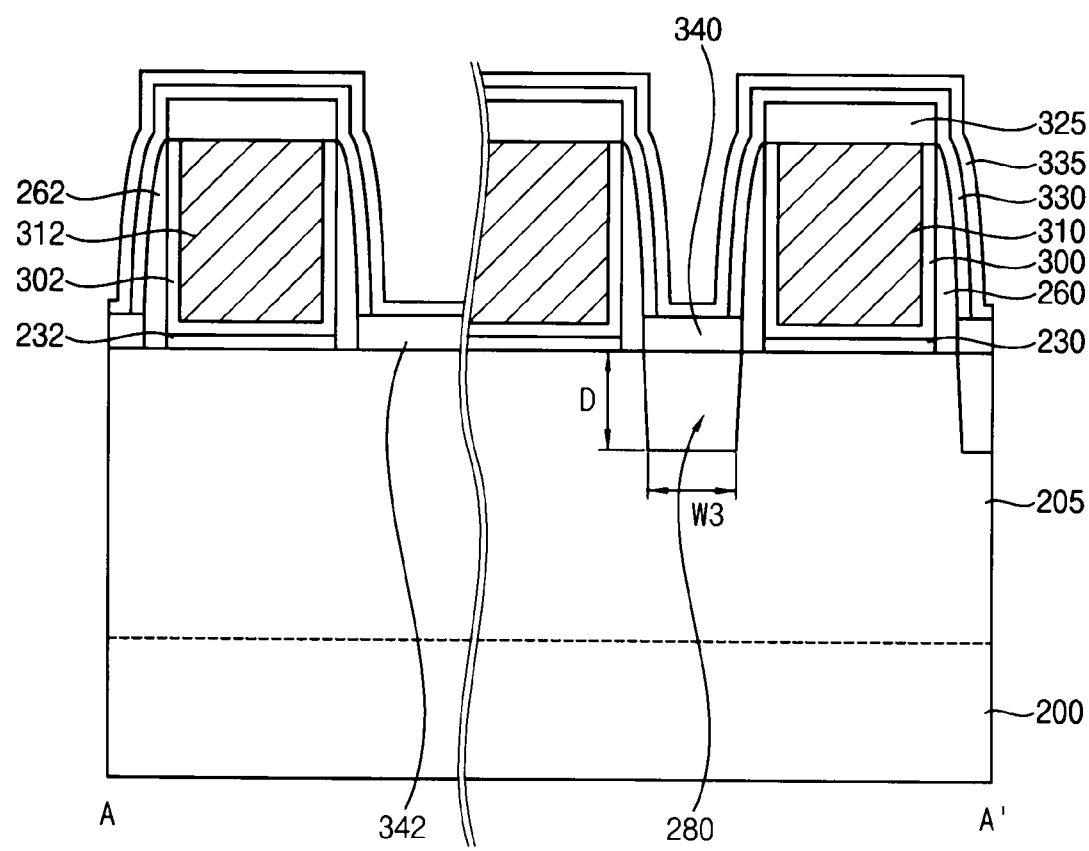
Figure 55:
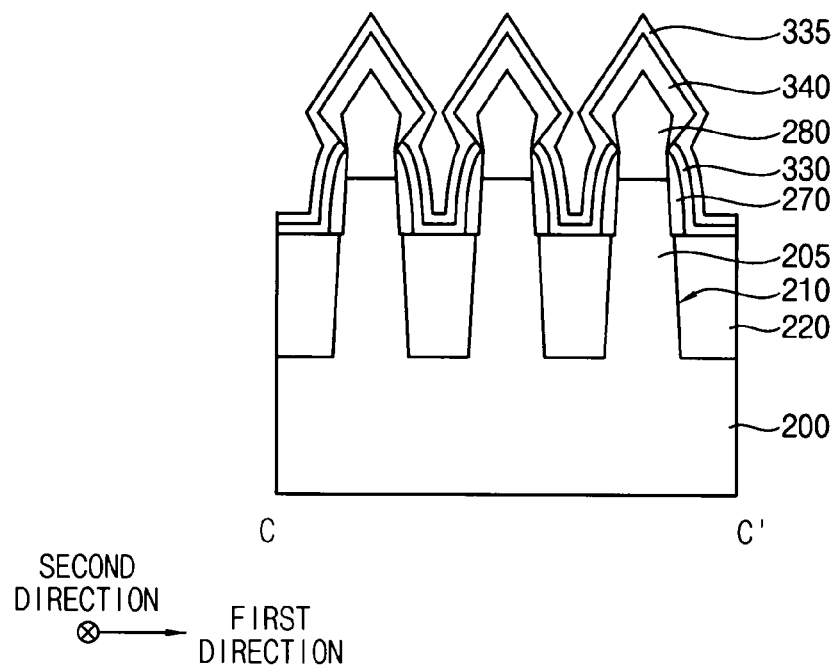
Figure 56:
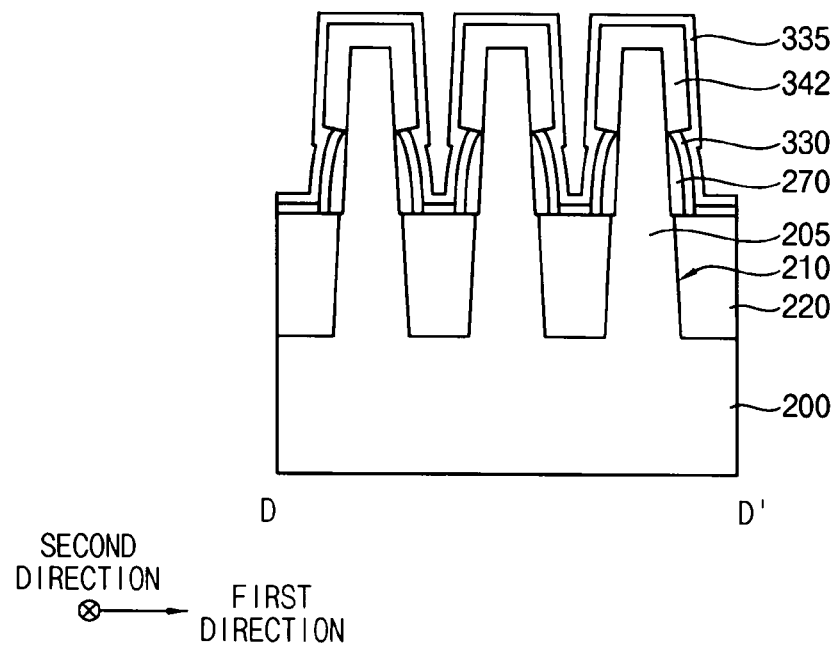

Referring to FIGS. 54 to 56, a heat treatment process may be performed to form a first metal-semiconductor composite pattern 340 and a second metal-semiconductor composite pattern 342.

For example, the substrate 200 having the resulting structures may be loaded into a process chamber (not illustrated), an inert gas such as argon, neon, etc., or a nitrogen gas may be supplied into the process chamber, and the process chamber may be heated to a predetermined temperature.

For example, the heat treatment process may be performed such that the substrate 200 may be heated to a temperature of at least 600° C. or more. In certain embodiments, the substrate 200 may be heated to a temperature of from 800° C. to 900° C.

In the heat treatment process, the metal atoms included in the first metal layer 330 may be diffused to the second semiconductor pattern 285 and the third semiconductor pattern 320. Thus, the second semiconductor pattern 285 and the first metal layer 330 may react with each other to form the first metal-semiconductor composite pattern 340, and the third semiconductor pattern 320 and the first metal layer 330 may react with each other to form the second metal-semiconductor composite pattern 342. Since the thickness of the first metal layer 330 is less than about 50% of the thickness of the third semiconductor pattern 320, the first metal layer 330 on the second and third semiconductor patterns 285 and 320 may be consumed during the heat treatment process so that the first metal layer 330 on the semiconductor patterns 285 and 320 does not remain after performing the heat treatment process.

For example, in case that the first metal layer 330 includes nickel, the first metal-semiconductor composite pattern 340 may include nickel-silicon composite (NiSi), and the second metal-semiconductor composite pattern 342 may include nickel-germanium composite (NiGe).

The first metal-semiconductor composite pattern 340 may serve as a source/drain region of the PMOS transistor and make contact with the first pattern 280 including silicon-germanium (SiGe). When the first metal-semiconductor composite pattern 340 includes nickel-silicon composite (NiSi), schottky barrier height in the interface with the first semiconductor pattern 280 including silicon-germanium (SiGe) may be decreased to reduce the contact resistance. For example, the first metal-semiconductor composite pattern 340 may reduce the contact resistance between the source/drain region of the PMOS transistor and a contact 360 which will be described later.

Figure 57:
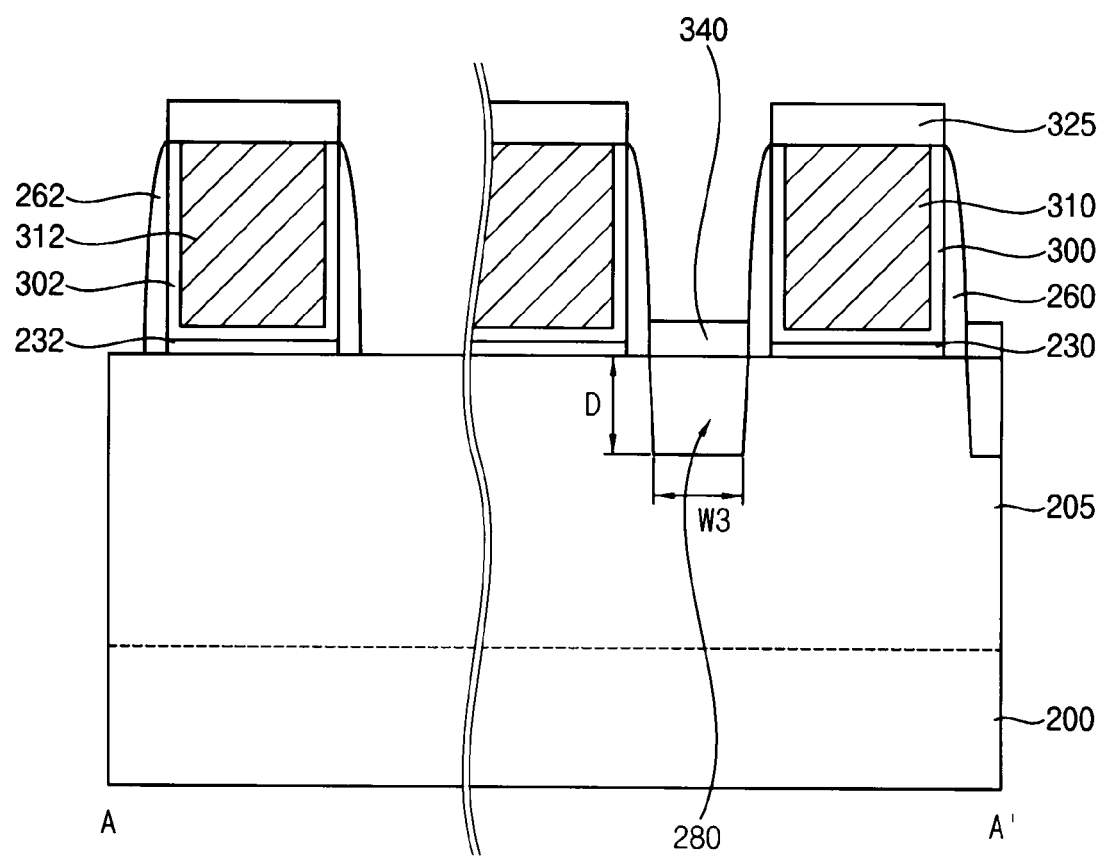
Figure 58:
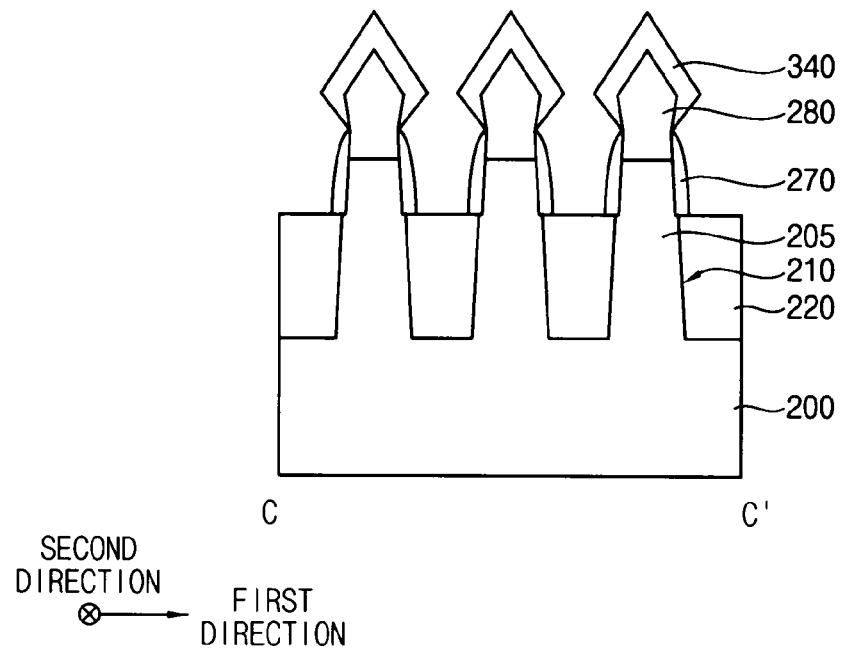
Figure 59:
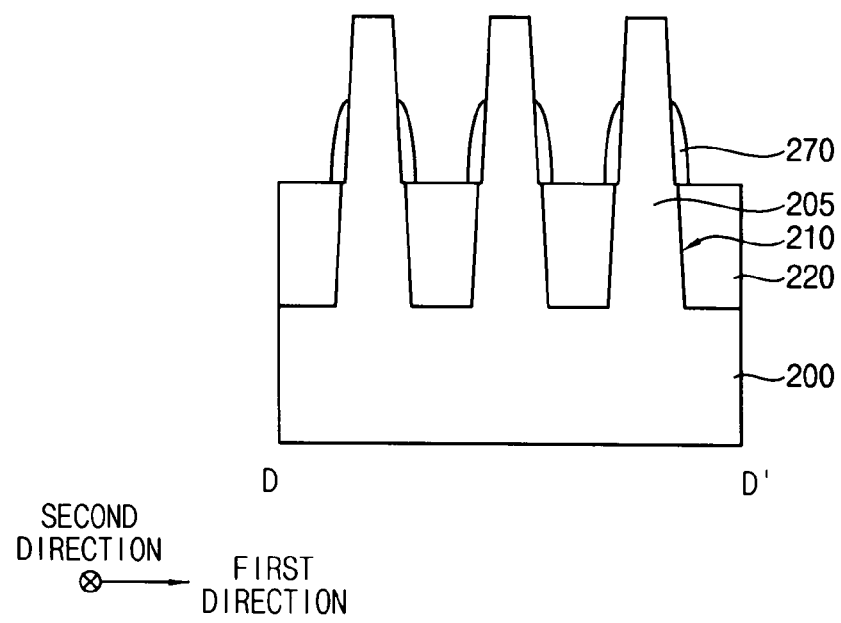

Referring to FIGS. 57 to 59, the second metal-semiconductor composite pattern 342, the first metal layer 330 and the protection layer 335 may be removed from the substrate 200.

A wet etch process may be performed using an etching solution to sufficiently remove the second metal-semiconductor composite pattern 342, the first metal layer 330 and the protection layer 335. In example embodiments, the etching solution may have different etch selectivities with respect to the first metal-semiconductor composite pattern 340 and the second metal-semiconductor composite pattern 342. For example, the etching solution may be a solution including sulfuric acid.

For example, when the etching solution includes sulfuric acid peroxide mixture (SPM), the etching solution may have a relatively low etching rate for nickel-silicon composite (NiSi) and have a relatively high etching rate for nickel-germanium composite (NiGe). For example, the etching solution may be used to leave the first metal-semiconductor composite pattern 340 and effectively remove the second metal-semiconductor composite pattern 342, the first metal layer 330 and the protection layer 335.

Figure 60:
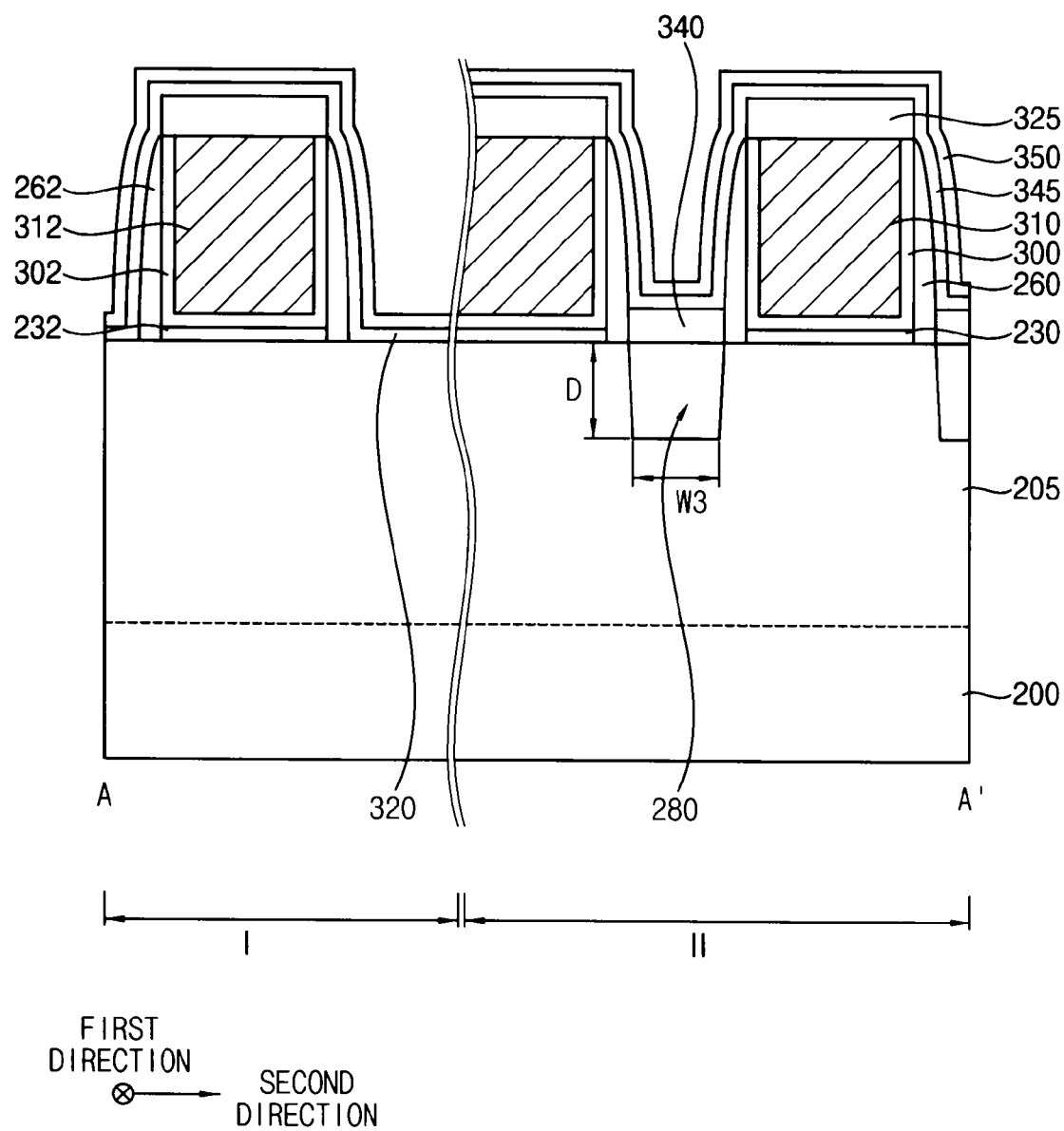
Figure 61:
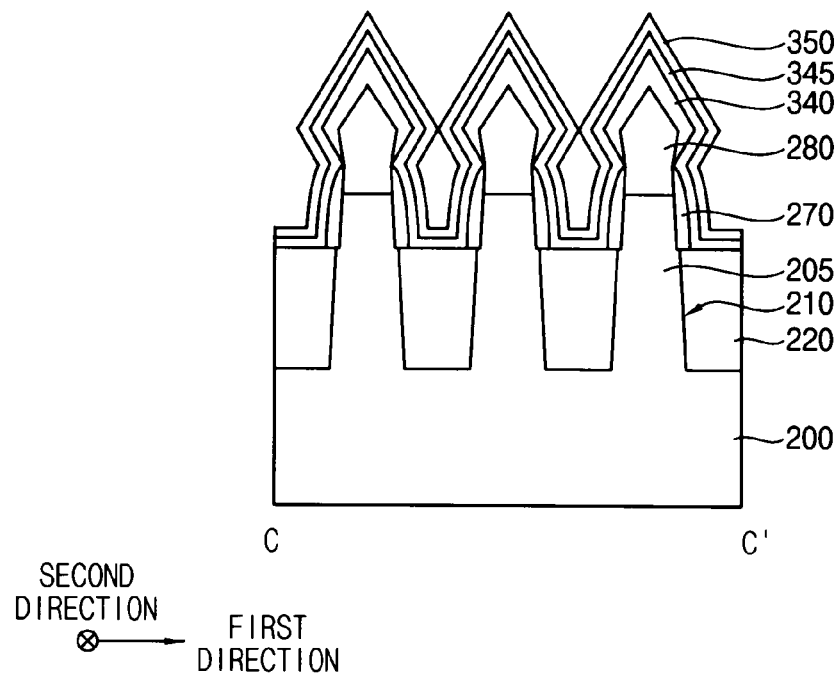
Figure 62:
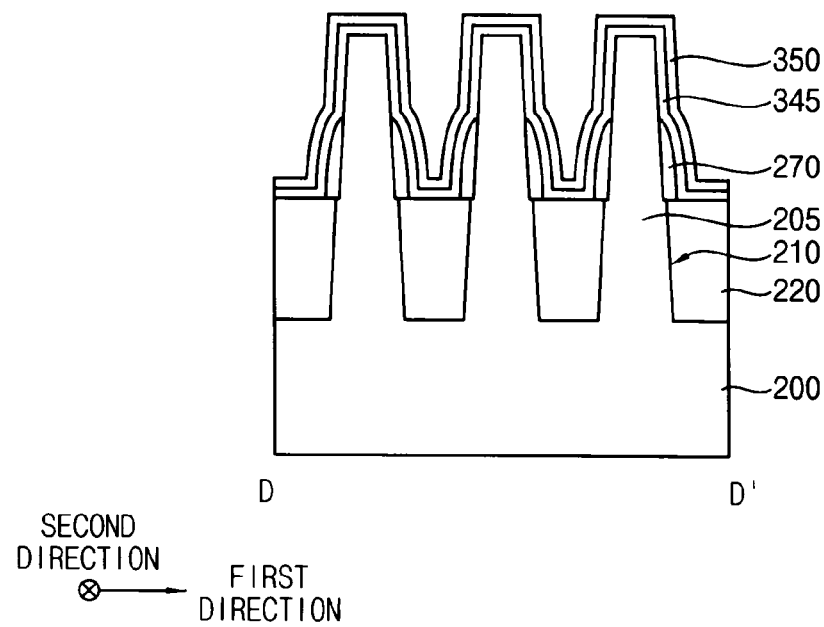

Referring to FIGS. 60 to 62, a second metal layer 345 and a barrier layer 350 may be formed.

By performing deposition processes, the second metal layer 345 and the barrier layer 350 having uniform thicknesses may be sequentially formed. The second metal layer 345 may be formed conformally on the upper surface and the sidewall of the first insulation layer pattern 325, the upper surface and the sidewall of the first metal-semiconductor composite pattern 340, the sidewall of the spacer 270, the upper surface and the sidewall of the active fin 205 exposed by the spacer 270 and the isolation layer 220.

The second metal layer 245 and the barrier layer 350 may be formed by a physical vapor deposition (PVD) process, a chemical vapor deposition (CVD) process, an atomic layer deposition (ALD) process, or the like. When the CVD process or the ALD process is performed, a layer having a uniform thickness may be formed on a surface of a complicated profile.

In example embodiments, the second metal layer 345 may be formed using titanium, cobalt, nickel, platinum or an alloy thereof, and the barrier layer 350 may be formed using a metal nitride. For example, the second metal layer 345 may be formed using nickel, and the barrier layer 350 may be formed using titanium nitride (TiN).

During processes including the heat treatment process as described later with reference to FIGS. 63 and 64 the barrier layer 350 may prevent the second metal layer 345 or other elements from being oxidized or damaged to deteriorate. For example, the barrier layer 350 may prevent metal atoms of the contact 360 from being diffused.

Figure 63:
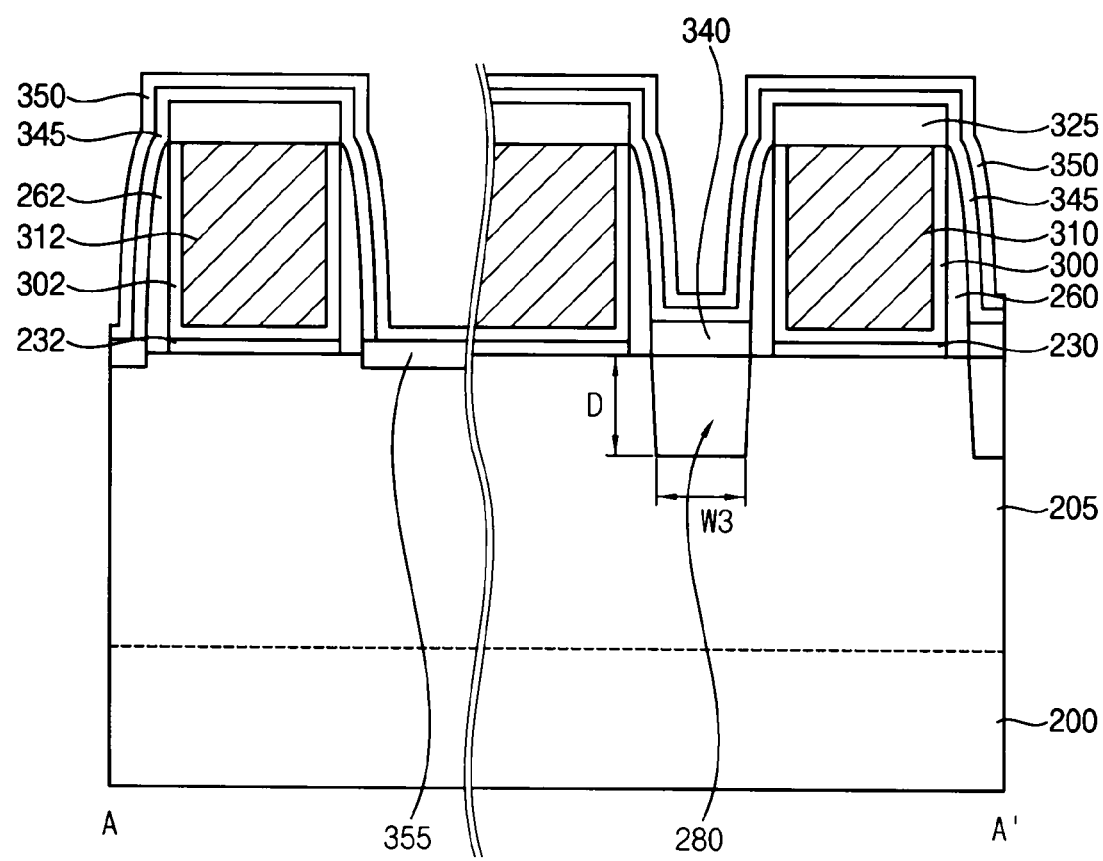
Figure 64:
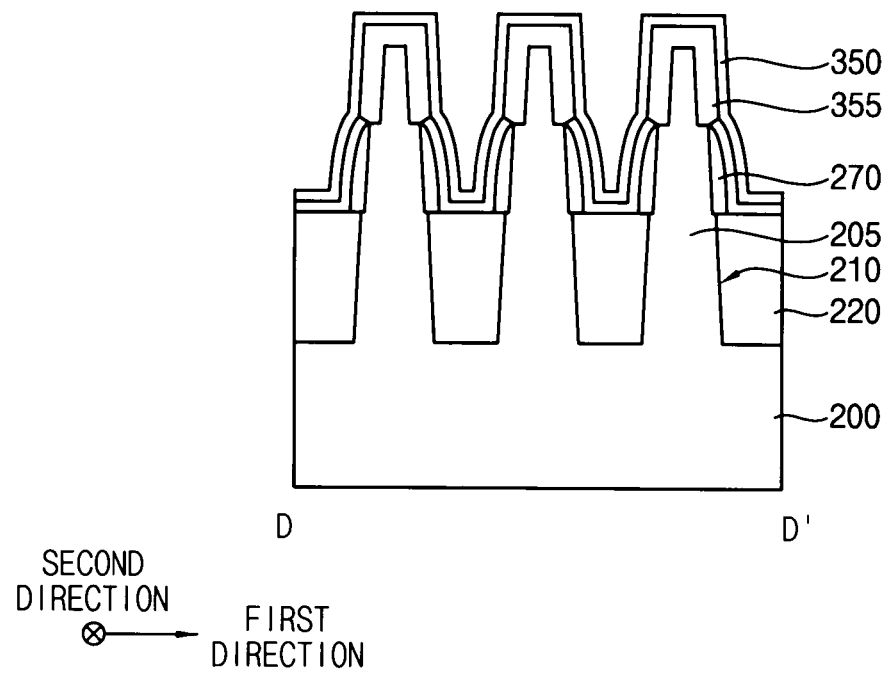

Referring to FIGS. 63 and 64, a heat treatment process may be performed to form a third metal-semiconductor composite pattern 355.

For example, the substrate 200 having the resulting structures may be loaded into a process chamber (not illustrated), an inert gas such as argon, neon, etc., or a nitrogen gas may be supplied into the process chamber, and the process chamber may be heated to a predetermined temperature.

For example, the heat treatment process may be performed such that the substrate 200 may be heated to a temperature of at least about 600° C. or more. In certain examples, the substrate 200 may be heated to a temperature of from about 800° C. to about 900° C.

In the heat treatment process, metal atoms included in the second metal layer 345 may be diffused to the surface of the active fin 205 in the first region (I). Thus, the metal layer 345 and the surface of the surface of the active fin 205 may react with each other to form the third metal-semiconductor composite pattern 355. Since the first metal-semiconductor composite pattern 340 in the second region (II) includes a metal-semiconductor composite, metal atoms may not be diffused to the first metal-semiconductor composite pattern 340. For example, the second metal layer 345 and the first metal-semiconductor composite pattern 340 may not react with each other.

The material included in the third metal-semiconductor composite pattern 355 may have a work function less than that of the material included in the first metal-semiconductor composite pattern 340. For example, when the second metal layer 345 includes titanium, the third metal-semiconductor composite pattern 355 may include titanium-silicon composite (TiSi).

The third metal-semiconductor composite pattern 355 may make contact with the active fin 205 including silicon (Si). When the third metal-semiconductor composite pattern 355 includes titanium-silicon composite (TiSi), schottky barrier height in the interface with the active fin 205 including silicon (Si) may be decreased to reduce the contact resistance. For example, the third metal-semiconductor composite pattern 355 may reduce the contact resistance between the source/drain region of the NMOS transistor and the contact 360.

As a result, the first metal-semiconductor composite pattern 340 and the third metal-semiconductor composite pattern 355 may have different metal-semiconductor composites, to thereby reduce the contact resistance. For example, the first metal-semiconductor composite pattern 340 may be formed of a material selected to reduce the contact resistance between the semiconductor pattern 280 and the contact pattern. Likewise, the third metal-semiconductor composite pattern 355 may be formed of a material selected to reduce the contact resistance between the active fin 205 and the contact pattern. For example, the first and third metal-semiconductor composite patterns 340 and 355 may have appropriate work function values to reduce the contact resistances.

Referring to FIG. 65, a contact 360 may be formed on the barrier layer 350.

A contact layer may be formed on the barrier layer 350 and an upper portion of the contact layer may be removed to form the contact 360. Thus, the contact 360 may be electrically connected to the first metal-semiconductor composite pattern 340 and the third metal-semiconductor composite pattern 355 respectively. In example embodiments, the contact 360 may be formed using a metal such as tungsten W by a sputtering process.

In example embodiments, the NMOS transistor and the PMOS transistor may include different metal-semiconductor composites to reduce the contact resistances in the source/drain regions. Before the first metal layer 330 is formed, the third semiconductor pattern 320 may be formed, so that the second metal-semiconductor composite pattern 342 formed in a following heat treatment process may be removed by a wet etch process. Accordingly, the number of steps using masks may be reduced and thus, the manufacturing cost of a semiconductor device may be reduced. Also, this process may improve the electrical performance of the semiconductor device.

Figure 66:
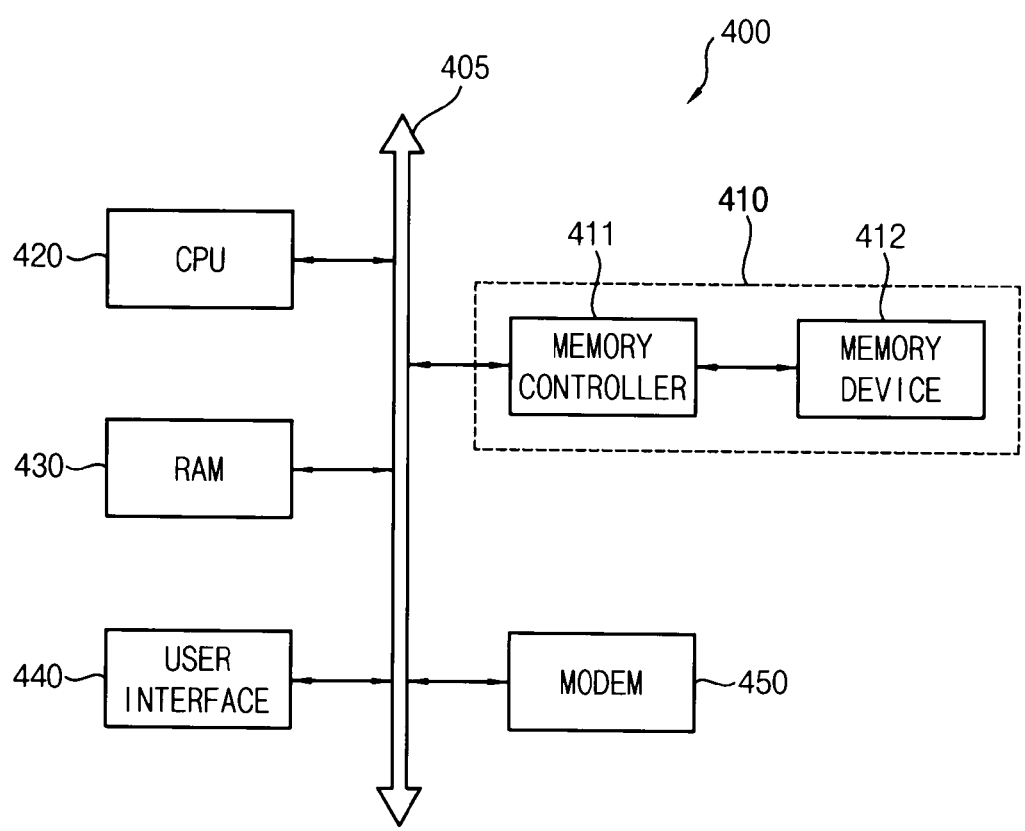

FIG. 66 is a block diagram illustrating an information processing system including a semiconductor device in accordance with example embodiments.

Referring to FIG. 66, an information processing system 400 may include a CPU 420, a RAM 430, a user interface 440, a modem 450 such as a baseband chipset and a memory system 410 electrically connected to a system bus 405. The memory system 410 may include a memory device 412 and a memory controller 411. The memory system 410 may include a semiconductor memory device of the aforementioned example embodiments. Thus, large data processed by the CPU 420 or input from an external device may be stored in the memory device 412 with high stability. The memory controller 411 may have an electronic circuit capable of controlling the memory device 412. The memory system 410 may be provided as, e.g., a memory card or a solid state disk (SSD) by a combination of the memory device 412 and the memory controller 411. The memory device 412 and the memory controller 411 may be provided as a package-on-package (POP) structure.

In a case that the information processing system 400 is implemented to a mobile device, a battery may be further provided for supplying a driving voltage of the information processing system 400. The information processing system 400 may further include an application chipset, a camera image processor (CIS), a mobile DRAM, etc. The information processing system 400 may be implemented to a mobile phone, an MP3 player, various electronic devices, etc.

The above semiconductor device and the method of manufacturing the semiconductor device may be applied to various types of memory devices and systems including a finFET and a source/drain layers formed by an epitaxial growth process. For example, the semiconductor device and the method of manufacturing the semiconductor device may be applied to logic devices such as central processing units (CPUs), main processing units (MPUs), application processors (APs), or the like, volatile memory devices such as DRAM devices or SRAM devices, or non-volatile memory devices such as flash memory devices, PRAM devices, MRAM devices, RRAM devices, or the like.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacturing a semiconductor device, the method comprising:
forming a first gate structure in a first region of a substrate and a second gate structure in a second region of the substrate;
forming a first semiconductor pattern including germanium in the first region of the substrate;
forming a first metal layer in the first and second regions of the substrate including at a location to cover the first semiconductor pattern;
performing a first heat treatment process such that the first semiconductor pattern and the first metal layer react with each other to form a first metal-semiconductor composite pattern in the first region and a semiconductor material of the substrate and the first metal layer react with each other to form a second metal-semiconductor composite pattern in the second region;
removing the first metal-semiconductor composite pattern;
forming a second metal layer on the substrate to cover the second metal-semiconductor composite pattern, the second metal layer including a material different from the first metal layer; and
performing a second heat treatment process such that the substrate and the second metal layer react with each other to form a third metal-semiconductor composite pattern in the first region.

2. The method of claim 1, prior to forming the first semiconductor pattern, further comprising:
forming a trench in the substrate adjacent to the second gate structure; and
filling up the trench with a semiconductor material to form a second semiconductor pattern, the semiconductor material being different from a material of the substrate.

3. The method of claim 1, prior to forming the first semiconductor pattern, further comprising:
forming a third semiconductor pattern on the substrate in the second region, the third semiconductor pattern including a semiconductor material different from the first semiconductor pattern,
wherein the second metal-semiconductor composite pattern is formed by reacting the first metal layer with the third semiconductor pattern.

4. The method of claim 3, prior to forming the first metal layer, further comprising:
forming an insulation interlayer to cover the first semiconductor pattern, the third semiconductor pattern, the first gate structure and the second gate structure; and
partially removing the insulation interlayer to form contact holes which expose the first semiconductor pattern and the third semiconductor pattern respectively,
wherein the first metal layer covers the insulation interlayer, the first semiconductor pattern and the third semiconductor pattern.

5. The method of claim 3, prior to forming the second metal layer, further comprising:
forming an insulation interlayer to cover the second metal-semiconductor composite pattern, the first gate structure and the second gate structure; and
partially removing the insulation interlayer to form contact holes which expose the second metal-semiconductor composite pattern and the surface of the substrate in the first region respectively,
wherein the second metal layer covers the insulation interlayer, the exposed second metal-semiconductor composite pattern and the exposed surface of the substrate in the first region.

6. The method of claim 1, wherein the first metal layer is formed of nickel and the second metal layer is formed of titanium.

7. The method of claim 1, wherein a thickness of the first metal layer is less than 50% of a thickness of the first semiconductor pattern.

8. The method of claim 1, after forming the first metal layer, further comprising:
forming a protection layer on the first metal layer, the protection layer including a metal nitride.

9. The method of claim 1, after forming the second metal layer, further comprising forming a barrier layer on the second metal layer, the barrier layer including a metal nitride.

10. The method of claim 1, further comprising forming contact patterns on the second metal-semiconductor composite pattern and the third metal-semiconductor composite pattern, respectively, the contact patterns including a conductive material.

11. The method of claim 1, further comprising:
performing a first ion implantation process using the first gate structure as an ion implantation mask to form a first impurity region in an upper portion of the substrate in the first region; and
performing a second ion implantation process using the second gate structure as an ion implantation mask to form a second impurity region in an upper portion of the substrate in the second region.

12. The method of claim 1, wherein the removing the first metal-semiconductor composite pattern comprises performing a wet etch process using an etching solution having a low etching rate with respect to the second metal-semiconductor composite pattern.

13. A method of manufacturing a semiconductor device, the method comprising:
providing a substrate including a plurality of active fins extending in a first direction, the substrate having a first region and a second region;
forming a first gate structure on at least one of the plurality of the active fins in the first region and a second gate structure on at least one of the plurality of the active fins in the second region, the first gate structure and the second gate structure extending in a second direction substantially perpendicular to the first direction;
forming a first semiconductor pattern including germanium in the first region of the substrate;
forming a first metal layer on the substrate to cover the first semiconductor pattern;
performing a first heat treatment process such that the first semiconductor pattern and the first metal layer react with each other to form a first metal-semiconductor composite pattern in the first region and a semiconductor material of the substrate and the first metal layer react with each other to form a second metal-semiconductor composite pattern in the second region;
removing the first metal-semiconductor composite pattern;
forming a second metal layer on the substrate to cover the second metal-semiconductor composite pattern, the second metal layer including a material different from the first metal layer; and performing a second heat treatment process such that the substrate and the second metal layer react with each other to form a third metal-semiconductor composite pattern in the first region.

14. The method of claim 13, further comprising:
partially removing the upper portion of the at least of the active fins in the second region to form a recess in the at least one of the active fins; and
filling up the recess with a semiconductor material to form a second semiconductor pattern, the semiconductor material being different from a semiconductor material of the substrate.

15. The method of claim 13, wherein forming the first gate structure and the second gate structure comprises:
forming a first dummy gate structure on the at least one of the active fins in the first region and a second dummy gate structure on the at least one of the active fins in the second region;
forming an insulation interlayer to cover the first dummy gate structure and the second dummy gate structure;
removing an upper portion of the insulation interlayer to expose the first and second dummy gate structures;
removing the first dummy gate structure and the second dummy gate structure to form openings in the insulation interlayer; and
forming gate electrodes in the openings.

16. The method of claim 13, wherein the first metal layer is formed of nickel and the second metal layer is formed of titanium.

17. A method, comprising:
providing a substrate having a first region and a second region;
providing a first gate structure in the first region of the substrate;
providing a second gate structure in the second region of the substrate;
providing an n-type impurity region in an upper portion of the substrate adjacent to the first gate structure;
providing a p-type impurity region in an upper portion of the substrate adjacent to the second gate structure;
providing a semiconductor pattern on the p-type impurity region, the semiconductor pattern formed of a first semiconductor material different from a semiconductor material forming the p-type impurity region;
providing a first metal-semiconductor composite pattern on the n-type impurity region adjacent to the first gate structure; and
providing a second metal-semiconductor composite pattern on the p-type impurity region adjacent to the second gate structure,
wherein the second metal-semiconductor composite pattern comprises a first metal combined with the first semiconductor material,
wherein the first metal-semiconductor composite pattern comprises a second metal combined with a second semiconductor material,
wherein the second metal is different from the first metal, and
wherein the method further comprises
forming a third metal-semiconductor composite pattern in the first region; and
removing the third metal-semiconductor composite pattern by an etching process before providing the first metal-semiconductor composite pattern.

18. The method of claim 17, wherein the first metal-semiconductor composite pattern comprises a titanium-silicon composite pattern and the second metal-semiconductor composite pattern comprises a nickel-silicon composite pattern.

19. The method of claim 17, wherein the p-type impurity region is a source/drain region of a PMOS transistor, and the second semiconductor composite pattern does not include a semiconductor material that is found in the source/drain region.

20. The method of claim 17, wherein a bottom surface of the second metal-semiconductor composite pattern is positioned at a level higher than a bottom surface of the first metal-semiconductor composite pattern and lower than a top surface of the first metal-semiconductor composite pattern.

21. The method of claim 17,
wherein the n-type impurity region is a source/drain region of an NMOS transistor having a first gate electrode on a first gate insulating layer,
wherein the p-type impurity region is a source/drain region of a PMOS transistor having a second gate electrode on a second gate insulating layer,
wherein the first gate insulating layer and the second gate insulating layer are at the same level, and
wherein a bottom surface of the second metal-semiconductor composite pattern is positioned at a level higher than a bottom surface of the first metal-semiconductor composite pattern.

* * * * *